(12) United States Patent  (10) Patent No.: US 8,531,932 B2
Nakamura et al.  (45) Date of Patent: Sep. 10, 2013

(54) ADJUSTING METHOD FOR RECORDING CONDITION AND OPTICAL DISC DEVICE

(75) Inventors: Yusuke Nakamura, Ebina (JP);
Koichiro Nishimura, Yokohama (JP);
Hiroyuki Minemura, Kokubunji (JP);
Takahiro Kurokawa, Fujisawa (JP)

(73) Assignee: Hitachi Consumer Electronics Co., Ltd., Tokyo (JP)

( * ) Notice: Subject to any disclaimer, the term of this patent is extended or adjusted under 35 U.S.C. 154(b) by 895 days.

(21) Appl. No.: 12/608,099

(22) Filed: Oct. 29, 2009

(65) Prior Publication Data

US 2010/0284257 A1  Nov. 11, 2010

(30) Foreign Application Priority Data

May 8, 2009 (JP) .................................. 2009-113152

(51) Int. Cl.
*G11B 20/10*  (2006.01)
(52) U.S. Cl.
USPC ...................................... 369/59.22; 369/59.12
(58) Field of Classification Search
None
See application file for complete search history.

(56) References Cited

U.S. PATENT DOCUMENTS

| | | | | |
|---|---|---|---|---|
| 2005/0249318 | A1* | 11/2005 | Minemura | 375/341 |
| 2007/0109939 | A1* | 5/2007 | Shimizu et al. | 369/59.22 |
| 2008/0144456 | A1* | 6/2008 | Mihara et al. | 369/47.28 |
| 2009/0106627 | A1* | 4/2009 | Minemura et al. | 714/758 |

FOREIGN PATENT DOCUMENTS

| | | |
|---|---|---|
| EP | 1 443 509 | 1/2004 |
| EP | 1 603 127 | 4/2005 |
| JP | 2003-141823 | 5/2003 |
| JP | 2003-151219 | 5/2003 |
| JP | 2004-253114 | 9/2004 |
| JP | 2005-196964 | 7/2005 |
| JP | 2005-346897 | 12/2005 |
| WO | WO 2008/018356 | 2/2008 |
| WO | WO 2009/041598 | 4/2009 |

OTHER PUBLICATIONS

Hiroyuki Minemura, et al "High-Speed Write/Read Techniques for Blu-ray Write-Once Discs", Japanese Journal of Applied Physics, Feb. 24, 2006, pp. 1213-1218.
Hiroyuki Minemura et al.; Technology Trend and Review of PRML Method for Optical Discs; The Electronics Society; The Institute of Electronics, Information and Communication Engineers; Jul. 2007; p. 519-527; vol. J90-C No. 7.
Harumitsu Miyashita et al.; Signal Qualification Method for Partial-Response Maximum-Likelihood Read/Write Channel; Japanese Journal of Applied Physics; Jul. 29, 2004; p. 4850-4851; vol. 43, No. 7B.

* cited by examiner

*Primary Examiner* — Christopher R Lamb
(74) *Attorney, Agent, or Firm* — Antonelli, Terry, Stout & Kraus, LLP.

(57) ABSTRACT

In a optical disc system with constraint length equal to or greater than 5, under assumption that continuous 2T count included in a predetermined evaluation bit array is denoted by i and that length of evaluation bit array of interest is given by (5+2i), judgment is passed on whether binary bit arrays include the evaluation bit array. Previously prepared are the error vectors calculated on the basis of target signals corresponding to the evaluation bit arrays and the target signals derived from the binary bit arrays, and the selection of a desired error vector is performed depending on the result of the judgment. At the same time, an equalized error vector is calculated from the target signal derived from the binary bit array and the reproduced signal, and the inner product of the equalized error vector and the selected error vector is calculated.

8 Claims, 53 Drawing Sheets

RELATIONSHIP BETWEEN CONTINUOUS 2T COUNT AND SbER

RELATIONSHIP BETWEEN RECORDING CAPACITY AND DISTRIBUTION OF EUCLIDEAN DISTANCE DIFFERENCES

DISTRIBUTIONS OF EUCLIDEAN DISTANCE DIFFERENCES USED FOR EVALUATING Tsfp(3S, 2M)

PRML Space

Physical Space

PRML Space

Physical Space

FIG.11

| cosθ | | Hamming Distance of R | | |
|---|---|---|---|---|
| | | 1 | 2 | 3 |
| Hamming Distance of L | 1 | $-\dfrac{12}{14}$ | $-\dfrac{8}{\sqrt{12 \times 14}}$ | $+\dfrac{4}{\sqrt{12 \times 14}}$ |
| | 2 | $-\dfrac{8}{\sqrt{12 \times 14}}$ | $-\dfrac{8}{12}$ | $-\dfrac{4}{12}$ |
| | 3 | $+\dfrac{4}{\sqrt{12 \times 14}}$ | $-\dfrac{4}{12}$ | $-\dfrac{8}{12}$ |

Tsfp(2s,2m)

Tsfp(2s,3m)

Tsfp(3s,2m)

Tsfp(3s,3m)

Tsfp(2s,2m)

Tsfp(2s,3m)

Tsfp(3s,2m)

Tsfp(3s,3m)

FIG.15
PRIOR ART

| No. | Pattern A (Bit Array A) | Pattern B (Bit Array B) | Euclidian Distance | Hamming Distance |
|---|---|---|---|---|
| 1 | 000001100 | 000011100 | 14 | 1 |
| 2 | 000001110 | 000011110 | 14 | 1 |
| 3 | 000001111 | 000011111 | 14 | 1 |
| 4 | 100001100 | 100011100 | 14 | 1 |
| ... | ... | ... | ... | ... |
| 17 | 111110001 | 111100001 | 14 | 1 |
| 18 | 111110011 | 111100011 | 14 | 1 |
| 19 | 00000110000 | 00001100000 | 12 | 2 |
| 20 | 00000110001 | 00001100001 | 12 | 2 |
| 21 | 00000110011 | 00001100011 | 12 | 2 |
| 22 | 10000110000 | 10001100000 | 12 | 2 |
| ... | ... | ... | ... | ... |
| 35 | 11111001110 | 11110011110 | 12 | 2 |
| 36 | 11111001111 | 11110011111 | 12 | 2 |
| 37 | 0000011001100 | 0000110011100 | 12 | 3 |
| 38 | 0000011001110 | 0000110011110 | 12 | 3 |
| 39 | 0000011001111 | 0000110011111 | 12 | 3 |
| 40 | 1000011001100 | 1000011001100 | 12 | 3 |
| ... | ... | ... | ... | ... |
| 53 | 1111100110001 | 1111001100001 | 12 | 3 |
| 54 | 1111100110011 | 1111001100011 | 12 | 3 |

FIG.16

Constrained length=5, PR(C0,C1,C2,C1,C0)

| No. | Pattern A (Bit Array A) | Pattern B (Bit Array B) | Euclidian Distance | Hamming Distance |
|---|---|---|---|---|
| 1–9 | AA00011AA | AA00111AA | 14 | 1 |
| 10–18 | BB11100BB | BB11000BB | 14 | 1 |
| 19–27 | AA0001100BB | AA0011000BB | 12 | 2 |
| 28–36 | BB1110011AA | BB1100111AA | 12 | 2 |
| 37–45 | AA000110011AA | AA001100111AA | 12 | 3 |
| 46–54 | BB111001100BB | BB110011000BB | 12 | 3 |

| Main Bit Array | | Generation Method for Secondary Likelihood Bit Array | | | $N_{2T}$(*) | Hamming Distance |
|---|---|---|---|---|---|---|
| No. | Most Likelihood | (1) No. of Secondary Likelihood | (2) Generation Bit Array (XOR) | (3) Position of Bit Inversion | | |
| 1-1 | 00011 | 1-2 | 00100 | 3 | 0 | 1 |
| 1-2 | 00111 | 1-1 | | | | |
| 1-3 | 11100 | 1-4 | | | | |
| 1-4 | 11000 | 1-3 | | | | |
| 2-1 | 0001100 | 2-2 | 0010100 | 3, 5 | 1 | 2 |
| 2-2 | 0011000 | 2-1 | | | | |
| 2-3 | 1110011 | 2-4 | | | | |
| 2-4 | 1100111 | 2-3 | | | | |
| 3-1 | 000110011 | 3-2 | 001010100 | 3, 5, 7 | 2 | 3 |
| 3-2 | 001100111 | 3-1 | | | | |
| 3-3 | 111001100 | 3-4 | | | | |
| 3-4 | 110011000 | 3-3 | | | | |
| 4-1 | 00011001100 | 4-2 | 00101010100 | 3, 5, 7, 9 | 3 | 4 |
| 4-2 | 00110011000 | 4-1 | | | | |
| 4-3 | 11100110011 | 4-4 | | | | |
| 4-4 | 11001100111 | 4-3 | | | | |
| 5-1 | 0001100110011 | 5-2 | 0010101010100 | 3, 5, 7, 9, 11 | 4 | 5 |
| 5-2 | 0011001100111 | 5-1 | | | | |
| 5-3 | 1110011001100 | 5-4 | | | | |
| 5-4 | 1100110011000 | 5-3 | | | | |
| 6-1 | 000110011001100 | 6-2 | 001010101010100 | 3, 5, 7, 9, 11, 13 | 5 | 6 |
| 6-2 | 001100110011000 | 6-1 | | | | |
| 6-3 | 111001100110011 | 6-4 | | | | |
| 6-4 | 110011001100111 | 6-3 | | | | |

(*)$N_{2T}$: Continuous 2T count.

FIG.18

| No. | Main Bit Array | L-Target Generation Bit Array (XOR) | R-Target Generation Bit Array (XOR) | Hamming Distance L/R |
|---|---|---|---|---|
| 1 | 000111 | 001000 | 000100 | 1/1 |
| 2 | 111000 | | | |
| 3 | 00011000 | 00100000 | 00010100 | 1/2 |
| 4 | 11100111 | | | |
| 5 | 11100111 | 00101000 | 00000100 | 2/1 |
| 6 | 00011000 | | | |
| 7 | 0001100111 | 0010000000 | 0001010100 | 1/3 |
| 8 | 1110011000 | | | |
| 9 | 1110011000 | 0010100000 | 0000010100 | 2/2 |
| 10 | 0001100111 | | | |
| 11 | 0001100111 | 0010101000 | 0000000100 | 3/1 |
| 12 | 1110011000 | | | |

FIG.19A
SbER

| t | Main Bit Array | Hamming Distance | | |
|---|---|---|---|---|
| | | 1 | 2 | 3 |
| 0 | 000111 | 1 | | |
| 1 | 000111 | 1 | | |
| sum | | 2 | | |

FIG.19B
L-SEAT

| Edge | LR | Main Bit Array | Hamming Distance | | |
|---|---|---|---|---|---|
| | | | 1 | 2 | 3 |
| L | L | 000111 | 1 | | |
| | R | 000111 | 1 | | |
| sum | | | 2 | | |

FIG.20

SbER

| t | Main Bit Array | Hamming Distance | | |
|---|---|---|---|---|
| | | 1 | 2 | 3 |
| 0 | 00011000 | 1 | | |
| 0 | 00011000 | | 1 | |
| 1 | 00011000 | | 1 | |
| 3 | 00011000 | 1 | | |
| sum | | 2 | 2 | |

L-SEAT

| Edge | LR | Main Bit Array | Hamming Distance | | |
|---|---|---|---|---|---|
| | | | 1 | 2 | 3 |
| L | L | 00011000 | 1 | | |
| | R | 00011000 | | 1 | |
| T | L | 00011000 | | 1 | |
| | R | 00011000 | 1 | | |
| sum | | | 2 | 2 | |

FIG.23

| No. | Main Bit Array | L-Target Generation Bit Array (XOR) | R-Target Generation Bit Array (XOR) | Hamming Distance L/R |
|---|---|---|---|---|
| 1 | 000111 | 001000 | 000100 | 1/1 |
| 2 | 111000 | | | |
| 3 | 00011000 | 00100000 | 00010100 | 1/2 |
| 4 | 11100111 | | | |
| 5 | 11100111 | 00101000 | 00000100 | 2/1 |
| 6 | 00011000 | | | |
| 7 | 0001100111 | 0010000000 | 0001010100 | 1/3 |
| 8 | 1110011000 | | | |
| 9 | 1110011000 | 0010100000 | 0000010100 | 2/2 |
| 10 | 0001100111 | | | |
| 11 | 0001100111 | 0010101000 | 0000000100 | 3/1 |
| 12 | 1110011000 | | | |
| 13 | 000110011000 | 001000000000 | 000101010100 | 1/4 |
| 14 | 111001100111 | | | |
| 15 | 111001100111 | 001010000000 | 000001010100 | 2/3 |
| 16 | 000110011000 | | | |
| 17 | 000110011000 | 001010100000 | 000000010100 | 3/2 |
| 18 | 111001100111 | | | |
| 19 | 111001100111 | 001010101000 | 000000000100 | 4/1 |
| 20 | 000110011000 | | | |

FIG.24

| No. | Main Bit Array | L-Target Generation Bit Array (XOR) | R-Target Generation Bit Array (XOR) | Hamming Distance L/R |
|---|---|---|---|---|
| 1 | 000111 | 001000 | 000100 | 1/1 |
| 2 | 111000 | | | |
| 3 | 00011000 | 00101000 | 00010100 | 2/2 |
| 4 | 11100111 | | | |
| 5 | 11100111 | 00101000 | 00010100 | 2/2 |
| 6 | 00011000 | | | |
| 7 | 0001100111 | 0010101000 | 0001010100 | 3/3 |
| 8 | 1110011000 | | | |
| 9 | 1110011000 | 0010100000 | 0000010100 | 2/2 |
| 10 | 0001100111 | | | |
| 11 | 0001100111 | 0010101000 | 0001010100 | 3/3 |
| 12 | 1110011000 | | | |

FIG.25

| No. | Main Bit Array | L-Target Generation Bit Array (XOR) | R-Target Generation Bit Array (XOR) | Hamming Distance L/R |
|---|---|---|---|---|
| 1 | 000111 | 001000 | 000100 | 1/1 |
| 2 | 111000 | | | |
| 3 | 00011000 | 00101000 | 00010100 | 2/2 |
| 4 | 11100111 | | | |
| 5 | 11100111 | 00101000 | 00010100 | 2/2 |
| 6 | 00011000 | | | |
| 7 | 0001100111 | 0010101000 | 0001010100 | 3/3 |
| 8 | 1110011000 | | | |
| 9 | 1110011000 | 0010100000 | 0000010100 | 2/2 |
| 10 | 0001100111 | | | |
| 11 | 0001100111 | 0010101000 | 0001010100 | 3/3 |
| 12 | 1110011000 | | | |
| 13 | 000110011000 | 0010101000 | 000101010100 | 4/4 |
| 14 | 111001100111 | | | |
| 15 | 111001100111 | 001010100000 | 000001010100 | 3/3 |
| 16 | 000110011000 | | | |
| 17 | 000110011000 | 001010100000 | 000001010100 | 3/3 |
| 18 | 111001100111 | | | |
| 19 | 111001100111 | 001010101000 | 001010100100 | 4/4 |
| 20 | 000110011000 | | | |

FIG.26A

| No. | Main Bit Array |
|---|---|
| 1 | 000111 |
| 2 | 111000 |
| 3 | 00011000 |
| 4 | 11100111 |
| 5 | 11100111 |
| 6 | 00011000 |
| 7 | 0001100111 |
| 8 | 1110011000 |
| 9 | 1110011000 |
| 10 | 0001100111 |
| 11 | 0001100111 |
| 12 | 1110011000 |

FIG.26B

Main Bit Array No Table for Write Strategy Table

| $Tsfp^{(1)}$ | m=2 | m=3 | m=4 | m≧5 |
|---|---|---|---|---|
| s1=2 | 9 | 5,11 | 5,11 | 5,11 |
| s1=3 | 3,7 | 1 | 1 | 1 |
| s1=4 | 3,7 | 1 | 1 | 1 |
| s1≧5 | 3,7 | 1 | 1 | 1 |

| $Telp^{(2)}$ | m=2 | m=3 | m=4 | m≧5 |
|---|---|---|---|---|
| s2=2 | 10 | 4,8 | 4,8 | 4,8 |
| s2=3 | 6,12 | 2 | 2 | 2 |
| s2=4 | 6,12 | 2 | 2 | 2 |
| s2≧5 | 6,12 | 2 | 2 | 2 |

(1) m=mark length,
    s1=previous space length (2) m=mark length,
    s2=posterior space length

| No. | Main Bit Array |
|---|---|
| 1 | 000111 |
| 2 | 111000 |
| 3 | 00011000 |
| 4 | 11100111 |
| 5 | 11100111 |
| 6 | 00011000 |
| 7 | 0001100111 |
| 8 | 1110011000 |
| 9 | 1110011000 |
| 10 | 0001100111 |
| 11 | 0001100111 |
| 12 | 1110011000 |

FIG.27B

Hamming Distance (L,R) Table for Write Strategy Table

| Tsfp[1] | m=2 | m=3 | m=4 | m≥5 |
|---|---|---|---|---|
| s1=2 | (2,2) | (2,1) (3,1) | (2,1) (3,1) | (2,1) (3,1) |
| s1=3 | (1,2) (1,3) | (1,1) | (1,1) | (1,1) |
| s1=4 | (1,2) (1,3) | (1,1) | (1,1) | (1,1) |
| s1≥5 | (1,2) (1,3) | (1,1) | (1,1) | (1,1) |

| Telp[2] | m=2 | m=3 | m=4 | m≥5 |
|---|---|---|---|---|
| s2=2 | (2,2) | (1,2) (1,3) | (1,2) (1,3) | (1,2) (1,3) |
| s2=3 | (2,1) (3,1) | (1,1) | (1,1) | (1,1) |
| s2=4 | (2,1) (3,1) | (1,1) | (1,1) | (1,1) |
| s2≥5 | (2,1) (3,1) | (1,1) | (1,1) | (1,1) |

(1) m=mark length, s1=previous space length (2) m=mark length, s2=posterior space length

FIG.27C (a) Tsfp(2s,2m) Edge Shift = 0.0T (b) Tsfp(2s,2m) Edge Shift = +0.2T (a) Tsfp(2s,2m) Edge Shift = 0.0T (b) Tsfp(2s,2m) Edge Shift = +0.2T Jitter Edge Shift FIR coefficients for symmetric equalization without equivalent group delay:
$$C_n = (a_n + a_{N-1-n})/2$$
G.D. Comp: Group Delay Compensation Circuit $T_{SFP}$: Start of First Pulse PR(1,2,2,2,1)
3 layer write-once disc, 33GB/layer, 2x write/read

VIEW SHOWING A FRAME FORMAT OF AF ADJUSTMENT
TILT ADJUSTMENT USING INDEX

■ Extended table

■ Edge shift compensation

FIG.52

| No. | Main Bit Array | Error Vector(T,L) | ED(T,L) | Error Vector(T,R) | ED(T,R) |
|---|---|---|---|---|---|
| 1 | 000111 | 1 2 2 2 1 0 | 14 | 0 -1 -2 -2 -2 -1 | 14 |
| 2 | 111000 | -1 -2 -2 -2 -1 0 | 14 | 0 1 2 2 2 1 | 14 |
| 3 | 00011000 | 1 2 2 2 1 0 0 0 | 14 | 0 -1 -2 -1 0 1 2 1 | 12 |
| 4 | 11100111 | -1 -2 -2 -2 -1 0 0 0 | 14 | 0 1 2 1 0 -1 -2 -1 | 12 |
| 5 | 11100111 | -1 -2 -1 0 1 2 1 0 | 12 | 0 0 0 -1 -2 -2 -2 -1 | 14 |
| 6 | 00011000 | 1 2 1 0 -1 -2 -1 0 | 12 | 0 0 0 1 2 2 2 1 | 14 |
| 7 | 0001100111 | 1 2 2 2 1 0 0 0 0 0 | 14 | 0 -1 -2 -1 0 0 0 -1 -2 -1 | 12 |
| 8 | 1110011000 | -1 -2 -2 -2 -1 0 0 0 0 0 | 14 | 0 1 2 1 0 0 0 1 2 1 | 12 |
| 9 | 1110011000 | -1 -2 -1 0 1 2 1 0 0 0 | 12 | 0 0 0 -1 -2 -1 0 1 2 1 | 12 |
| 10 | 0001100111 | 1 2 1 0 -1 -2 -1 0 0 0 | 12 | 0 0 0 1 2 1 0 -1 -2 -1 | 12 |
| 11 | 0001100111 | 1 2 1 0 0 0 1 2 1 0 | 12 | 0 0 0 0 0 -1 -2 -2 -2 -1 | 14 |
| 12 | 1110011000 | -1 -2 -1 0 0 0 -1 -2 -1 0 | 12 | 0 0 0 0 0 1 2 2 2 1 | 14 |

Edge

ADJUSTING METHOD FOR RECORDING CONDITION AND OPTICAL DISC DEVICE

INCORPORATION BY REFERENCE

The present application claims priority from Japanese application JP 2009-113152 filed on May 8, 2009, the content of which is hereby incorporated by reference into this application.

BACKGROUND OF THE INVENTION

This invention relates to a method for adjusting recording condition in recording information in an optical disc medium on which recorded marks are formed that have a physical property different from the physical property of that part of the optical disc medium which is other than the recorded marks, and also relates to an optical disc device using the adjusting method.

Optical disc media now widely available include CD-R/RW, DVD-RAM, DVD+R/Rw, BD, etc., and some of them have two data layers. Optical disc devices adapted for record and playback with those optical disc media mentioned above, i.e. so-called DVD super multi-drives, are now widely in use. In the near future, high-performance disc drives adapted to blue ray discs (hereafter referred to simply as BDs) will come to be widely used. Further, there's need for optical discs having still higher capacity.

The increase in the drive speed of optical disc drive and in the density of information recorded in the optical disc has necessitated the introduction of a technique in which the binarization of reproduced signal is performed by Partial Response Maximum Likelihood (PRML) reproduction procedure. As one of the PRML procedures is known the adaptive PRML or compensatory PRML which can adaptively change the target signal level in accordance with the reproduced signal. The non-patent document 1, "Journal C of Institute of Electronic, Information and Communication Engineers, Vol. J90-C, p. 519 (2007)" discloses the fact that a device adapted to BDs can achieve high-density recording equivalent to 35 GB by using such a PRML procedure wherein the asymmetry of reproduced signal and the thermal interference at the time of recording can be compensated. It is pointed out in the document that reproduction performance under the condition for high-density recording is higher for larger constraint length (bit length representing 'class'). In order to obtain the best result from binarization, an automatic equalizer that makes minimum the RMS error between reproduced signal and the target signal for the PRML index, is installed in an optical disc device provided with such a PRML procedure. In general, such an automatic equalizer is installed as a Finite Impulse Response (FIR) filter having its tap factors variable.

The increase in the recording density in an optical disc leads to the decrease in the size of each recorded mark as compared with the size of the light spot, and therefore results in the reduction of the amplitude of the obtained reproduced signal. The resolving power of the light spot is determined by the wave length$\lambda$ and the aperture number NA of the objective lens.

Accordingly, if the length of the recorded mark having the shortest run length becomes equal to or less than$\lambda$/4NA, the amplitude of the signal corresponding to the repeated series of such shortest recorded marks is reduced to zero. This phenomenon is known as "optical cutoff", and may occur when$\lambda$/4NA$\approx$119 nm in the case of BDs. In the case of BDs, an attempt to attain a recording capacity of more than about 31 GB with the track pitch kept constant, causes the amplitude of the signal corresponding to the repeated series of recorded marks having the shortest run length of 2T to be reduced to zero. It is therefore indispensable to use a PRML procedure in order to acquire a satisfactory reproduction performance under such a high-density condition.

When desired information is recorded in a recordable optical disc, the state of crystallization, for example, in the recording film is changed by using pulsed laser light whose intensity is modulated (hereafter referred to as 'recording pulse'). Materials for such recording films include phase-variable substances, organic pigments, certain kinds of alloys and oxides, all of which are well known and widely used. In the mark edge coding method for use with CDs, DVDs and BDs, code information is determined depending on the positions of leading and trailing edges. Regarding the recording pulses, the positions and widths of the first pulse that mainly determines the condition for forming the leading edge of a recorded mark and the last pulse that mainly determines the condition for forming the trailing edge of the recorded mark, are important to maintain the quality of recorded information in a good condition. Therefore, it is customary with recordable optical discs to use "adaptive recording pulses" which can adaptively change the positions or widths of the first and last pulses in accordance with the length of each recorded mark and the lengths of the spaces that immediately precedes and follows the recorded mark.

Under such a high-density recording condition as described above, since the size of each formed recorded mark becomes very small, it is necessary to choose the condition for radiating the recording pulses (hereafter referred to as "recording condition") with a higher precision than conventional. On the other hand, in an optical disc device, the shape of the light spot varies depending on the wavelength at the light source, wave front aberration, focusing condition, the tilt of disc, etc. Further, since the ambient temperature and the aging effect change the impedance and the quantum efficiency of the semiconductor laser device, the shapes of the recoiling pulses change accordingly. The technique for invariably obtaining the best recording condition in response to the shapes of light spots and the shapes of the recording pulses both of which fluctuate depending on environments and devices, is usually called "test writing". Such a technique for adjusting the recording condition by using the test writing will become more and more important with the requirement for further increasing recording density.

Adjusting techniques for recording condition are classified roughly into two categories: one method uses bit error rate or byte error rate as index and the other utilizes statistical index such as jitter. The former pays attention to an event that occurs with a small probability with respect to recorded data and the latter is concerned with the average quality of recorded data. Regarding write-once optical discs, for example, in the case where data are recorded in and reproduced from plural locations in the disc with the recording condition varied, even the best recording condition for the former method may cause a large bit error or byte error if fingerprints overlie the recorded data. Therefore, the former method should not be selected in this case. The best recording condition should be such that the average quality of the data recorded under such a recording condition is optimal. It can therefore be said that the method using statistical index is preferable for storage media such as optical discs, which are vulnerable to material flaws, fingerprints or dust.

Methods corresponding to PRML procedure for statistically evaluating the quality of recorded data are disclosed in, for example, the non-patent document 2, "Jpn. J. Appl. Phys.

Vol. 43, p. 4850 (2004)"; the patent document 1, JP-A-2003-141823"; the patent document 2, "JP-A-2005-346897"; the patent document 3, "JP-A-2005-196964"; the patent document 4, "JP-A-2004-253114"; and the patent document 5, "JP-A-2003-151219".

The patent document 1, "JP-A-2003-141823", discloses the technique wherein use is made of the certainty Pa corresponding to the most likelihood state shift array and the certainty Pb corresponding to the secondary likelihood state shift array so that the quality of reproduced signal is evaluated on the basis of the distribution of |Pa-Pb|. According to the non-patent document 2, "Jpn. J. Appl. Phys. Vol. 43, p. 4850 (2004)", the value obtained by subtracting the Euclidean distance between two target signals from the absolute value of the difference between the Euclidean distance (corresponding to Pa) between the target signal representing the binary bit array (corresponding to the most likelihood state shift array) derived from the reproduced signal and the reproduced signal, and the Euclidean distance (corresponding to Pb) between the target signal representing the binary bit array (corresponding to the secondary likelihood state shift array) derived through a single-bit shift of the interested edge and the reproduced signal, is defined as MLSE (Maximum Likelihood Sequence Error), and the recording condition is adjusted in such a manner that the average value of the distribution of MLSEs is reduced to zero for every recorded pattern.

The patent document 2, "JP-A-2005-346897", discloses a technique wherein edge shift is specifically noted: a virtual pattern having a run length of 1T is used as an error pattern for showing that the edge of reproduced signal shifts to the right or left; the amount of edge shift is obtained by calculating the difference between sequence errors having plus or minus sign depending on the direction in which the edge shift occurred; and the recording condition is so adjusted as to cause the amount of edge shift to approach zero. In this case, the evaluating index is called "V-SEAT(Virtual state based Sequence Error for Adaptive Target) index".

The patent documents 3 and 4, "JP-A-2005-196964 and JP-A-2004-253114", discloses a technique wherein the difference between the Euclidean distance between reproduced signal and correct pattern and the Euclidean distance between reproduced signal and error pattern, is calculated by using a table containing the combinations of correct patterns and error patterns corresponding the correct patterns; and the Simulated bit Error Rate (SbER) is obtained from the average and standard deviation of the Euclidean distance differences.

The patent document 5, "JP-A-2003-151219", discloses a technique wherein, on the basis of the difference between the Euclidean distance between reproduced signal and correct pattern and the Euclidean distance between reproduced signal and error pattern, the error probabilities corresponding respectively to the case where the interested edge has shifted to the left and to the case where it has shifted to the right, are obtained; and the recording condition is so adjusted as to make the probabilities corresponding to the two cases equal to each other. Accordingly, use is made of a preselected reproduced signal, a first pattern whose wave pattern corresponds to that of the preselected reproduced signal, and an arbitrary pattern (a second or a third pattern) whose wave pattern corresponds to that of the preselected reproduced signal but which is different from the first pattern. First, the distance difference D=Ee-Eo between the distance Eo between the reproduced signal and the first pattern and the distance Ee between the reproduced signal and the arbitrary pattern, is obtained. Secondly, the distribution of the distance differences Ds with respect to plural samples of reproduced signals is obtained. Thirdly, the quality evaluation parameter (M/σ) is determined on the basis of the ratio of the average M of the obtained distance differences Ds to the standard deviation σ of the obtained distribution of the distance differences Ds. And finally, the quality of reproduced signal is assessed from the evaluation index value (Mgn) represented by the quality evaluation parameters.

SUMMARY OF THE INVENTION

The most likelihood state transition array and the secondary likelihood state transition array described in the patent document 1 are the same as the correct and error patterns described in the patent document 3, in that they are both the target bit arrays for measuring distances to reproduced signals. The patent documents 2 and 5 discloses three target bit arrays, which are all the same in meaning. These target bit arrays will hereafter be called an "evaluation bit array" collectively. Moreover, this invention basically aims to provide BD systems having a high capacity of more than 30 GB, and the following description will be made on the assumption that the shortest run length for modulation code is 2T.

As described in the non-patent document 1, a PRML system having a constraint length of 5 or greater is preferable to achieve high-density recording. As described above, when recording density along the track (or linear recording density) is increased, the standard optical requirement for BD (wave length: 405 nm; aperture number of objective lens: 0.85) will cause the amplitude of the signal repeated every 2T period to be reduced to zero. In such a case, it is well known that the PRML system with PR (1,2,2,2,1) characteristic in which the amplitudes of condinuous 2T signals are reduced to zero, is suitable. The patent documents 3 and 4 disclose the method, adapted for PR (1,2,2,2,1) characteristic, calculating SbER (Simulated bit Error Rate) which is used for evaluating the quality of reproduced signal. This SbER method utilizes the binarized bit arrays (correct patterns) and the secondary likelihood evaluation bit arrays (error patterns) such as a bit array having Hamming distance of 1 from the correct pattern (an edge shift), a bit array having Hamming distance of 2 from the correct pattern (shift of 2T data) and a bit array having Hamming distance of 3 from the correct pattern (shift of 2T-2T data); regards the distribution of such patterns as Gaussian distribution; and estimates the bit error rate from the average and the standard deviation by using the error function.

Description will be made below of the performance required for the technique for adjusting the high-precision recording condition needed for realizing an optical disc system having a recording capacity of 30 GB or greater on the basis of the BD standard. Such a technique requires, with respect to at least the quality of the data recorded according to the result of adjustment, (1) that SbER and bit error rate should be sufficiently small and (2) that the data recorded on a disc with a disc drive should give sufficiently small SbER and bit error rate when they are reproduced from the same disc with another disc drive. The required performance (1) given above seems to be a matter of course, but the required performance (2) is specifically sought for since the disc drive must reproduce the data recorded with another disc drive. Therefore, it cannot be said that the adjusting method for recording condition which cannot meet the above described required performances (1) and (2) is suitable for the high-density optical disc system.

From the viewpoint of the two required performances described above, description will be made below of the problems associated with the conventional techniques and their combinations.

First, explained are various events caused when high-density recording and reproducing having recording capacity of 30 GB or greater per disc surface is performed by way of experiments and simulations in which linear recording density is increased.

FIG. 2 graphically shows an experimental result that illustrates the relationship between bit error counts and recording power measured by using a three layer wright-once optical disc which was produced for testing purposes. The thin layers serving as recording medium on the test disc were made of Ge-based chemical compound. The gaps between the top and middle layers and between the middle and bottom layers were 14 μm and 18 μm, respectively. The thickness of the transparent covering layer was 100 μm, measured from its top surface to its bottom surface contacting the bottom layer. The track pitch was 320 nm. The recording/reproducing condition was such that data transfer speed is double that for BD and that the width (1T) of the detecting window was set equal to about 56 nm. Accordingly, the desired recording density was designed to be 33 GB. Laser beams of ordinary multi-pulse type modulated for three power levels, i.e. peak power, assist power and bottom power, were used as the sources of recording pulses. The processing system for reproduced signal comprised an 8-bit A/D converter, an automatic equalizer having 21 taps, and a Vitervi decoder having PR (1,2,2,2,1) characteristic. The minimum value for BER was less than $10^{-5}$ for each of the three layers. The peak power values for layers L0, L1 and L2, which caused BER to become minimal, was 13.5 mW, 15.5 mW and 11.5 mW, respectively. FIG. 2 graphically shows the relationship between recording power and bit error counts while the recording power was changed with the ratio among the three power levels maintained constant. This graph reflects the case where an edge shifts and also 1~4 consecutive 2T collectively shift (slip). It is seen from FIG. 2 that the bit error counts with respect to not only the edge shift but also the collective shifts are likewise larger than anticipated, in response to the deviation of the recording power. This result is due to the fact that the amplitude of the 2T-2T signal is 0, and that Euclidean distance of "12" for the collective shift of consecutive 2T is smaller than Euclidean distance of "14" for the edge shift in the case of PR(1,2,2,2,1) characteristic.

FIG. 3 graphically shows, as a result of simulation, the relationship between SNR and SbER. In this simulation, the impulse response obtainable when recorded marks are reproduced was obtained by a linear diffraction simulator, and the reproduced signal obtainable when the recording is ideally performed was calculated by convolving the recorded bit array and the impulse response. Noise was added as white noise, and SNR was determined as the ratio of half the peak value of the 8T-repetitive signal to the standard deviation of the noise. The desired bit error rate and SbER were obtained through processing with a reproduced signal processing system having PR (1,2,2,2,1) characteristic. The patent document 3 discloses the evaluation pattern corresponding to the case where up to two continuous 2T signals continue. In this simulation, up to six continuous 2T signals were caused to continue. This is an extension (Hamming distances of 1~7) of the disclosed case. There are 18 evaluation patterns per Hamming distance so that the total number of the evaluation patterns is 252. It is apparent from FIG. 3 that the values of SbER remain almost constant when the number of continuous 2T signals is equal to or greater than 2 (Hamming distance of 3). Although this result seems to be contradictory to the experimental result shown in FIG. 2, it is not the case. The definition in the calculation of SbER permits the estimation of bit error rate with the existence probability of evaluation pattern taken into consideration, and even an evaluation covering up to two continuous 2T signals can estimate the overall bit error rate.

FIG. 4 graphically shows an experimental result indicating the relationship between bit error rate and SbER. An experiment was done in such a manner that recording along five tracks is continued so as to include the influence of crosstalk in the L0 layer and that various recording/reproducing stresses are imposed on the track in the center. The stresses include the radial tilt (R-tilt) of disc, the tangential tilt (T-tilt) of disc, the aberration of focus (AF), the spherical aberration (SA) due to improper adjustment of the optical head beam expander, and the change in the recording power (Pw). Regarding the radial tilt, the result with respect to the L2 layer is also shown. It is apparent from FIG. 4 that there is a good correlation between bit error rate and SbER. The reason why there is a large scatter of data points around the bit error rate of $10^{-5}$ is ascribed mainly to the flaws in the recording material used in this experiment.

As is apparent from the result of the experiment and simulation, it is necessary that under the requirement for the high-density recording and reproduction capable of achieving a recording capacity of 33 GB per disc surface, the evaluation of bit errors covering not only an edge shift (Hamming distance of 1) but also up to at least two continuous 2T signals (Hamming distance of 3) should be performed. The method of evaluating the quality of reproduced signals, which concentrates only on the edge shift, cannot be said to develop a sufficient correlation between bit error rate and SbER.

The distribution of Euclidean distance differences accompanying high-density recording will now be described. The term "Euclidean distance difference" used in this specification signifies the value resulting from subtracting the Euclidean distance between reproduced signal and correct target signal from the Euclidean distance between reproduced signal and error target single. This Euclidean distance difference is defined as |Pa−Pb| in the patent document 1 and as D in the patent documents 3 and 4. Here, in order to consider an ideal recording state, such a simulation as described above was used. SNR was set to 24 dB, and the distribution of the Euclidean distance differences covering up to two continuous 2T signals was calculated while recording density was changed within a range of 25 to 36 GB per disc surface (T=74.5 nm ~51.7 nm). The configuration of the reproduced signal processing system is as described above. FIG. 5 shows the result of such calculations. The obtained distributions are sometimes called the "SAM distribution". As described above, with PR(1,2,2,2,1) characteristic, the ideal Euclidean distance (=14) for an edge shift is different from the Euclidean distance (=12) for the shift of a 2T signal and the Euclidean distance (=12) for the shift of two continuous 2T signals. And in order to denote them collectively, each Euclidean distance difference was normalized by dividing it with the ideal Euclidean distance. In FIG. 5, the statistical probability corresponding to the case where the distance difference becomes zero (at the leftmost end) or negative, gives the bit error rate. As seen in FIG. 5, it is apparent that the distribution spreads wider with the improvement in recording density though the SNR is kept constant. This tendency indicates the increase in error rate with the increase in recording density, and therefore is quite reasonable. The average value of the distribution (nearly equal to the peak value) for an edge shift remains the same at the position of the horizontal axis of near 1 (=ideal Euclidean distance) even when the recording capacity increases. However, the average value of the distribution, i.e. the peak value, for the shift of a single 2T signal or two continuous 2T signals moves toward zere when the number of shifts and the recording capacity increase. The cause of this phenomenon is considered to depend on the processing capacity of the automatic equalizer used. As described above, the automatic equalizer works in such a manner that the RMS error between reproduced signal and correct target signal is minimized. Since the sampling interval is 1T that is a finite value, the calculation of discreet frequency characteristics can only be performed up to half the sampling frequency according to the Sampling Theorem. In this way, since the filter characteristic obtainable with an automatic equalizer is restricted as described above, the amplitudes of the higher harmonic components of the reproduced signal become large for a recorded pattern in the region where a long continuation of 2T occurs. As a result, it is considered that the upper limit of the processing capacity of the automatic equalizer is approached so that the deviation from the ideal Euclidean distance becomes large. As described later, the phenomenon that the peak value (or average value) of the distribution of Euclidean distance differences shifts with the increase in recording density, toward the direction in which the peak value tends to be smaller than the ideal Euclidean distance, is an important event concerning the technique for adjusting recording condition. It is noted here that none of the above quoted documents have a description of this phenomenon.

On the basis of the above described experiment and simulation, from the viewpoint of the two required performances mentioned above, problems arising from each or a combination of the conventional techniques described above are summed up as follows.

(1) Method disclosed in the Non-Patent Document 2

The non-patent document 2 discloses the technique wherein edge shifts are adjusted in such a manner that the average value of the distribution of the Euclidean distance differences becomes equal to the ideal Euclidean distance, on the basis of the technique disclosed in the patent document 1. The "Expression (1)" cited in the non-patent document 2 defines a specific edge shift MD as a quantity given by the following expression (1).

$$MD = \left| \sum_{1}^{4} (X - P_A)^2 - \sum_{1}^{4} (X - P_B)^2 \right| - d_{min}$$

where X denotes the level of the reproduced signal; $P_A$ and $P_B$ are the target signal levels corresponding to the binarized (i.e. binary) bit array (most likelihood state transition array) and a bit array with a one-bit edge-shift (secondary likelihood state transition array), respectively; and $d_{min}$ is the Euclidean distance corresponding to the edge shift. By way of supplement, according to the result shown in FIG. 5, this method is one that corresponds to adjusting the recording condition in such a manner that the distribution of edge shifts takes the peak value at the ideal Euclidean distance (=1). On the other hand, FIG. 3 illustrates the fact that under the condition for high-density recording the correlation with SbER (or bit error rate) is not sufficient if edge shifts alone are taken into consideration. Consequently, it is understood from the viewpoint of the required performance (1) mentioned above that this method, which takes edge shifts alone into consideration, is not satisfactory under the condition for high-density recording. Further, the "Table 2" in the non-patent document 2 reveals that there exists no adjusting index at the location where a 2T mark and a 2T space are juxtaposed to each other, that is, the leading edge (Tsfp(2s, 2m)) of a 2T mark following a 2T space and the trailing edge (Telp(2s, 2m)) of a 2T mark followed by a 2T space. From this point of view along with the result shown in FIG. 2, it cannot be said that this method is satisfactorily applied to a case of high-density recording condition in which the error for a 2T mark or space are considerable.

(2) Method disclose in the Patent Document 2

This method disclosed in the patent document 2, too, takes edge shifts alone into consideration to obtain the index for the adjustment of recording. However, if a virtual 1T mark or space is introduced, the adjustment of recording becomes possible also for the location where two continuous 2T patterns continue. Notwithstanding this, the method takes edge shifts alone into consideration and therefore cannot be said to develop a sufficient correlation with SbER (or bit error rate). Accordingly, this method does not prove to be satisfactory, either, from the viewpoint of the required performance (1) mentioned above.

(3) Method disclose in the Patent Document 5

According to the method disclosed in the patent document 5, even error bit arrays are so selected as to satisfy the restriction on run length so that high correlation between index and SbER (or bit error rate) can be developed for not only the case of an edge shift but also the case where two 2T patterns shift continuously. This method, therefore, can be said to be an excellent method. According to this method, in order to adjust the recording condition involving a 2T mark, the Hamming distance between an error bit array to be evaluated and a correct bit array takes different values according as the interested mark edge shifts leftward or rightward, as shown in FIG. 3 of the patent document 5. For instance, let Tsfp(3s, 2m) be taken as an example in accordance with the notation employed in the non-patent document 2. Then, those disclose bit arrays are as follows.

TABLE 1

| left-shifted bit array | 1 | 1 | 1 | 0 | 0 | 1 | 1 | 1 | 0 | 0 | 0 | 0 |
|---|---|---|---|---|---|---|---|---|---|---|---|---|
| correct bit array | 1 | 1 | 1 | 0 | 0 | 0 | 1 | 1 | 0 | 0 | 0 | 0 |
| right-shifted bit array | 1 | 1 | 1 | 0 | 0 | 0 | 0 | 1 | 1 | 0 | 0 | 0 |
| | | | | | | | ↑ | | | | | |
| | | | | | | | interested edge | | | | | |

In the case where the partial response characteristic is PR(1,2,2,2,1), the Hamming distance and the Euclidean distance, between the correct bit array and the left-shifted bit array, are 1 and 14, respectively, whereas the Hamming distance and the Euclidean distance, between the correct bit array and the right-shifted bit array, are 2 and 12, respectively. As shown in FIG. 5, the difference in Hamming distance causes the difference in the values for the average and the standard deviation of distributions. In order to overcome this problem, the patent document 5 introduces the concept of SbER, estimates their error probabilities by using the error function, and specifies the adjustment target as the condition that their error probabilities are equal to each other. According to this method, it is considered possible to determine such a recording condition as to minimize SbER (or bit error rate).

On the other hand, the result of simulation as shown in FIG. 5 and described above corresponds to the case where recorded following bit arrays for evaluation are also used for calculating SbER, as described in the patent document 4.

TABLE 2

| left-shifted bit array | 1 | 1 | 1 | 0 | 0 | 1 | 1 | 1 | 0 | 0 | 1 | 1 | 1 |
| correct bit array | 1 | 1 | 1 | 0 | 0 | 0 | 1 | 1 | 0 | 0 | 1 | 1 | 1 |
| right-shifted bit array | 1 | 1 | 1 | 0 | 0 | 0 | 0 | 1 | 1 | 0 | 0 | 1 | 1 |

↑ interested edge marks are formed in the ideal condition (without any edge shift). As seen in FIG. 5, the change in Hamming distance causes the change in the central value and the standard deviation. Therefore, according to the method disclosed in the patent document 5, the condition for forming recorded marks must be adjusted in such a manner that the error probabilities for three distributions (probabilities for which Euclidean distance becomes 0) are rendered equal to one another. From the viewpoint of the required performance (2) mentioned above, that is concerned with the warranty of disc compatibility, there is room for question of whether this method is an ideal one for adjusting recording condition for high-density optical discs. For the purpose of quantitative evaluation on this point, analyses were made by using such a simulation as described above.

The extension of concept was introduced to define the amount of edge shift to be detected by the method according to the patent document 5. According to the expression (13) in the patent document 5, the quantity Ec equivalent to the edge shift is defined with the following expression (2).

$$Ec=)\sigma_3 * M_2 + \sigma_2 * M_3)/(\sigma_2 + \sigma_3) \qquad (2)$$

where $M_2$ and $M_3$, and $\sigma_2$ and $\sigma_3$ represent the averages and the standard deviations of distributions of the Euclidean distance differences calculated when the interested edge is shifted by one bit to the left and to the right, respectively. The result shown in FIG. 5 was obtained by normalizing the two distributions with the ideal Euclidean distance, as described above. In like manner, if the ideal Euclidean distance is assumed to be equivalent to 1T, the edge shift Ec' in the direction of time axis can be calculated from the amount Ec equivalent to the edge shift by using $M_2$, $M_3$, $\sigma\sigma_2$ and $\sigma_3$ normalized with the ideal Euclidean distance.

FIG. 6 shows the distributions obtained through simulation. It is evident from FIG. 6 that the same result as what is schematically shown in FIG. 6 of the patent document 5 has been obtained. FIG. 7 graphically shows the relationship between Ec' and SNR with SNR changing. As apparent from FIG. 7, the value of Ec' increases rapidly with the increase in SNR. With optical disc devices, the shape of the light spot and the SNR of the optoelectronic transducer change depending on the types of devices or in response to, for example, ambient temperatures. For a storage device such as a hard disc drive in which the disc medium is unchangeably installed, it is the best method to adjust the recording condition in such a manner that SbER (or bit error rate) with respect to the hard disc drive of interest is minimized. However, for a storage system such as an optical disc device in which the disc medium is interchangeable, it is not satisfactory to minimize SbER (or bit error rate) with respect only to that particular device. From the viewpoint of the required performance (2) mentioned above, this method still leaves room for improvement in pursuing the optimal method for obtaining recording condition for high-density recording.

Further, the reason why this method leaves room for improvement from the viewpoint of the required performance (1) will also be described. The bit arrays used for evaluating Tsfp(3s, 2m) are as described above. On the other hand, the Table 2 given above corresponds to the case where the interested 2T mark is immediately followed by a 2T space. With respect to the left-shifted bit array, the Hamming distance and the Euclidean distance, from the correct bit array are 1 and 14, respectively, just as described above, whereas with respect to the right-shifted bit array, the Hamming distance and the Euclidean distance, from the correct bit array are 3 and 12, respectively. The Hamming distance in this case differs from that in the previous case. From the viewpoint of the required performance (1), it is expected that the correlation between the evaluation index for recording adjustment and the index SbER (or bit error rate) for evaluating the quality of reproduced signals, is sufficiently strong. Therefore, it is necessary that the index representing the evaluation bit array for recording adjustment is roughly the same as the index for evaluating the quality of reproduced signals. The patent document 5 does not disclose any measure for solving the problem that with respect to the evaluation index using the target signal corresponding to the bit array in which the interested edge is shifted to the left or to the right, there arises, as in this instance, plural combinations of (Hamming distance 1 for left edge shift and Hamming distance 2 for right edge shift) and (Hamming distance 1 for left edge shift and Hamming distance 3 for right edge shift). From this point of view, too, it can be said that this method leaves room for improvement.

(4) Method according to Combination of Conventional Techniques

The non-patent document 2 discloses a technique wherein, on the basis of the technique disclosed in the patent document 1, edge shifts are taken into consideration and adjustment is made in such a manner that the average of distributions of Euclidean distance differences becomes equal to the ideal Euclidean distance. An analogy of a method is easy for making such adjustment that the average of distributions becomes equal to the ideal Euclidean distance, by applying this technique disclosed in the non-patent document 2 to the evaluation bit arrays shown in "FIG. 3 of the patent document 5". As shown in FIG. 5, however, the increase in recording density causes the average of the respective distributions to deviate in the direction in which the average tends to be smaller as compared with the ideal Euclidean distance. In like manner, the average of the respective distributions change in response also to SNRs. FIG. 8 shows the result of the experiment made to ascertain this phenomenon. This experimental result was obtained in reproducing the recorded signals while changing the reproducing (or read) power for the layer L0 of the above described test disc having three layers. In FIG. 8, the horizontal axis is graduated in reproducing (or read) power with 1.2 mW equated to 100%. The amplitude of the reproduced signal is proportional to the reproducing (or read) power, but the noise (amplifier noise) inherent to the photodetector is constant. In this experiment, the SNR of the reproduced signal is varied by changing the reproducing (or read) power. It is understood from FIG. 8 that the average of the respective distributions is smaller than the Euclidean distance (=1) and that the average decreases with the decrease in the reproducing (or read) power. It is apparent with this method, too, that the difference in SNR depending on the states of drive devices affects the index used to adjust recording.

(5) Method for Minimizing SbER

As shown in FIG. 4, SbER develops a strong correlation with bit error rate in the experiment regarding recording density of 33 GB per disc surface. Accordingly, a candidate method is to select the condition for obtaining the minimum SbER after having performed write/read operations under all the combinations of possible recording conditions without using the evaluation index for write (or recording) adjustment. However, it is substantially impossible to search for the condition for obtaining the minimum SbER while randomly changing the recording conditions, in such a case as of an optical disc medium in which the size of the area (test write area) for write adjustment is limited. For it is impossible to obtain the information on the direction for making the edge of the recorded mark approach the ideal state. Except for the conventional techniques as described above which can quantitatively determine the deviations from the target value independently in response to the respective parameters of recording pulses, no method can serve to perform test write applicable to optical disc devices. Further, even in the case where performance improvement is sought while repeating the test fabrication of discs, it is desirable to complete the adjustment of recording condition in a short period of time. In this sense, too, the invention of a novel index and a novel adjusting method has long been waited for according to which the required performances (1) and (2) mentioned above are satisfied and the above mentioned quantitative determination of deviations can be adjusted independently in response to the parameters for recording.

As described above, regarding the adjustment of recording condition corresponding to the high-density recording condition with recording capacity of more than 30 GB per disc surface in case of a BD system, there was a problem with conventional techniques that the performance of adjustment is not sufficiently compatible with the guarantee of interchangeability of recording media. The objects of this invention are to provide a novel index and a novel method for the adjustment of recording that can solve this problem and to provide an optical disc device using them.

According to this invention, since the achievement of a large capacity of more than 30 GB is aimed for, it is assumed in the following description of this specification that the minimum run length of the modulation code is 2T. Further, as described above, since the experimental results indicate that the SbER used in the case where up to two 2T continue, coincides well with the bit error rate, it is assumed that SbER is used as the index for evaluating the quality of reproduced signal when the evaluation index for record adjustment according to this invention is discussed. The index for probabilistically evaluating the quality of reproduced signal on the basis of the Euclidean distance between the target signal and the reproduced signal, or the index for directly evaluating bit error rates can yield a good result if the recording condition is adjusted according to this invention.

The summary of the above described requirements is as follows.

[Requirement 1] Compatibility in Reproduction of Data Recorded on the Basis of Result of Adjustment The evaluation index and the method of adjustment to be employed must not depend on the variation of SNR, but must concentrate on a fixed adjusting target.

[Requirement 2] Quality of Data Recorded on the Basis of Result of Adjustment

In order to secure that SbER is sufficiently small, the evaluation bit array covering at least up to two continuous 2T patterns must coincide exactly or substantially with the evaluation bit array for SbER.

[Requirement 3] Completion of Record Adjustment in a Short Period of Time

The evaluation index and the method of adjustment, capable of independent evaluation, must be provided in accordance with the conditions of recording pulses or the respective parameters of adaptive recording pulses.

According to the concept of this invention, evaluation is performed by separating the component corresponding to the shift of the interested edge from the component depending on SNR in accordance with the difference between the Euclidean distances from the reproduced signal to the two target signals. In order to facilitate the understanding of this invention, the definition of the evaluation index that can solve these problems will first be given, and then the fact will be described that the evaluation index can solve the problems.

In the following description of the specification, W denotes a reproduced signal, T a target signal in the form of a binary bit array obtained from the reproduced signal, L a target signal in the form of a binary bit array in which the interested bit is shifted by a single bit to the left and which satisfies the condition of restriction on run length, and R a target signal in the form of a binary bit array in which the interested bit is shifted by a single bit to the right and which satisfies the condition of restriction on run length. The Euclidean distances between W and T, between W and R, etc. are denoted by ED(W, T), ED(W, R), etc. The evaluation value for the error caused when the interested edge is shifted leftward is represented by xL, and the evaluation value for the error caused when the interested edge is shifted rightward is represented by xR. These evaluation values are called "equivalent edge shifts" and defined with the following expressions (D1) and (D2).

$$xL = \frac{1}{2}\left(1 - \frac{ED(L, W) - ED(T, W)}{ED(T, L)}\right) \tag{D1}$$

$$xR = \frac{1}{2}\left(1 - \frac{ED(R, W) - ED(T, W)}{ED(T, R)}\right) \tag{D2}$$

The amount of edge shift of the interested edge is called "extended edge shift D" and defined with the following expression (D3).

$$D=(xR-xL)/2 \tag{D3}$$

The amount of compensation equivalent to the error probability for the interested edge is called "SNR factor S" and defined with the following expression (D4).

$$S=(xR+xL)/2 \tag{D4}$$

Regarding the interested edge and the group of edges recorded with the same record condition, that is, with a recording pulse that creates a recorded mark having a mark length equal to the space length of a space ammediately anterior (or posterior) to the mark, the amount of edge shift used for record adjustment, which is interpreted as the statis tical average Δ of extended edge shifts Ds, is defined with the following expression (D5).

$$\Delta = \sum_{n=1}^{N} D_n \tag{D5}$$

where N denotes the total number of edges subjected to measurement, and $D_n$, the extended edge shift for the n-th edge.

Further, the amount of jitter denoted by e, equivalent to the error probability for the interested edge, is defined with the following expression (D6).

$$\sigma = \sqrt{\frac{1}{N}\left(\sum_{n=1}^{N} D_n^2 + \sum_{n=1}^{N} S_n^2\right)} \tag{D6}$$

where $S_n$, is the SNR factor for the n-th edge.

The quantities, i.e. the "evaluation indices" used in this invention, defined above with the expressions (D1)~(D6) are each called L-SEAT (run-length-Limited Sequence Error for Adaptive Target).

Specifically, Δ defined with the expression (D5) is called L-SEAT shift, and σ defined with the expression (D6) is called L-SEAT jitter. According to the adjusting method for the recording condition employed in this invention, recording/reproducing is performed while changing the conditions for recording pulses, and such a particular pulse condition for recording is selected that both the absolute value of the L-SEAT shift and the value of L-SEAT jitter, for the interested edge are minimized.

Now description is made to ascertain that the above described Requirements 1~3 are satisfied by the adjusting method for recording condition according to this invention. As described in the patent documents 1 to 5 mentioned above, when PRML procedure is used, the error margin is expressed by the Euclidean distance. In order to facilitate the descriptions to follow, the quantities dEDL and dEDR, which are the values obtained by normalizing the Euclidean distance differences for the errors caused when the interested edge is shifted to the left and to the right, respectively, with the ideal Euclidean distance are defined with the following expressions (3) and (4).

$$dEDL = \frac{ED(L, W) - ED(T, W)}{ED(T, L)} \tag{3}$$

$$dEDR = \frac{ED(R, W) - ED(T, W)}{ED(T, R)} \tag{4}$$

[Requirement 1] Compatibility in Reproduction of Data Recorded on the Basis of Result of Adjustment As described above, the evaluation index for record adjustment must be constant independent of the change in SNR. The average value of distributions of respective Euclidean distance differences changes in response to the change in SNR. Since W, T, L and R denote the signal levels at plural time instants t ($t=t_0+1, t_0+2, t_0+3, t_0+4, t_0+5$), let them represent the coordinate points in the multi-dimensional space. For the sake of simplicity, an example is taken of the error caused when a rightward shift of edge occurred and having the resulted Hamming distance of 1. With the (1,2,2,2,1) characteristic, it can follow that T ($T_1, T_2, T_3, T_4, T_5$), W ($T_1+\delta_1, T_2+\delta_2, T_3+\delta_3, T_4+\delta_4, T_5+\delta_5$) and R ($T_1+1, T_2+2, T_3+2, T_4+2,$ $T_5+1$). Further, when the five-dimensional coordinate system is introduced having its origin at T, the position vectors (=coordinate points) for W and R may be represented as W ($\delta_1, \delta_2, \delta_3, \delta_4, \delta_5$) and R (1, 2, 2, 2, 1). FIG. 9A illustrates the relative positions of the coordinate points T, W and R in the plane containing these three points. In FIG. 9A, the x-axis extends in the direction along the line segment TR, and normalization is introduced so as to locate the point R at 1 on the x-axis. Further, it should be noted that since the y-axis is taken perpendicular to the x-axis, the direction of the y-axis does not remain fixed but changes depending on the value of W. The Euclidean distances among W, T and R are such as given by the following expression (5).

$$ED(T,W)+ED(R,W) \geq ED(T,R) \tag{5}$$

Namely, the sum of the Euclidean distance between T and W and the Euclidean distance between R and W is not necessarily equal to the Euclidean distance between T and R.

FIG. 9B schematically illustrates the measurement of the edge shift of a physically recorded mark. In FIG. 9B, if the distance measured from the target value (the origin) T to the edge of the recorded mark is given by x, then the distance from the edge of the recorded mark to the target value R, which is equivalent to the position shifted by 1T to the right from the origin, becomes equal to (1−x). And the sum of the distances always becomes equal to 1 (=1T:T equals the width of the detection window). In general, the edge control by means of recording pulses is the control of shift along the time axis, being based on the idea of linear measurement for the edge shift of physically recorded marks.

Accordingly, in the definition of the Euclidean distance (equal to the square of the length of line segment), too, if the projection of the vector TW onto the x-axis is represented by xR, then the projection of the vector RW onto the x-axis becomes equal to (1−xR), the sum of these projected components of the vectors TW and RW being equal to 1. The inner product of the vectors TW and TR can produce xR, which can be calculated by using the Euclidean distances among the coordinate points T, R and W, by the following expression (6).

$$\begin{aligned} xR &= \delta_1 + 2\delta_2 + 2\delta_3 + 2\delta_4 + \delta_5 \\ &= \frac{1}{2}\left(1 - \frac{\{(1-\delta_1)^2 + (2-\delta_2)^2 + (2-\delta_3)^2 + (2-\delta_4)^2 + (1-\delta_5)^2\} - (\delta_1^2 + \delta_2^2 + \delta_3^2 + \delta_4^2 + \delta_5^2)}{14}\right) \\ &= \frac{1}{2}\left(1 - \frac{ED(R,W) - ED(T,W)}{ED(T,R)}\right) \\ &= \frac{1}{2}(1 - dEDR) \end{aligned} \tag{6}$$

This item obtained by the above expression (6) is what is meant by the equivalent edge shift xR defined with the expression (D2) given above. The calculation of equivalent edge shift in the case where the Hamming distance is 2 or 3 can be likewise performed. The second term in the expression (6) indicates the Euclidean distance difference normalized with the ideal Euclidean distance, as shown in FIG. 5. The quantity xR is not only the projection of W along the direction of the line segment TR but also the quantity related to the error probability that is one of the PRML indices. As a result of natural extension of concept, the equivalent edge shift xL can be calculated by using the target value L, which is equivalent to the position shifted by 1T to the left from the origin, through the expression (D1) given above.

On the other hand, since the coordinates of W change depending on the value of SNR, the value of the equivalent edge shift changes depending on edges to be measured. However, as described above, since the linear addition of equivalent edge shifts is possible in the direction along the line segment TR, it becomes possible to evaluate, independent of SNR, the edge shift of a recorded mark by calculating the average value of the equivalent edge shifts.

The method for coping with the subject that the average of Euclidean distance differences changes depending on SNR will be described below. As described above, the main factor of this phenomenon seems to be ascribed to the fact that the frequency characteristic of the filter implemented by an automatic equalizer is restricted by the Sampling Theorem. Accordingly, when a specific edge is considered, the variations of the average caused as the specified edge shifts to the left and to the right, respectively, are equal to each other. This can be surmised from the fact that the variations of the average of distributions can be classified in terms of the continuous 2T count, i.e. Hamming distances, as shown in FIG. 5. Let the averages of the normalized Euclidean distance differences dEDL and dEDR be denoted respectively by $M_L$ and $M_R$, the respective deviations thereof from the ideal Euclidean distance by dM, and the amount of shift to be measured by $\Delta_2$. Then, the following equations (7) and (8) hold.

$$M_L = 1 - \Delta + dM \quad (7)$$

$$M_R = 1 + \Delta + dM \quad (8)$$

On the other hand, according to the technique disclosed in the patent document 2, which uses V-SEAT, the normalized sequence errors are calculated depending solely on the edge shifts (Hamming distance 1), plus or minus signs is given the normalized sequence errors with respect to the left or right edge shift, and the arithmetic average of the signed sequence errors is calculated. For example, it is quite natural that the equivalent edge shift to the right is given a plus (+) sign and the equivalent edge shift to the left is given a minus (−) sign. On the basis of this convention of sign allocation, the equivalent edge shifts are calculated with respect to the leftward and rightward shifts of the interested edge. If the arithmetic average of the signed equivalent edge shifts whose signs are given with respect to the edge shift to the left or right, is used as an evaluation value, then the variation dM of the average of distributions of Euclidean distance differences depending on SNR can be offset.

$$(M_R - M_L)/2 = \Delta_2 \quad (9)$$

In like manner, it is understood that the extended edge shift D, which is defined with the expression (D3) as a measured value for an interested edge, is the evaluating value for edge shift free of the influence depending on SNR. The L-SEAT edge shift $\Delta$ defined with the expression (D5) is statistically equivalent to the difference $\Delta_2$ of the respective distribution averages, the $\Delta_2$ being defined with the above expression (9).

FIGS. 10A and 10B diagrammatically show the left and right equivalent edge shifts xL and xR. In these figures, the coordinates of L, R and W are represented in the six-dimensional space of t ($t = t_0, t_0+1, t_0+2, t_{+3}, t_0+4, t_0+5$) with T assumed as the origin, in consideration of one time instant by which L and R are staggered from the origin. The edge shift x of a physically recorded mark is given by $x = \{(1-x)+(1+x)\}/2$ where $(1 \times x)$ is the distance from the anterior edge of the mark to the point R which is staggered by 1T to the right from the point T, and $(1+x)$ is the distance to the anterior edge of the mark from the point L which is staggered by 1T to the left from the point T. Expression (9) means this and measurement.

On the other hand, regarding the Euclidean distances among W, T, L and R, since L and R are staggered in time, the line segment TR and the line segment TL are not in alignment with a single geometrical straight line. The angle $\theta$ subtended by the two line segments can be given by the inner product of two vectors. If there are errors each of which corresponds to an edge shift (Hamming distance 1), then $\cos \theta$ is given by the following expression (10).

$$\cos\theta = \frac{\text{vector}(T, L) \cdot \text{vector}(T, R)}{|\text{vector}(T, L)||\text{vector}(T, L)|} \quad (10)$$

$$= \frac{0 - 2 - 4 - 4 - 2 - 0}{\sqrt{14} \times \sqrt{14}}$$

$$= -\frac{12}{14}$$

where vector (T, L) and vector (T, R) represent the position vectors of L and R target signal, respectively, and the operator "•" indicates "inner product". If T is the most likely target signal and if L and R are the secondary likely (having highest error probability) target signals, then it is reasonable from the viewpoint of error rate in PRML procedure that the recording condition should be so adjusted as to reduce the extended edge shift D to zero. The fact that the two target signals are not on a single geometrical straight line can be said to be the feature of edge shift measurement according to PRML procedure. When the continuous 2T count is 2 (Hamming distance 1, 2 and 3), the relationship among L, R and $\cos \theta$ is summarized in FIG. 11. It is seen from FIG. 11 that if the Hamming distance of L is 1 and the Hamming distance of R is 3, then $\cos \theta > 0$, indicating the angle between vectors L and R being less than 90 degrees, but that if target signals having the highest error probability are selected as L and R, then the edge shift of the interested edge can be measured on the basis of the average $\Delta$ of the extended edge shifts D's or the difference $\Delta_2$ of the averages of L- and R-distributions.

FIGS. 12A–12D graphically show the relationships between dEDL and dEDR, obtained as a result of simulations. The conditions for the simulations were such that the recording density was of 33 GB per disc surface and marks having predetermined lengths were ideally recorded. In these simulations, SNR was equated to 20 dB. FIGS. 12A-12D correspond respectively to such front edges of marks as (a) Tspf (2s, 2m), (b) Tspf(2s, 3m), (c) Tspf(3s, 2m) and (d) Tspf(3s, 3m), in each of which data were collected from 1000 edges. In these simulations, the target signals having Hamming distances of (a) (2,2), (b) (2, 1) and (3, 1), (c) (1, 2) and (1, 3) and (d) (1, 1) were used as the L and R target signals. The dashed straight lines in these figures indicate the relationship dEDL+dEDR=2, i.e. relationship equivalent to the conservation of values measured for the physically recorded mark shown in FIGS. 12A–12D. It is seen from these figures that the plotted data points are scattered roughly along the dashed straight lines, indicating that they develop correlations between dEDL and dEDR, and that the fluctuations with respect to the left and right edge shifts of reproduced signals due to noise are roughly symmetric. To be precise, as seen from FIGS. 12B and 12C, the data distributions indicate gradients a little different from the gradients of the dashed straight lines when the Hamming distances of L and R are not equal to each other. This is because the probabilities of error occurrence for the left and right shifts are different from each other according to PRML procedure, that is, because the measurement of physically recorded marks is different from the measurement on the basis of error margins according to PRML procedure. The evaluation of edge shifts using V-SEAT disclosed in the patent document 2 adopts only the target signals having Hamming distance 1 and therefore can only produce the measurement results in which data distribution gradients are parallel to the dashed straight lines even in the cases of Tsfp(2s, 3m) and Tsfp(3s, 2m) of FIGS. 12B and 12C, respectively. The first improvement according to this invention is to have overcome this point.

Each of FIGS. 13A~13D graphically shows the relationship between the average of dEDL and dERR and the extended edge shift D, obtained as a result of simulations. The conditions for the simulations were the same as in the simulations shown in FIGS. 12A ~12D. These pictures also correspond to (a) Tspf(2s, 2m), (b) Tspf(2s, 3m), (c) Tspf(3s, 2m) and (d) Tspf(3s, 3m), for each of which data were collected from 1000 edges. In these figures, the distributions of averages of dEDL and dEDR (1) spread widely and differently for the different edge patterns and (2) are all shifted toward values smaller than the ideal Euclidean distance difference (=1). This tendency reflects the results shown in FIG. 5. In contrast to this, the distributions of extended edge shifts D's do not depend on edge patterns, and (1) the spreads of distributions are almost uniform and (2) the center of the spread of each distribution is located nearly at zero. In these figures, these differences are represented diagramatically by different spread shapes. These two advantages obtained with the introduction of extended edge shifts D's are due respectively to (1) the calculation of the shift of reproduced signal as the inner product of equivalent edge shift and vactor TR or TL and the ensuing linearization, and (2) the averaging of the left and right equivalent edge shifts with minus and plus signs attached thereto, respectively.

FIG. 14 graphically shows the summary of the advantages obtained according to this invention. FIG. 14 shows the relationship between Ec' (adopted in the method disclosed in the patent document 5) and SNR, as shown in FIG. 7, superposed with the relationship between average Δ(defined with the expression (D5)) of extended edge shifts and SNR. It is seen from FIG. 14 that the value of Δ employed in this invention remains constant and equal to zero independent of the change in SNR, whereas the edge shaft Ec' adopted in the conventional method changes largely in response to the change in SNR. In this simulation, random noise is added to the signal represented as an ideally recorded mark having a predetermined length. Accordingly, it can be said that this measurement result that the evaluation value Δ for edge shift under the given condition is nearly equal to zero, indicates the high excellence of the method of this invention from the viewpoint of compatibility in the reproduction of recorded data. This point is the second improvement made according to this invention.

[Requirement 2] Quality of Data Recorded on the Basis of Result of Adjustment

As a result of the adjustment of recording condition according to this invention, SbER must be sufficiently small. In order to realize this requisite, it is necessary that dEDL and dEDR are minimized through the adjustment of recording pulses and that the evaluation bit arrays for T, L and R are substantially equivalent to the evaluation bit array for SbER.

The former need will first be described. It has been already described that all of the target signals T, L and R are not on a geometrical straight line since they have different Hamming distances and staggered in time from one another. Accordingly, the absolute value of the equivalent edge shift for the edge shift to the left is different from that for the edge shift to the right. This is the feature of the edge shift measurement according to this invention. Now, in evaluating N edges, let dEDL and dEDR of the n-th edge be denoted by $dEDL_n$ amd $dEDR_n$, and let their average be approximated by 1. The standard deviations $\sigma_L$ and $\sigma_R$ can be represented by the following expressions (11) and (12), respectively.

$$\sigma_L = \sqrt{\frac{1}{N}\sum_{n=1}^{N}(dEDL_n - 1)^2} \qquad (11)$$

$$\sigma_R = \sqrt{\frac{1}{N}\sum_{n=1}^{N}(dEDR_n - 1)^2} \qquad (12)$$

The bit error rate can be evaluated by using the synthetic standard deviation $\sigma_{LR}$ of $\sigma_L$ and $\sigma_R$, represented by the following expression (13).

$$\begin{aligned}
\sigma_{LR} &= \sqrt{\frac{1}{2N}\sum_{n=1}^{N}(dEDL_n - 1)^2 + (dEDR_n - 1)^2} \\
&= \sqrt{\frac{1}{4N}\sum_{n=1}^{N}\{(dEDR_n - 1) - (dEDL_n - 1)\}^2 + \frac{1}{4N}\sum_{n=1}^{N}\{(dEDR_n - 1) + (dEDL_n - 1)\}^2} \\
&= \sqrt{\frac{4}{N}\sum_{n=1}^{N}\left(\frac{\frac{1-dEDR_n}{2} - \frac{1-dEDL_n}{2}}{2}\right)^2 + \frac{4}{N}\sum_{n=1}^{N}\left(\frac{\frac{1-dEDR_n}{2} + \frac{1-dEDL_n}{2}}{2}\right)^2} \\
&= 2\sqrt{\frac{1}{N}\sum_{n=1}^{N}\left(\frac{xR-xL}{2}\right)^2 + \frac{1}{N}\sum_{n=1}^{N}\left(\frac{xR+xL}{2}\right)^2} \\
&= 2\sqrt{\frac{1}{N}\left(\sum_{n=1}^{N}D_n^2 + \sum_{n=1}^{N}S_n^2\right)}
\end{aligned}$$

The right-hand side of the above expression (13) becomes equal to double the value of the L-SEAT jitter given by the expression (D6). The factor 2 appearing on the right-hand side is not essential, but results from the fact that the error margin is ±½T for L-SEAT as in the case of jitter measurement by the conventional time interval analyzer, whereas the error margin is 1 (ideal Euclidean distance=1) in the distributions of dEDL and dEDR. If the distributions of dEDL and dEDR are regarded as of Gaussian, the error rates for these distributions obtained by using the error function become equal to each other. It is apparent that the L-SEAT jitter represents the synthetic standard deviation obtained by superposing the distributions of the Euclidean distance differences shown in FIG. 5 in such a manner that the average of the distributions occurs at the ideal Euclidean distance (=1). It can therefore be said that the L-SEAT jitter is the evaluation index that exhibits a strong correlation with SbER or bit error rate. To be further precise, as seen from the expression (D4), the SNR factor by definition has as its average a value equal to the quantity by which the distribution of Euclidean distance differences is deviated from the ideal value (=1) depending on SNR and recording density. Therefore, the contribution of SNR to the L-SEAT jitter defined with the expression (D6) involves the deviation of the average of the distributions of Euclidean distance differences. As described above, the L-SEAT jitter according to this invention can be evaluated by separating the component corresponding to the shift of the interested edge (the extended edge shift) from the component depending on SNR (the SNR factor). In this way, two functions can be simultaneously provided: one is the shift adjustment excellent in reproduction compatibility independent of SNRs of different drive devices, and the other is the warranty of rendering SbER and bit error rate to the minimum. The third improvement provided according to this invention is the fact that in comparison with the signal evaluation index for the conventional recording adjustment including the V-SEAT disclosed in the patent document 2, the quality of reproduced signal has a strong correlation with the evaluation index with the introduction of SNR factor. The experimental proof regarding this point will be discussed later with experimental results.

The affinity to the evaluation bit arrays used for evaluating the quality of reproduced signal in the calculation of SbER will now be described. The techniques for evaluating reproduced signals disclosed in the patent documents 1, 3 and 4 employ different constitutions but include in common the process of searching/extracting the first most likely evaluation bit array from among binary bit arrays outputed from the PRML decoder. The length M of the evaluation bit array can be generalized to give the equation $M=2N-1+2N_{2T}$, by using the constraint length N in the PRML procedure and the number $N_{2T}$ of continuous 2T patterns contained in the evaluation bit array. Here, $N_{2T}$ denotes an integer such as 0, 1, 2, .... According to the notation described above, $N_{2T}=0, 1, 2$ correspond to an edge shift, a 2T shift and a 2T knock-on shift (or billiard shift), respectively. Further, when $N_{2T}$ is 0, 1, 2, 3, 4, 5 and 6, the corresponding Hamming distances are 1, 2, 3, 4, 5, 6 and 7, respectively, and the Hamming distance between the evaluation bit arrays of the patterns A and B is ($N_{2T}+1$). The evaluation bit array can be easily enumerated from among $2^M$ bit arrays through the mechanical operations of extracting the relationship between the first most likely evaluation bit array and the second evaluation bit array corresponding to the target signal that makes minimum the Euclidean distance from the target signal corresponding to the first evaluation bit array.

FIG. 15 is a table listing examples of evaluation bit arrays associated with PR (1,2,2,2,1) characteristic having a constraint length of 5. Similar bit arrays are disclose in the patent document 4. As is apparent from FIG. 15, in the case where evaluation bit arrays are searched and extracted from among binary bit arrays outputed from PRML decoder, using PRML procedure having a constraint length of 5, the total of 108 evaluation bit arrays, i.e. 54 pairs including 18 pairs for each of Hamming distances, are enumerated. In evaluating reproduced signals, these evaluation bit arrays must be searched and extracted simultaneously.

FIG. 16 is a table listing the evaluation bit arrays associated with PR (1,2,2,2,1) characteristic having a constraint length of 5, shown in FIG. 15, in such an abridged way that those bit arrays which are equivalent to one another except their two head bits and two tail bits, are grouped together. As seen from FIG. 16, the 108 evaluation bit arrays associated with Hamming distances 1, 2 and 3 are represented by the main bit arrays having bit lengths of 5, 7 and 9 and the auxiliary bit arrays XX and YY each having a bit length of 2 and attached to the front and rear end of these main bit arrays. Here, the main bit arrays include four bit arrays such as "00011", "00111", "11100" and "11000" associated with Hamming distance of 1; four bit arrays such as "0001100", "0011000", "1110011" and "1100111" associated with Hamming distance of 2; and four bit arrays such as "000110011", "001100111", "111001100" and "110011000" associated with Hamming distance of 3. The auxiliary bit array AA is "00", "10" or "11" and the auxiliary bit array BB is "00", "01" or "11". The intervals corresponding to the bit lengths of the main bit arrays listed here are used as the intervals within which the Euclidean distance between target signal and reproduced signal is calculated. The auxiliary bit arrays are only used to calculate the levels of target signals at the front and rear ends of the main bit arrays and have nothing to do with the calculation of Euclidean distances among target signals. In this sense, the auxiliary bit arrays can be considered to determine the boundary condition to determine the levels of the target signals at their ends. The main bit arrays can be determined independent of the constraint length in PRML procedure. The reason for this will be described below. If the shortest run length m is set equal to 2T, then in order to show that a single bit is changed due to an edge shift, the shortest length in terms of bit is obtained by multiplying m by 2 and adding 1 to 2m, that is, equal to 2 m+1=5 bits. This is what the main bit looks like. In like manner, the generalization using the continuous 2T count $N_{2T}$ included in each evaluation bit array yields the length of main bit array equal to $2m+1+2N_{2T}$. Thus, the main bit array is meant as the shortest bit array determined depending on the continuous 2T count contained in an evaluation bit array. On the other hand, as described above, the length of bit array needed to calculate the Euclidean distance from reproduced signal is represented, by using the constraint length N in PRML procedure, as $2N-1+2N_{2T}$. The difference between the lengths of both the bit arrays is $(2N-1+2N_{2T})-(2m+1+2N_{2T})=2(N-m-1)$, which is always an even number. This value is 2(N−3) if the shortest run length m=2. As described above, if use is made of the main bit array independent of the constraint length N in PRML procedure and the auxiliary bit arrays having length (N−3) and attached at the front and rear ends of the main bit array, then the evaluation bit array can be represented in some ordered manner.

In this way, the ordered representation of each evaluation bit array enables the relationship between the index for evaluating the quality of reproduced signal and this invention to be simplified and also the scale of circuitry used in this invention to be reduced.

In the table of FIG. 16, evaluation bit arrays are classified into A and B groups in accordance with the disclosure of the patent document 4. It is preferable from the viewpoint of reducing the scale of circuitry to select the first evaluation bit array (i.e. evaluation bit array equivalent to target signal T) from among bit arrays obtained by binarizing reproduced signals and then to generate the second evaluation bit array as secondary likelihood bit array (i.e. evaluation bit array equivalent to target signal L or R) on the basis of first evaluation bit array. Since the Hamming distance between the first and second evaluation bit arrays is previously determined, the second evaluation bit array can be generated by applying exclusive OR (XOR) operation to the first evaluation bit array (T) and the generation bit array having l's whose number is equal to the Hamming distance. FIG. 17 is a table which summarizes main bit arrays corresponding to Hamming distances 1~7. In the column for the main bit arrays of the table, main bit arrays given above are enumerated. In this table, the numbers of the main bit arrays are determined by combining the Hamming distances and the numbers 1~4. As shown in the figure, the second main bit arrays can be obtained through XOR operations using specific generation bit arrays peculiar to Hamming distances. Also, the main bit array numbers of the second main bit arrays are enumerated in the table.

As described above, the consideration of main bit arrays leads to the explanation of the affinity between the evaluation bit array for SbER and the evaluation bit array according to the method of this invention.

FIG. 18 is a table listing main bit arrays for edge evaluation according to this invention in the case where the continuous 2T count is equal to or less than 2. When the L- and R-target generation bit arrays are simultaneously generated to calculate the L-SEAT, the length of each main bit array to be used is greater by 1T (i.e. one bit) than that of the corresponding main bit array shown in the table of FIG. 17. Thus, the length of each main bit arrays having Hamming distances of 1, 2 and 3 have lengths of 6, 7 and 8, respectively.

In FIG. 18, just as in FIG. 17, listed are the main bit arrays to be included in the bit arrays obtained through the binarization of reproduced signals and the L- and R-target generation bit arrays for generating the L- and R-target signals by performing XOR operations on themselves and the main bit arrays. The total number of the listed main bit arrays is 12, and the underlined bit of each main bit array is the interested edge. The rule adopted here is to select as the L- and R-target generation bit arrays the main bit arrays whose interested edges are shifted by a single bit to the left and right, respectively, which satisfy the run length restriction, and whose Hamming distances are minimized (i.e. the number of inverted bits is minimized). Also, in the table in FIG. 18, the recorded mark is indicated by "1" and the space is indicated by "0". Even when the amount of light reflected from the recorded mark is less than that of light reflected from the space, that is, in the case of the so-called High-to-Low type recording medium being used, the PR (1, 2, 2, 2, 1) characteristic can be maintained if the "1" and "0" of the main bit array are inverted so as to cause the recorded mark and the space to be denoted by "0" and "1", respectively. Alternatively, if all the impulse responses are inverted with PR (−1, −2, −2, −2, −1) characteristic employed, the table shown in FIG. 18 can be used as it is. In the description of this invention given hereafter, the recorded mark is represented by "1" and the space by "0" unless otherwise specified.

Description is made below of the relationship between the main bit arrays shown in FIG. 17 for calculating SbER and the main bit arrays shown in FIG. 18 for evaluating L-SEAT. FIGS. 19A and 19B illustrate the comparison between both types of the main bit arrays in the case where $N_{2T}=0$, that is, Hamming distance is 1. This comparison was made to perform the evaluation of the anterior edge of a recorded mark having a length of 3T or longer. The time instants at which the evaluation is made are included with respect to SbER while the types of edges are included with respect to L-SEAT. As shown in these figures, each main bit array includes only one edge. With respect to both SbER and L-SEAT, evaluation for two Hamming distances are made per edge. The main bit arrays for SbER coincides with the main bit arrays for L-Seat. Namely, the evaluation bit arrays for SbER and L-SEAT, including their auxiliary bit arrays, coincide with each other.

In these figures, only the evaluation of the anterior edge is performed, but if "1" and "0" are inverted, the evaluation for the posterior edge can be likewise performed. It is evident in that case, too, that the evaluation bit arrays for SbER and L-SEAT remain coincident with each other.

FIG. 20 illustrates the comparison between both the main bit arrays in the case where $N_{2T}=1$, that is, Hamming distance is 2. Each of the main bit arrays includes two edges. With respect to both SbER and L-SEAT, evaluation for two Hamming distances are made per edge. The main bit array for SbER coincides with the main bit array for L-SEAT. Regarding the transition of evaluation with time, as indicated with arrows in the figure, it is apparent that evaluation is performed for L, L, R and R edges in this order named in case of SbER and for L, R, L and R edges in this order named in case of L-SEAT. The evaluation bit arrays for SbER and L-SEAT would coincide with each other also in the case of bit array patterns in which "1" and "0" are inverted.

FIG. 21 illustrates the comparison between the main bit arrays for both SbER and L-SEAT in the case where $N_{2T}=2$, that is, Hamming distance is 3. Each of the main bit arrays includes three edges. As in the above example, with respect to both SbER and L-SEAT, evaluation for two Hamming distances are made per edge. The main bit arrays for SbER coincide with the main bit arrays for L-Seat. Regarding the transition of evaluation with time, as indicated with arrows in the figure, it is apparent that evaluation is performed for L, L, L, R, R and R edges in this order named in case of SbER and for L, R, L, R, L and R edges in this order named in case of L-SEAT. The evaluation bit arrays for SbER and L-SEAT would coincide with each other also in the case of bit array patterns in which "1" and "0" are inverted.

It has been revealed from the foregoing discussion that in the case where $N_{2T}$ is equal to or less than 2, the evaluation bit arrays for calculating SbER coincide with the main bit arrays for evaluation shown in FIG. 18. In like manner, with respect also to the case where $N_{2T}$ is equal to or greater than 3, the evaluation bit arrays for SbER and L-SEAT can be likewise made coincident with each other if the main bit arrays for calculating L-SEAT, whose maximum Hamming distance is the same as the maximum Hamming distance of the main bit arrays for calculating SbER, satisfy the run length restriction and if the main bit arrays whose Hamming distances are minimum are selected as the main bit arrays for the L and R target signals. A concrete example in which $N_{2T}$ is equal to 3 will be described later. The basic concept of L-SEAT is to evaluate the edge shift on the basis of the difference of averages of distributions of the target signals whose edges to be evaluated are shifted to the left and right, by focusing attention to symmetricity, when the average of distributions of Euclidean distance differences differs from the difference of Hamming distances as shown in FIG. 5. According to this concept, the edge shift is evaluated on the basis of the procedure (expressions D1~D6) in which the extended edge shift is evaluated at respective time instants, or the procedure (expressions 7~13) in which the average of distributions of independently calculated Euclidean distance differences is evaluated. Further, not only main bit arrays for evaluation shown in FIG. 18 but also various variations including a case of $N_{2T}=3$, can be used.

As described above, if the main bit arrays for evaluation shown in FIG. 18 are evaluated on the basis of the equivalent edge shifts, the L-SEAT can be provided as an evaluation index with improved correlation with SbER or index of common concept, also from the viewpoint of the affinity of the evaluation main bit arrays. This point is the fourth improvement achieved by this invention.

[Requirement 3] Achievement of Record Adjustment in a Short Period of Time

The evaluation index and the method of adjustment, capable of independent evaluation must be provided in accordance with the condition for recording pulses or the respective parameters of adaptive recording pulses. Optical disc devices in general need to handle not only optical discs of a particular standard but also optical discs for high-density recording such as CD, DVD, BD or other optical discs fabricated based on BDs. Adaptive recording pulses may vary in accordance with the standards for these different discs. It is also preferable that the proper index for evaluating such recording adjustments as, for example, the edge shift along the time axis measured by a time interval analyzer, the jitter, the V-SEAT or the L-SEAT according to this invention, should be used depending on cases to be treated. In order to realize such a flexible index, a parameter table for recording adjustment has only to be prepared first. Then, all-round measures can be provided by installing in the previous stage a circuit for calculating such evaluation indices as the edge shifts of reproduced signals and the SNR factors.

FIG. 22 shows in block diagram the configuration of such a circuit for adjusting recording condition. In FIG. 22, the read-out (or reproduced) signal 51, which has been read out from an optical disc medium and passed through an analog filter not shown in the figure, is converted to a digital signal having 6~8 bits by an A/D converter 21, equalized by an automatic equalizer 22, and binarized by a PRML decoder 23 to be output as a binary bit array 52. A circuit 30 for evaluating the quality of the signal for adjusting the write condition comprises edge evaluators 40, 41 and 42; a selector 60; a write (or recording) pulse evaluation table 35; and a timing adjuster 36. The edge evaluator 40 performs the evaluation of the edge shift along time axis with respect to each edge in a CD/DVD system; the edge evaluator 41 performs the evaluation of V-SEAT for BD; and the edge evaluator 42 performs the evaluation of L-SEAT for high-density BD. Each edge evaluator calculates the amount of edge shift, the extended edge shift or the SNR factor with respect to each edge. The selector 60 selects the outputs of the edge evaluators depending on the kinds of discs subjected to write/read operation. The write pulse evaluation table 35 synchronizes the binarized bit array 52 with the edge evaluation index outputted from the edge evaluator, performs the classification of bit patterns in accordance with adaptive recording pulses, allocates the bit patterns into, for example, a 4×4 table, and calculates the average or standard deviation per table component. A CPU 140 refers to the result obtained by the write pulse evaluation table 35 and processes the adjustment of the respective parameters of the adaptive recording pulses. With this configuration described above, the parallel adjustments of parameters of the adaptive recording pulses becomes possible for different kinds of optical disc media. Accordingly, the adjustment of condition for write pulses can be achieved in a short period of time and in a limited test write area, in comparison with the method that uses a single evaluation index for read-out signal.

In this way, it has become possible to provide the evaluation index for adjusting the recording condition, the adjusting method for recording condition and the optical disc device using the evaluation index and the adjusting method, which, regarding the adjustment of write condition corresponding to high-density recording with recording capacity of more than 30 GB per disc surface based on BD systems, can solve the above described problems peculiar to the conventional techniques and which can (1) enjoy the high compatibility of the reproduction of data recorded in accordance with the result of the adjustment, (2) guarantee that the quality of the data recorded in accordance with the result of the adjustment is sufficiently good when it is measured in terms of the evaluation index for reproduced signal such as SbER, and (3) adjust the condition of the adaptive recording pulse in a short period of time. The gist of this invention is the provision of the adjusting method for recording condition and the optical disc device using this method, wherein when reproduced signals are evaluated by using the target signals having more than three Hamming distances (corresponding to =1, 2 and 3) with respect to an optical disc using recorded marks whose shortest run length is equal to 2T as in BD, the quality of the interested edge is evaluated in accordance with the method for evaluating extended edge shifts at respective time instants or the method for evaluating the average of distributions of independently calculated Euclidean distance differences; and the recording condition is adjusted on the basis of the result of the evaluation.

As described above, an optical disc device capable of achieving high—density recording of 30 GB or higher in BD can be realized by using the adjusting method for recording condition which uses the L-SEAT according to this invention as evaluating index.

Other objects, features and advantages of the invention will become apparent from the following description of the embodiments of the invention taken in conjunction with the accompanying drawings.

BRIEF DESCRIPTION OF THE DRAWINGS

FIG. 11 shows the relationship between Hamming distance and cosθ;

FIG. 15 is a table listing evaluation bit arrays associated with PR(1,2,2,2,1) characteristic;

FIG. 16 is a table listing evaluation bit arrays associated with PR(1,2,2,2,1) characteristic, the bit arrays being extracted according to similarities;

FIG. 17 is a table related to the main bit arrays and the generation of the second main bit arrays;

FIG. 18 is a table listing evaluation main bit arrays ($N2T_{max}=2$);

FIGS. 19A and 19B show the comparisons between evaluation main bit arrays for SbER and L-SEAT;

FIG. 20 shows comparisons between evaluation main bit arrays for SbER and L-SEAT;

FIG. 23 is a table listing evaluation main bit arrays ($N2T_{max}=3$);

FIG. 24 is a table as another embodiment, listing evaluation main bit arrays ($N2T_{max}=2$);

FIG. 25 is a table as another embodiment, listing evaluation main bit arrays ($N2T_{max}=3$);

FIGS. 26A~26C show correspondences between evaluation bit arrays and write pulse tables;

FIGS. 27A~27C show additional correspondences between evaluation bit arrays and write pulse tables;

FIG. 52 is a table showing the correspondence among evaluation main bit arrays, error vectors and Euclidean distances;

DETAILED DESCRIPTION OF EMBODIMENTS

The adjusting method for recording condition and the optical disc device according to this invention will now be described by way of embodiment in reference to the attached drawings.

FIG. 23 is another embodiment of the table listing main bit arrays for edge evaluation according to this invention. The listed main bit arrays are for the case where $N_{2T}$ is equal to 3. There are 20 main bit arrays listed in total. In each main bit array, the underlined bit corresponds to an interested edge. The main bit arrays No. 1~12 are the same as those listed in the table shown in FIG. 18. The main bit arrays No. 13~20 correspond to the case where the continuous 2T count is 3. As described above, there is only one evaluation bit array that is the secondary likelihood bit array in SbER shown in FIG. 15 and FIG. 16. Accordingly, even in case of such a binarized bit array with $N_{2T}=3$ as "0000011001100", the quality of reproduced signal is evaluated by regarding the bit array "0000110011000" having Hamming distance=3 as the secondary likelihood evaluation bit array. On the other hand, this is not evaluated for the evaluation main bit arrays listed in FIG. 15. In the case where such a bit array must be independently evaluated depending on recording density and disc medium, that is, where when the continuous 2T counts are 2 and 3, the difference between the edge shifts of recorded 2T marks cannot be ignored, the evaluation main bit array shown in FIG. 23 must be used though the scale of the circuit used in that case will be increased. Moreover, by using evaluation main bit arrays shown in FIG. 23, the main bit array (No. 15) with the mark having a length of 3T or longer preceding Tsfp(2s, 2m) and the main bit array (N. 17) with the mark having a length of 2T preceding Tsfp(2s, 2m) can be separately evaluated. Further, in the case where adaptive recording pulses are used for actual recording in accordance with not only the length of a space preceding a record mark but also the length of a mark appearing still further ahead, the evaluation main bit arrays shown in FIG. 23 can produce information on the recording adjustment condition that exhibits one to one correspondence with the recording pulse table. Regarding the continuous 2T count ($N_{2T}$) included in each evaluation main bit array, suitable one may be employed in consideration of such a circumstance as described above. The above described evaluation main bit array exhibits one to one correspondence with the evaluation bit array for calculating SbER as in the case of the main bit array with $N_{2T}=2$. The description of the case where $N_{2T}$ is 4 or greater, will be lengthy and therefore omitted here. However, those who are skilled in the optical disc technology will easily be able to extend their idea to such a case from relationships between FIG. 18 and FIG. 23.

Figure 14:
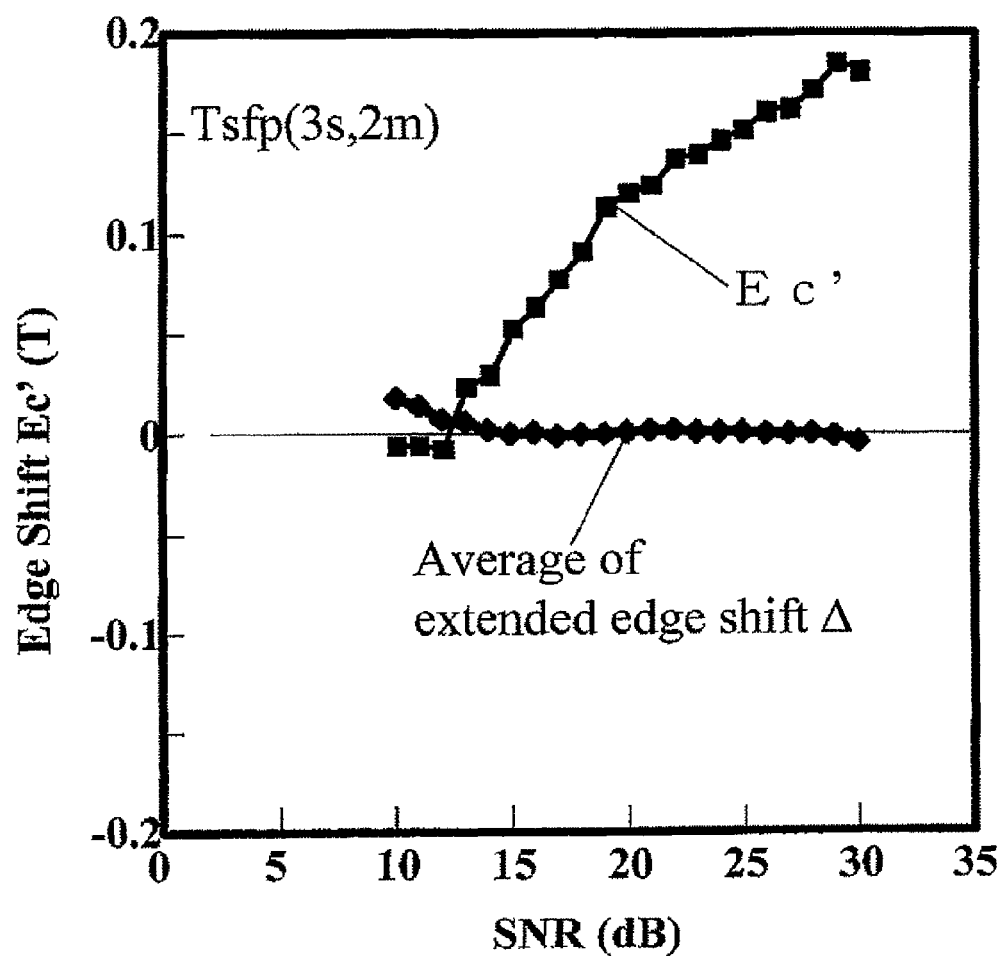
FIG. 14 graphically shows the relationship between SNR and Ec', and the average Δ of extended edge shifts.
Figure 21:
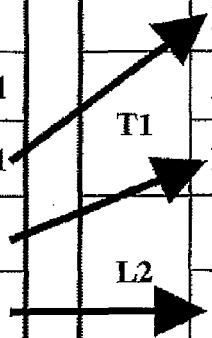
FIG. 21 shows additional comparisons between evaluation main bit arrays for SbER and L-SEAT.

FIG. 24 is another embodiment of table listing main bit arrays for edge evaluation according to this invention. Here is shown the case where Hamming distances for L and R target signals are set equal to each other when $N_{2T}=2$. There are 12 main bit arrays listed in total. In each main bit array, the underlined bit corresponds to an interested edge. FIG. 24 differs from FIG. 18 in L- and R-target generation bit array and Hamming distance. If the evaluation main bit arrays shown in FIG. 18 are used, their one-to-one correspondence with the bit arrays for evaluating SbER cannot be maintained, but the deviation of distribution relative to SNR can be offset in principle. Accordingly, the dependence on SNR (constant in principle) better than the dependence on SNR shown in FIG. 14 can be obtained. These evaluation main bit arrays may be employed if the change in SNR due to the change in drive device and recording medium is regarded as the first priority item.

FIG. 25 is still another embodiment of table listing main bit arrays for edge evaluation according to this invention. Here is shown the case where Hamming distances for L and R target signals are set equal to each other when $N_{2T}=3$. The feature of the table shown in FIG. 25 and the associated evaluation performance are the same as those as described with respect to FIG. 24. In this case, too, a good dependence on SNR (constant in principle) can be obtained.

FIGS. 26A~26C and FIGS. 27A~27C show correspondences between evaluation main bit arrays and recording pulse tables, as embodiments of this invention. FIGS. 26A~26C show the same main bit arrays as in FIG. 18 and the recording pulse tables showing anterior edges Tsfp and posterior edges Telp with 4×4 different combinations of marks and spaces (referred to also as 4×4 type pulse table), giving associated main bit array numbers. As seen in FIGS. 26A~26C, the main bit array of No. 9 may be used corresponding to the result of evaluation of Tsfp (2s, 2m). If a circuit for recording adjustment in a drive device is constructed in reference to this table, L-SEAT can be used to adjust the parameters of the recording pulses as defined in the 4×4 type pulse table. FIGS. 27A~27C show correspondences between evaluation main bit arrays and the associated Hamming distances of the L- and R-target signals in such a case. In this way, the result of edge evaluation using L-SEAT can be easily made coincident with the parameter table for the recording pulses. The main bit arrays shown in FIGS. 23~25 can be likewise evaluated in accordance with the parameter table for the recording pulses.

FIGS. 28A and 28B and FIGS. 29A and 29B show the simulation results illustrating examples of the edge evaluation using L-SEAT in accordance with the above described parameter table for the recording pulses. Here, the condition for simulation is the same as that described above, the recording density is equivalent to 33 GB per disc surface as of a BD, and the PR class is (1, 2, 2, 2, 1).

Figure 28A:
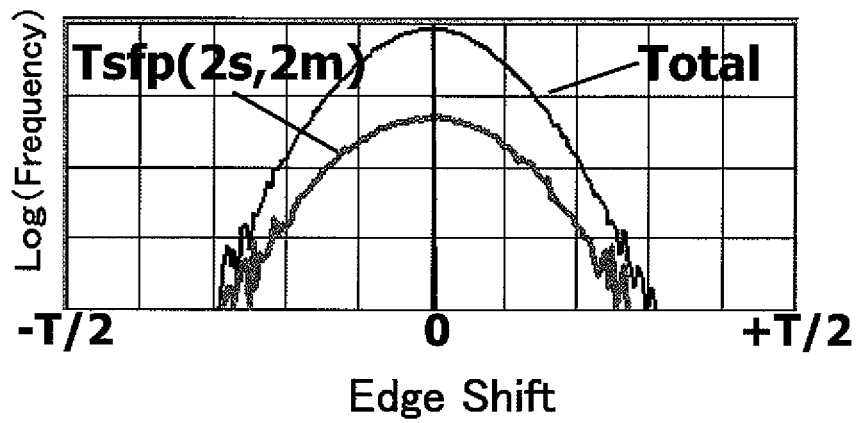
FIGS. 28A and 28B illustrate the evaluations of edge shifts by using L-SEAT.
Figure 28B:
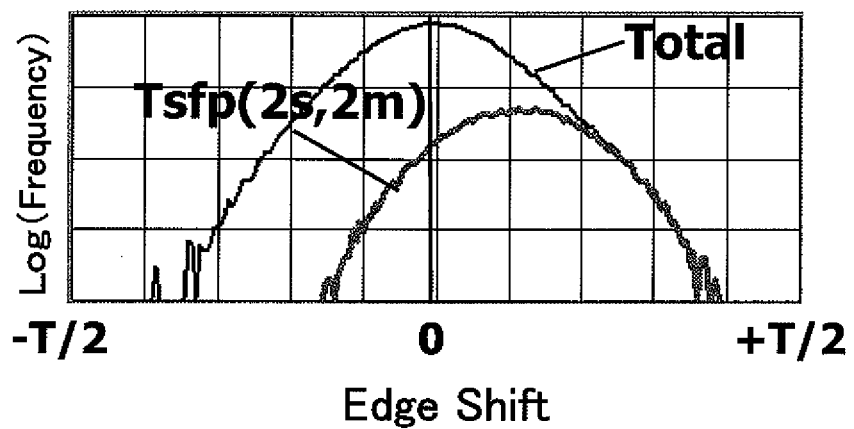
Figure 29A:
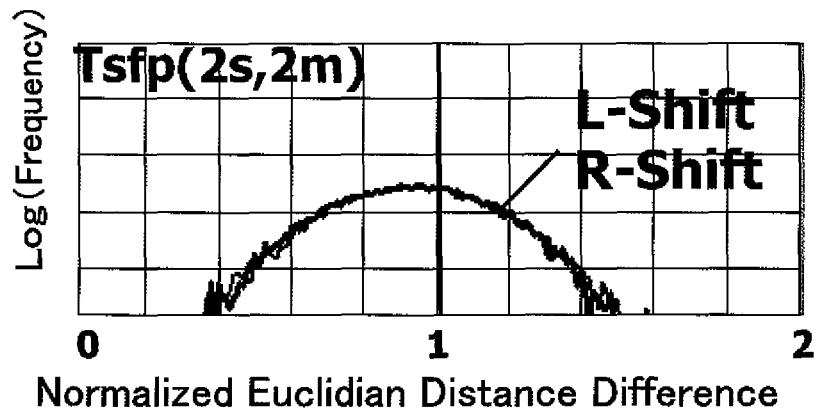
FIGS. 29A and 29B illustrate another example of the evaluations of edge shifts by using L-SEAT.
Figure 29B:
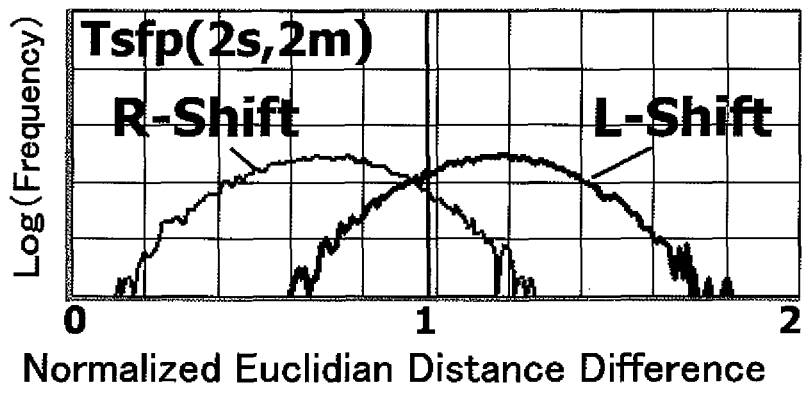

The simulation in this case was performed when Tsfp(2s, 2m) is +0.2T (shift by 0.2T to the right). FIGS. 28A and 28B correspond to the case where the method for evaluating extended edge shifts at respective time instants (expressions (D1)~(D6)) is used. It is apparent from FIG. 29B that when Tsfp(2s, 2m) is shifted to the right, the corresponding distribution is also shifted to the right. A good recording condition can be obtained by adjusting the parameters of the recording pulse so that respective edge shifts may approach zero. FIGS. 29A and 29B correspond to the case where the method for evaluating the average of distributions of the independently calculated Euclidean distance differences (expressions (7)~(13)) is used. Here, the simulation result in which the Hamming distances are both set equal to 2 for the L and R shifts is shown. As seen in FIG. 29B, when the shift of Tsfp(2s, 2m) is zero, the averages of the L- and R-distributions differs from the ideal Euclidean distance (=1), but both the averages are the same as each other within a tolerable range of error. On the other hand, as seen in FIG. 29A, when the shift of Tsfp(2s, 2m) is not zero, the averages of the L- and R-distributions shift to the opposite directions. Therefore, if the parameters of the recording pulse are adjusted so that the averages of distributions of the L- and R shifts may coincide with each other, a good recording condition can be obtained. In this way, if the Hamming distances of the main bit arrays for evaluating the L- and R-target signals are set equal to each other, the recording condition can be adjusted independent of SNR by using symmetricity. As described above, main bit arrays having different Hamming distances can also be employed as the main bit arrays for evaluating the L- and R-target signals.

Figure 30:
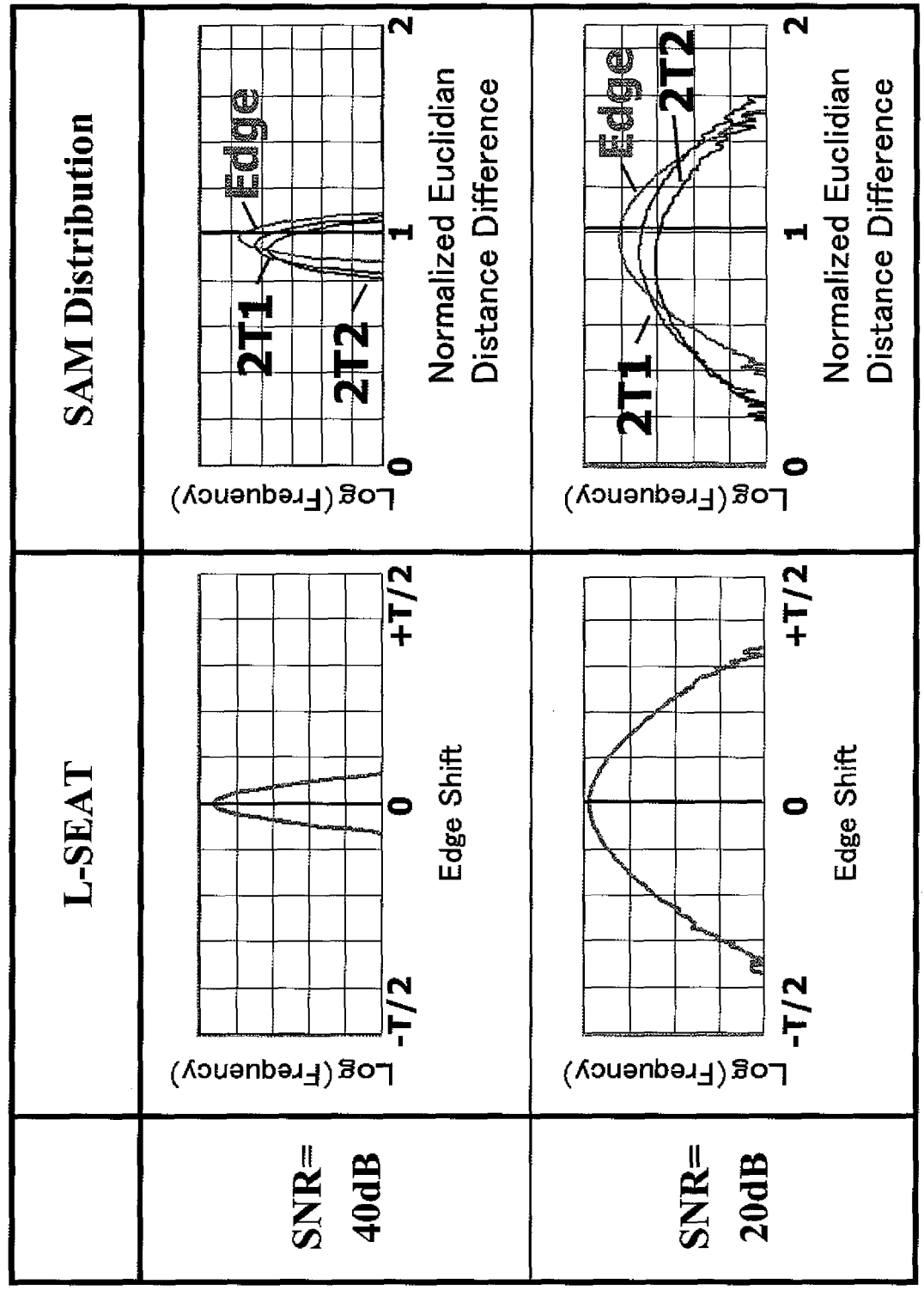
FIG. 30 shows L-SEAT distributions and SAM distributions.

FIG. 30 shows the comparison between the SAM distribution and the L-SEAT distribution, both distributions being obtained through simulation. Here, the condition for simulation is the same as that described above, the recording density is equivalent to 33 GB per disc surface as of a BD, and the PR class is (1, 2, 2, 2, 1).

It is ascertained that the average of SAM distribution approaches zero as SNR decreases whereas the average of L-SEAT distribution remains fixed to zero independent of SNR. Since the case where the evaluation main bit arrays have $N_{2T}=3$ or greater, is an extended version of the case shown in FIG. 30, the same result can be obtained.

Figure 8:
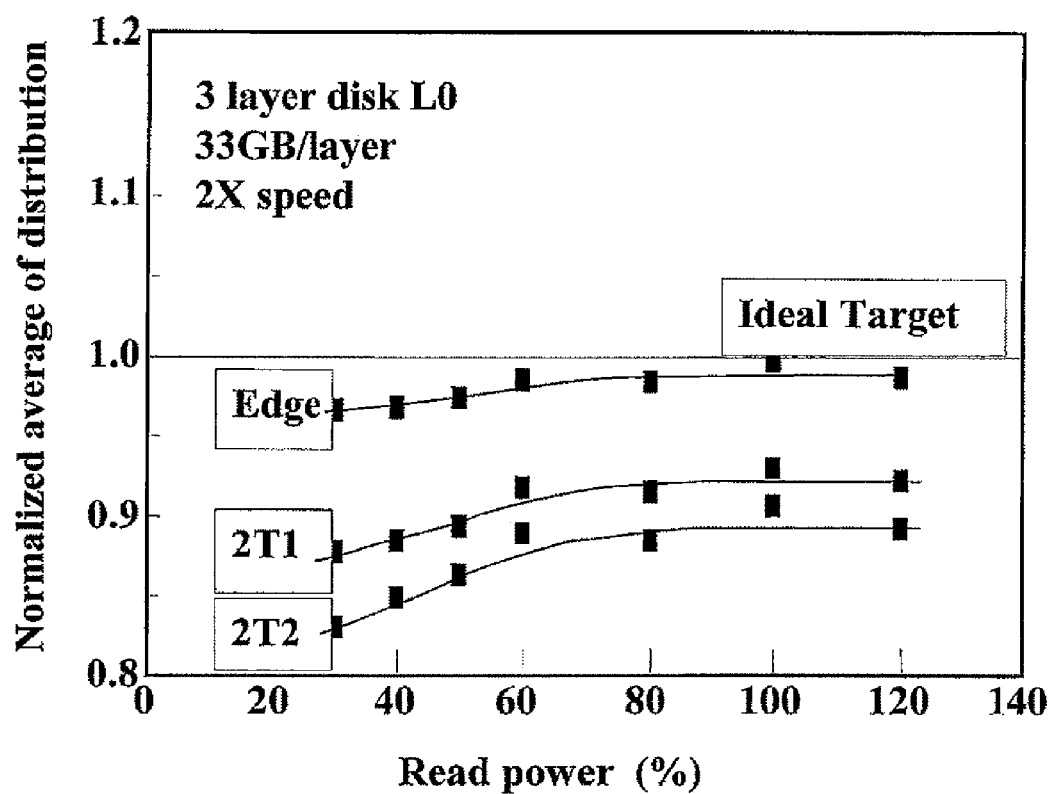
FIG. 8 graphically shows the relationship between reproduction power and deviation of distribution center.
Figure 9A:
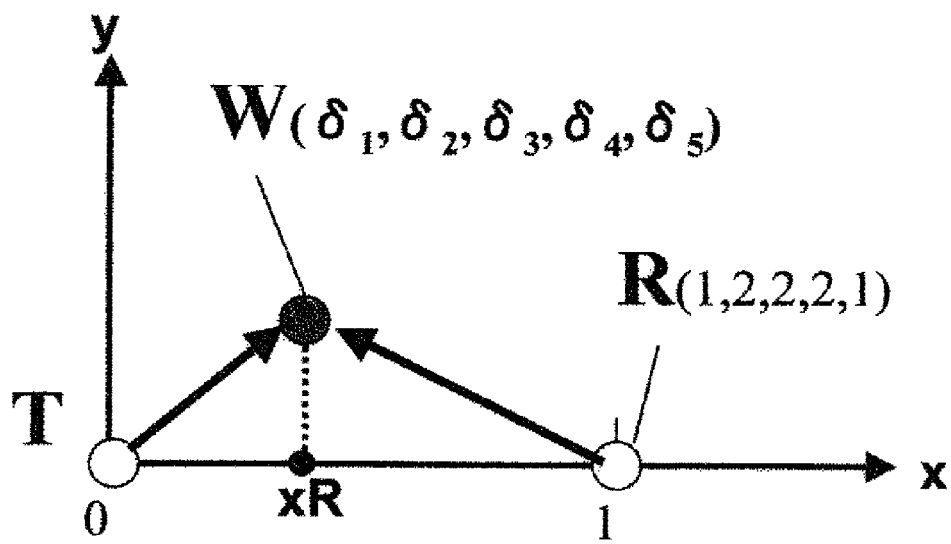
FIGS. 9A and 9B diagramatically show an example of equivalent edge shift.
Figure 9B:
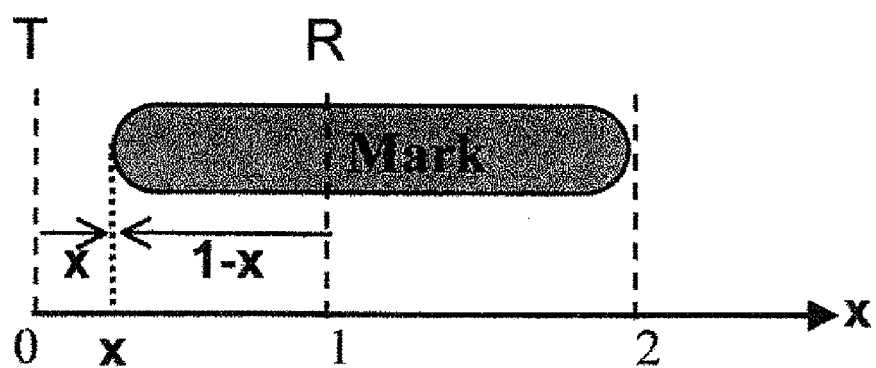
Figure 10A:
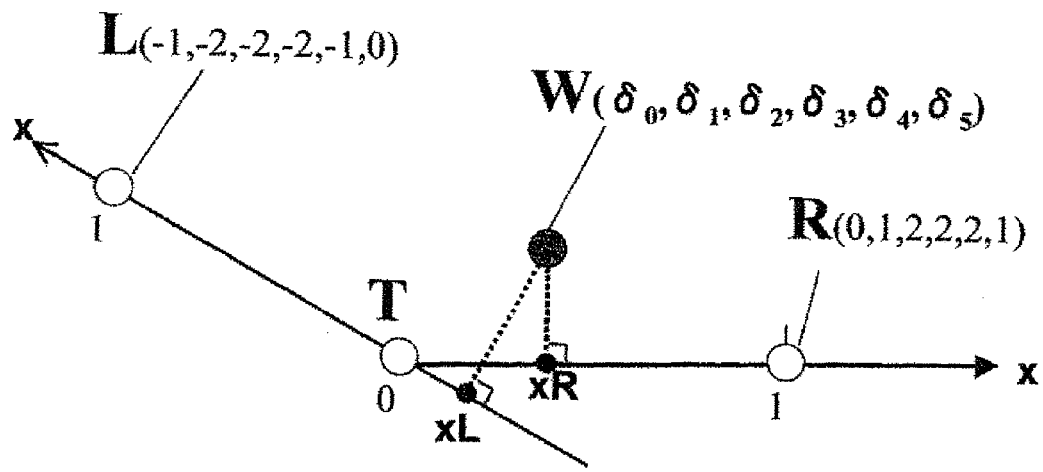
FIGS. 10A and 10B schematically show another example of equivalent edge shift.
Figure 10B:
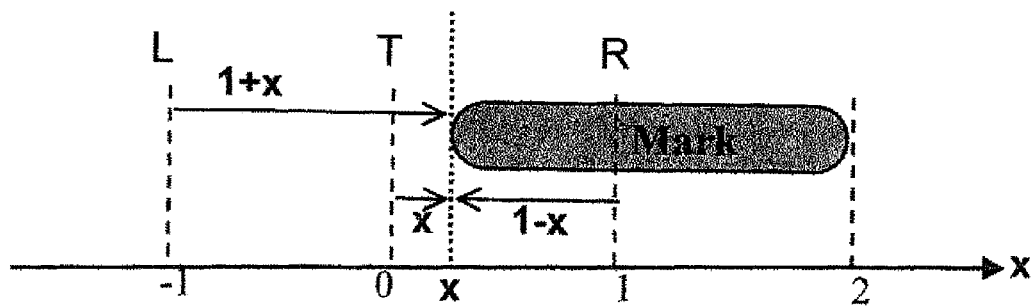
Figure 12A:
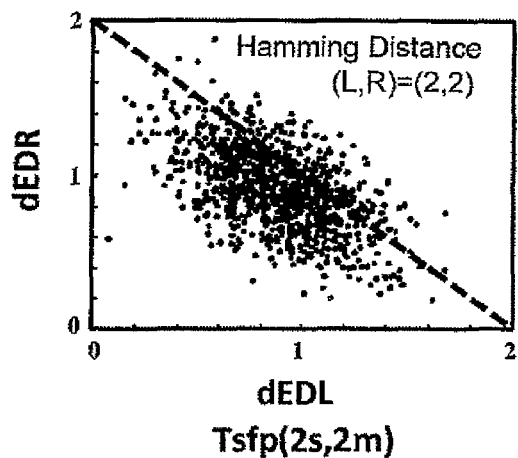
FIGS. 12A~12D show the correlations between dEDL and dEDR.
Figure 12B:
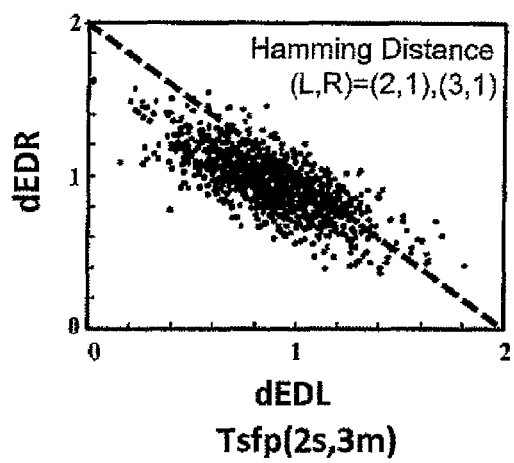
Figure 12C:
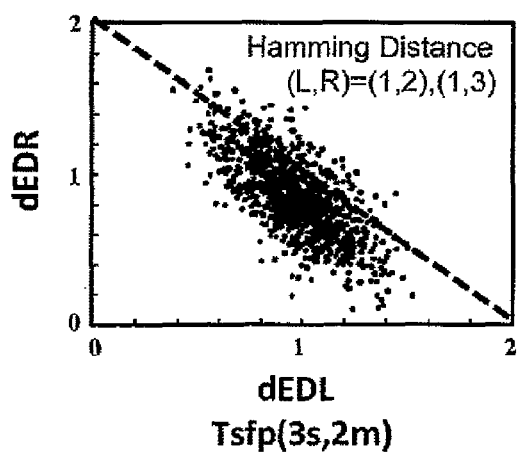
Figure 12D:
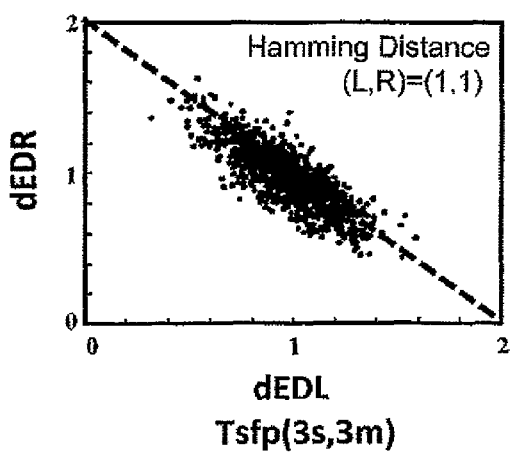
Figure 13A:
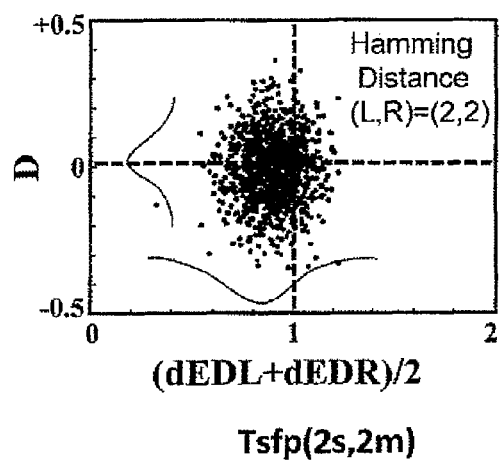
FIGS. 13A~13D show the relationships between the averages of dEDL's and dEDR's and the extended edge shifts.
Figure 13B:
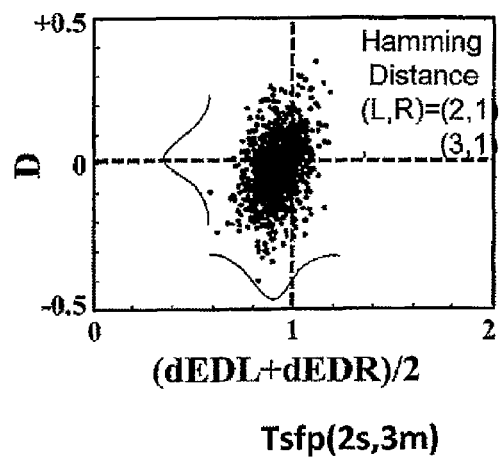
Figure 13C:
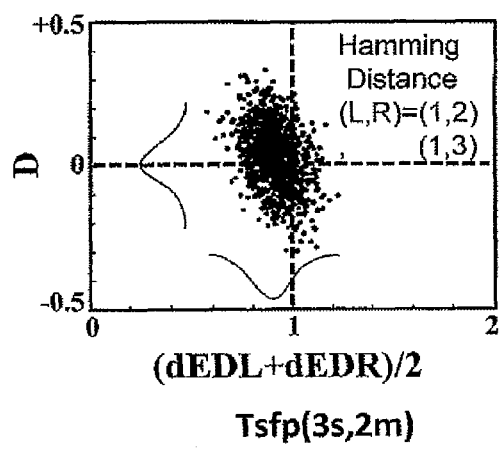
Figure 13D:
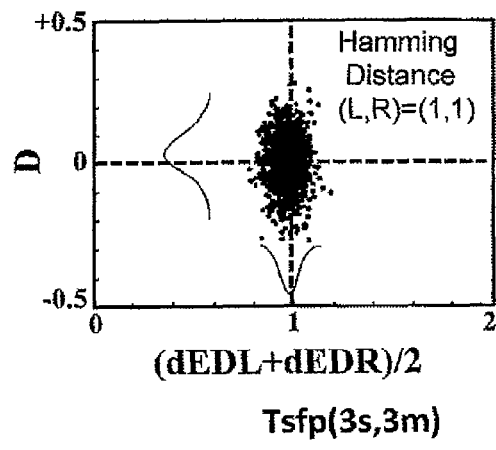
Figure 22:
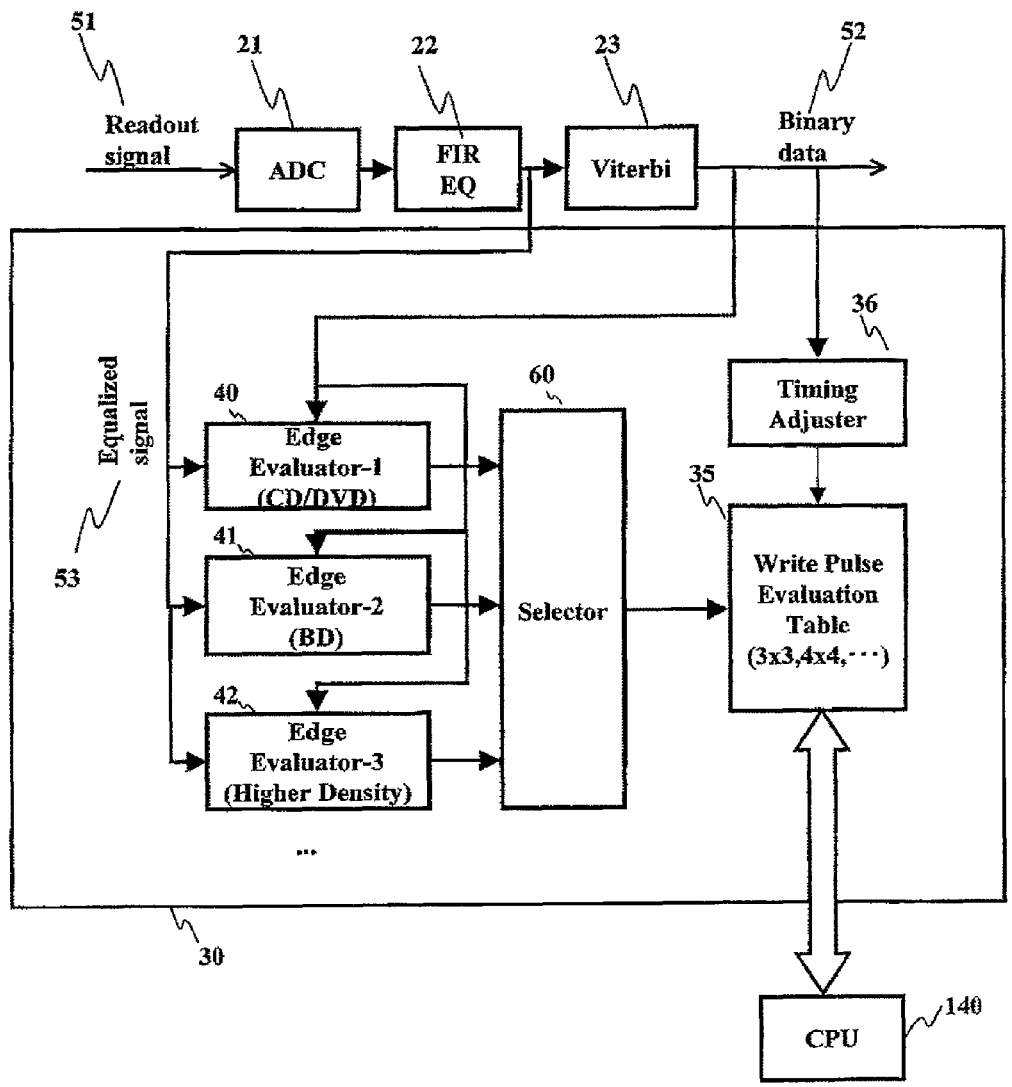
FIG. 22 shows in block diagram an evaluation circuit.
Figure 31A:
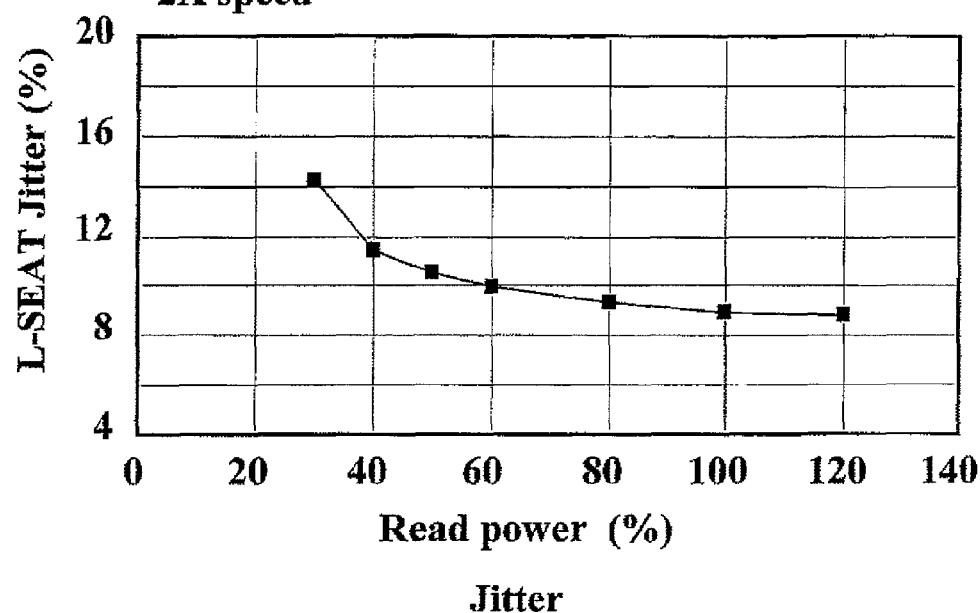
FIGS. 31A and 31B graphically show the relationships between read powers and L-SEAT evaluation indices.
Figure 31B:
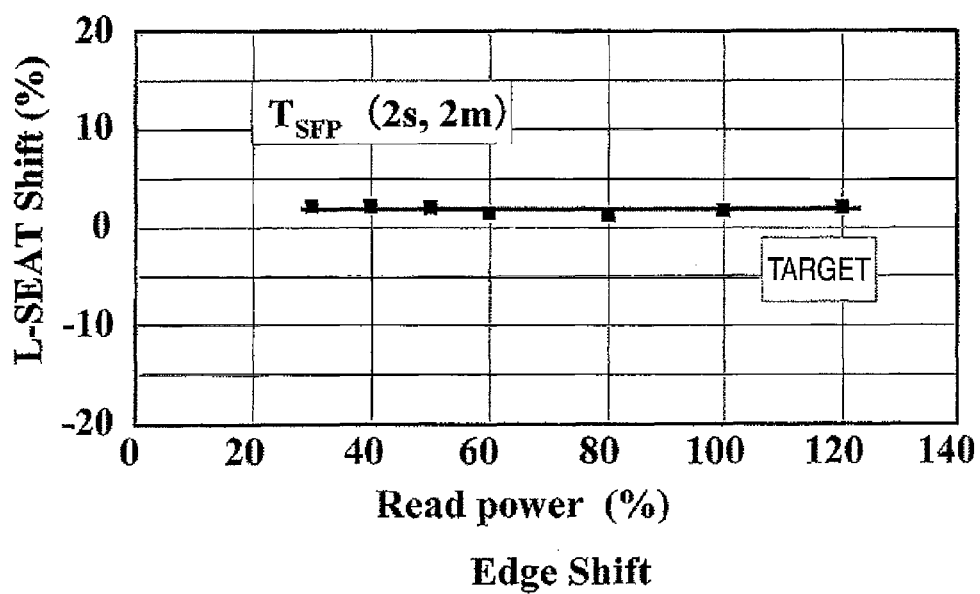

FIGS. 31A and 31B graphically show the experimental results regarding the dependence of L-SEAT on SNR. These results was obtained by performing read experiments while the read power for the L0 layer of the above mentioned 3-layer disc fabricated for test purpose, was being changed. The results correspond to the result shown in FIG. 8 obtained according to the conventional technique. In FIGS. 31A and 31B, the horizontal axis is graduated in read power with the read power of 1.2 mW normalized as 1000. Since the amplitude of the read-out signal is proportional to the read power while the noise in the photodetector (amplifier noise) is constant, then in this experiment the SNR of the read-out signal is changed by changing read power. The L-SEAT jitter and L-SEAT shift were evaluated with the evaluation circuit shown in FIG. 22, through allocation to the 4×4 type pulse table with respect to the anterior and posterior edges of a recorded mark. FIG. 31A shows the measured values of L-SEAT jitter. The increase in the jitter with the decrease in the read power reflects the change in SNR. On the other hand, FIG. 31B shows the result of evaluation of edge shift with respect to Tsfp(2s, 2m). It is understood from FIG. 31B that the value of the L-SEAT shift remains constant independent of read power (SNR). This characteristic is the feature of the method according to this invention which makes it possible to evaluate the marginal evaluation based on the basis of the Euclidean distance difference by separating the component of the edge shift and the component depending on SNR from each other on the basis of L-SEAT. It has therefore been ascertained that the use of this method enables the adjustment of write condition with high read compatibility independent of the change in SNR caused depending on the difference among drive devices and read/write conditions.

Now, description is made of an automatic equalizer suitable for adjusting the recording condition.

Figure 32:
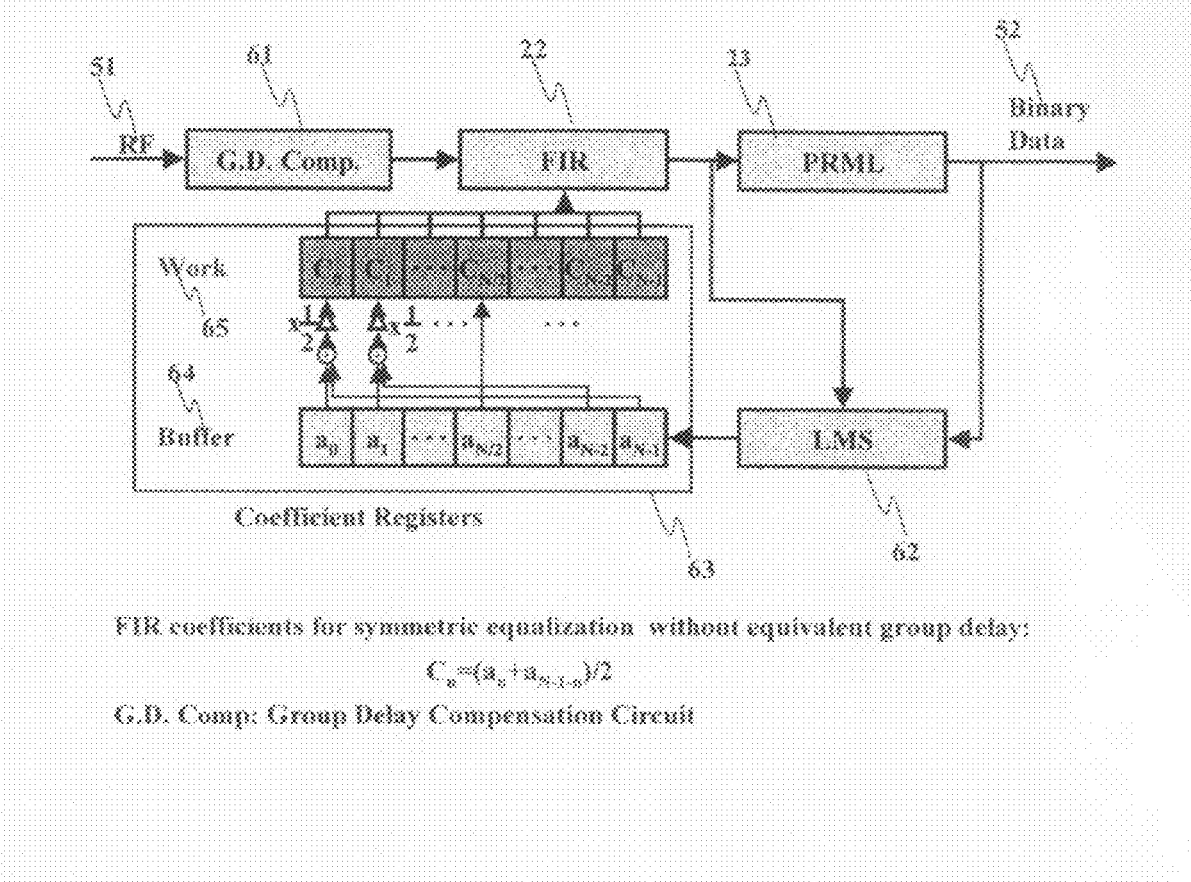
FIG. 32 shows in block diagram the structure of an automatic equalizer of symmetric type.
Figure 33A:
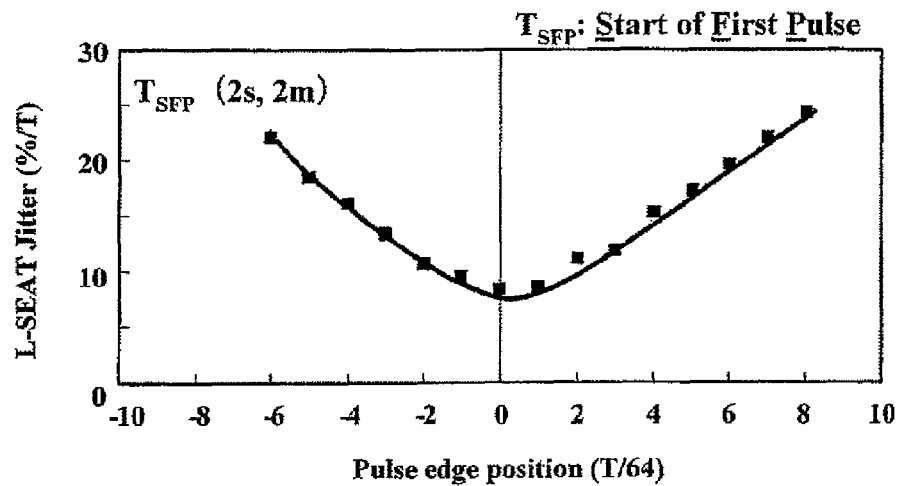
FIGS. 33A~33C graphically show experimental results regarding recording adjustment using L-SEAT.
Figure 33B:
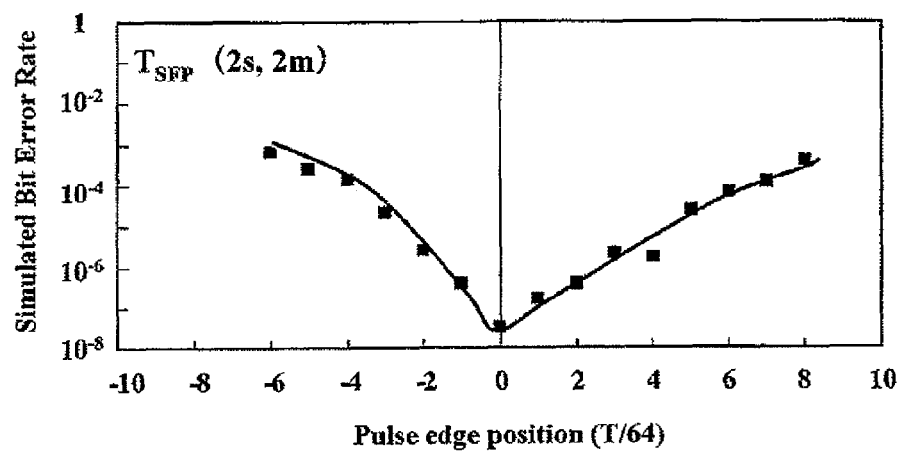
Figure 33C:
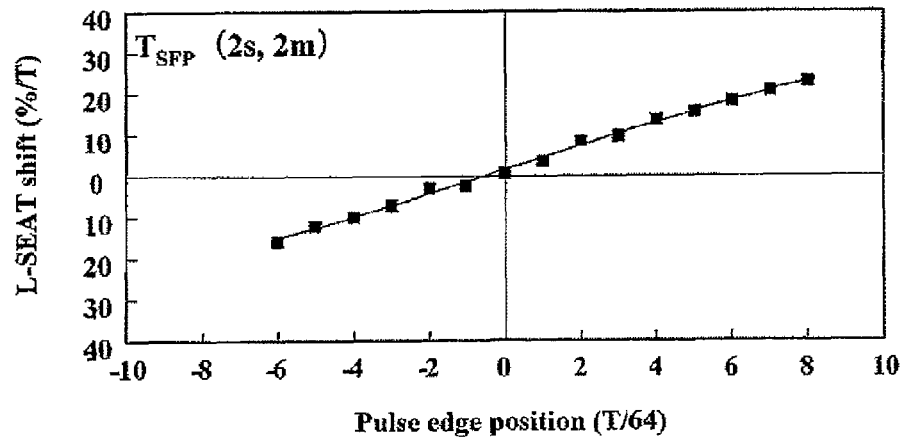
Figure 34A:
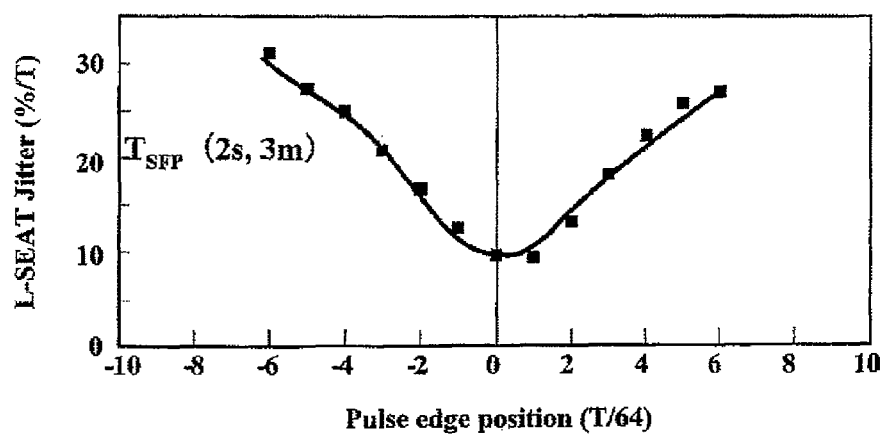
FIGS. 34A~34C graphically show additional experimental results regarding recording adjustment using L-SEAT.
Figure 34B:
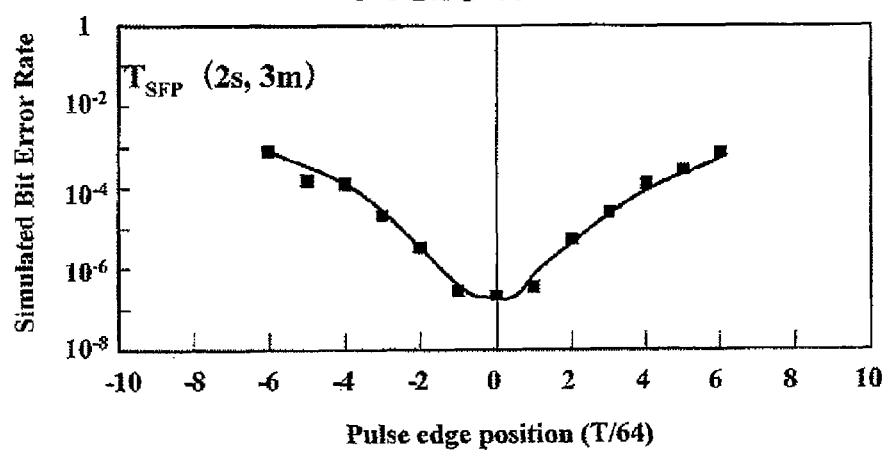
Figure 34C:
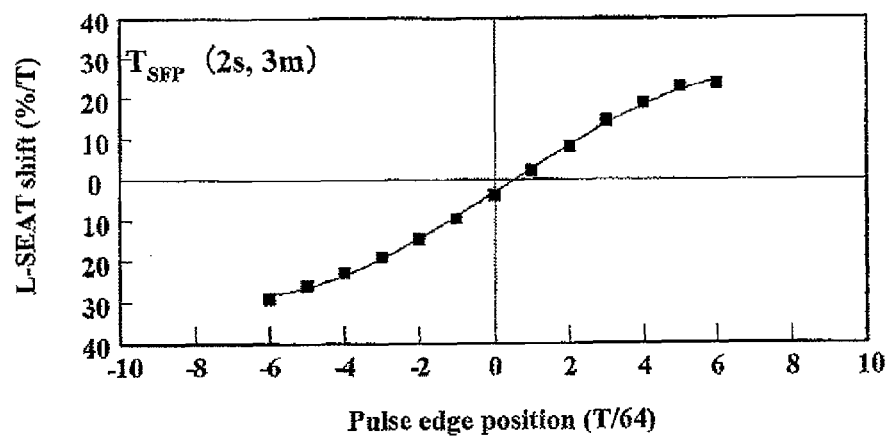
Figure 35A:
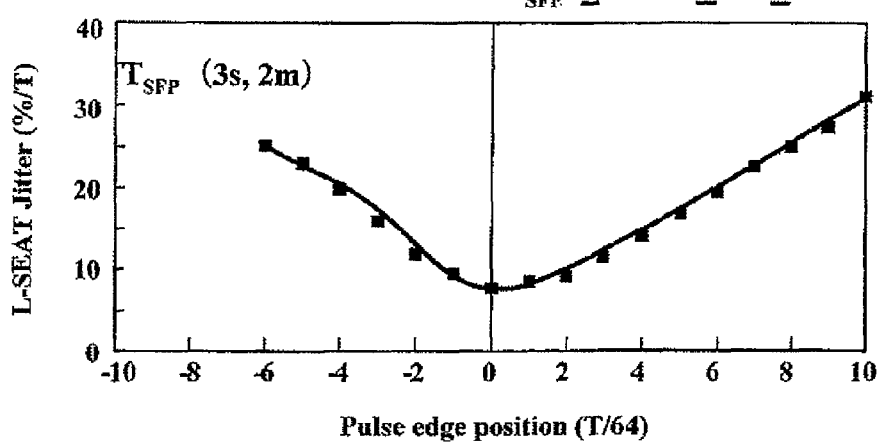
FIGS. 35A~35C graphically show yet additional experimental results regarding recording adjustment using L-SEAT.
Figure 35B:
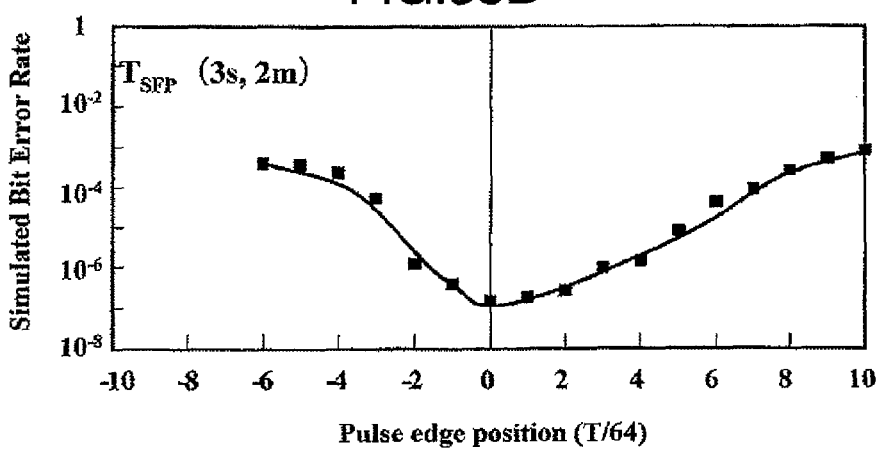
Figure 35C:
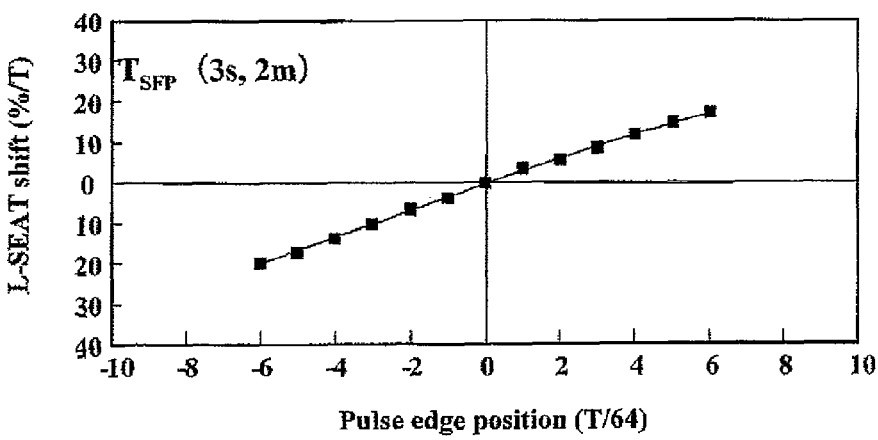
Figure 36A:
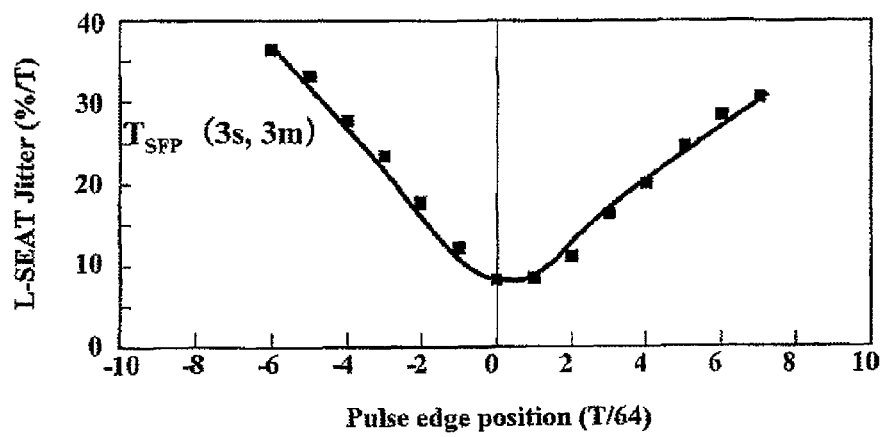
FIGS. 36A~36C graphically show still additional experimental results regarding recording adjustment using L-SEAT.
Figure 36B:
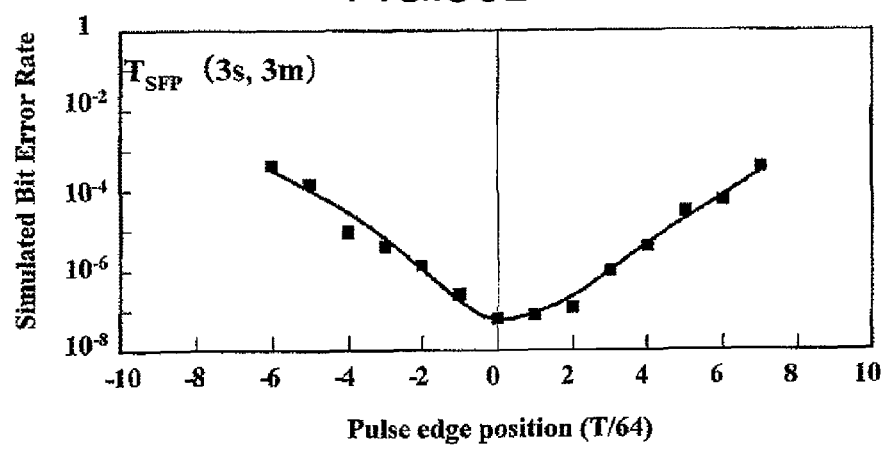
Figure 36C:
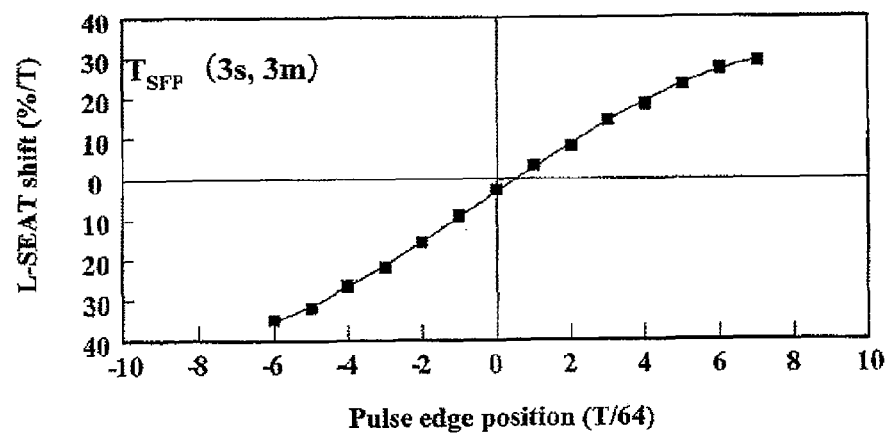

FIG. 32 shows in block diagram the structure of an automatic equalizer of symmetric type according to this invention. As described above, the use of L-SEAT makes it possible to stabilize the adjustment of the recording pulses in response to change in SNR. On the other hand, drive devices for actual use encounter (1) asymmetricity in the scanning direction of light spot due mainly to the relative tilt (tangential tilt) angle between disc medium and optical head, and (2) asymmetricity of read-out signal along the time axis due to the asymmetricity of the tap coefficients of the automatic equalizer.

The distortion of read-out signal along the time axis, which is detected as an edge shift, may become a disturbance in performing the adjustment of the write condition with high read compatibility. For example, even when a recorded mark has any residual edge shift, if the automatic equalizer makes its tap coefficients asymmetric so that the residual edge shift can be compensated, the recorded mark will be judged such that the measured edge shift is small and hence that the recording was quite successful. In general, different drive manufacturers produce many different sorts of optical disc drives and such different optical disc drives use so many different circuit configurations. Accordingly, the recording of data in such a manner that only a particular drive can easily reproduce the recorded data will create a problem that must be solved in optical disc systems in which compatibility of recording media is highly required. The automatic equalizer of symmetric type shown in FIG. 32 can provide a solution to this problem. In FIG. 32, a read-out signal 51 reproduced from an optical disc medium (not shown) is converted to digital data by means of an A/D converter (not shown); the digital data are equalized by the automatic equalizer 22; and the output of the automatic equalizer 22 is then binarized by a PRML decoder 23 so that a binary bit array 52 is outputted. The tap coefficients $C_0, C_1, C_2 \ldots$ are subjected to an automatic learning process so that the RMS error between the target signal corresponding to the binary bitarray 52 and the signal outputed from the automatic equalizer 22 can be minimized. This algorithm is usually called "LMS (Least Mean Square) Method" and performed by a LMS circuit 62. The renewed tap coefficients $a_0, a_1, a_2, \ldots$, created by the LMS circuit 62, are temporarily stored in a buffer 64. In a work register 65 used for the actual operation of a FIR filter are set the averages each of which is the average of tap coefficients located symmetrically with each other along the time axis (e.g. average of $a_o$ and $a_n$, $a_1$ and $a_{n-1}$, etc.). In this way, the tap coefficients of the automatic equalizer are symmetricized so that the reproduction of recorded marks with distorted edge shifts can be prevented. Incidentally, the I-V converting amplifier included in a photodetector and other fulters may sometimes generate group delay due to circuit configuration. The provision, if necessary, of a group delay compensator 61 can reduce such group delay. The group delay compensator 61 can be embodied by the use of a FIR filter having asymmetric tap coefficients each of which is a preset value. Further, with this circuit configuration, it becomes possible to reduce the asymmetricity of light spot in the direction of time axis by adjusting the amount of tangential tilt in such a manner that SbER or L-SEAT jitter is minimized while the data in a well-recorded reference disc is being reproduced. With this circuit configuration, it can be made possible for the automatic equalizer to act solely on the adjustment of the frequency characteristic of reproduced signal. The automatic equalizer of symmetric type according to this invention can provide a recording condition of high reproduction compatability not only when it is combined with the L-SEAT but also even when it is combined with any of conventional record adjustment methods. Since the output of the LMS circuit 62 can be transferred directly to the buffer 64 through the addition of a suitable circuit such as a selector, the automatic equalizer of symmetric type according to this invention can be easily operated as an ordinarily automatic equalizer (having no tap symmetricity restriction).

The description to follow is of the result obtained by the use of an automatic equalizer of symmetric type having 21 taps.

Figure 37:
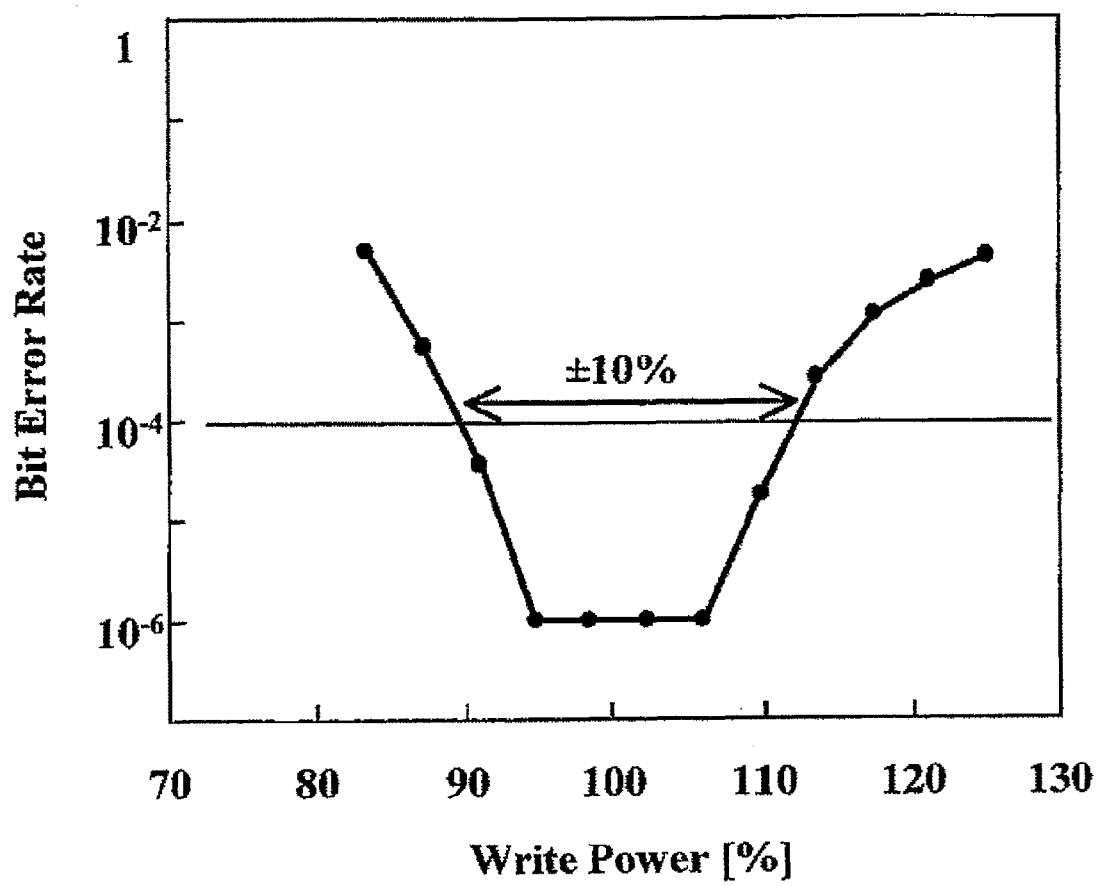
FIG. 37 graphically shows power margin after write adjustment.

FIGS. 33A~33C, FIGS. 34A~34C, FIGS. 35A ~35C, FIGS. 36A~36C, and FIG. 37 graphically show the experimental results regarding the adjustments of write pulse conditions by using L-SEAT. In these experiments, the L-SEAT jitters, L-SEAT shifts and SbERs were measured while changing the four write pulse parameters such as Tsfp(2s, 2m), Tsfp(3s, 2m), Tsfp(2s, 3m) and Tsfp(3s, 3m) in the L0 layer of the 3-layer test disc mentioned above. SbERs were measured without maintaining the symmetricity restriction on the tap coefficients of the automatic equalizer just as in the ordinary reproduction procedure. The basic unit used in adjusting the edge of write pulse was set equal to T/64, and the linear speed for writing and reading was set equal to double the speed of data transfer in case of BDs. As seen from these figures, the pulse edge positions that give the zero of L-SEAT shift and the valley bottoms of L-SEAT jitter and SbER, coincide with one another within a tolerance smaller than T/64. Since the adjustment unit for pulse width is usually set equal to T/16, it was ascertained from these results that the adjustment of recording condition can be performed very well by using the L-SEAT shifts and the L-SEAT jitters. As a result of having performed such adjustments on all the four parameters of write pulses, the value of SbER has been improved from $3 \pm 10^{-3}$ to $1 \times 10^{-7}$. FIG. 37 graphically shows the relationship obtained by measurement between write power and bit error rate. A sufficient power margin of about +100 came to be obtained.

Figure 38:
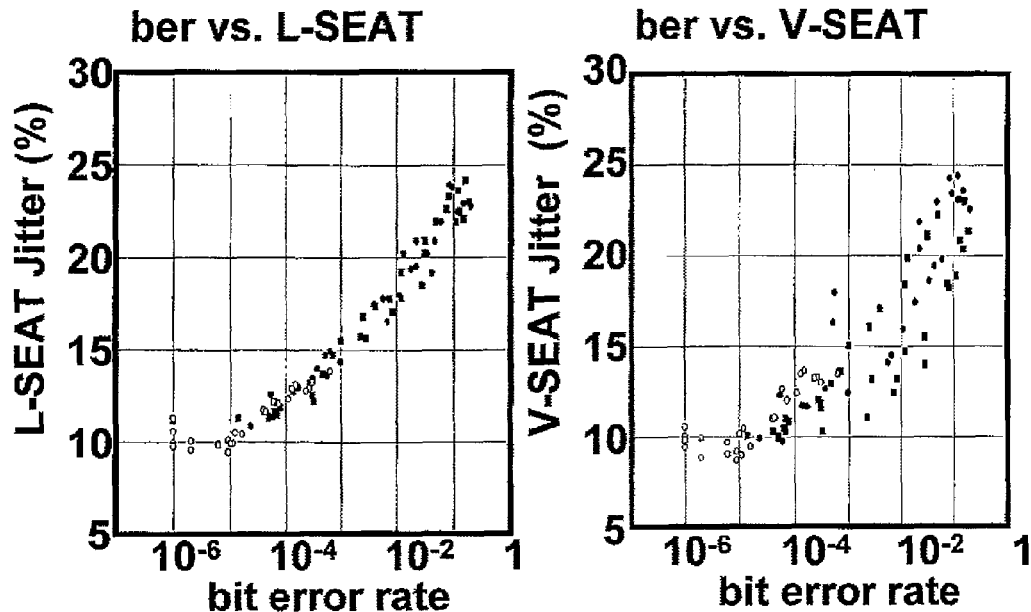
FIG. 38 shows the relationship between bit error rates and L-SEAT jitter and the relationship between bit error rates and V-SEAT jitter.

FIG. 38 graphically shows the relationships obtained through experiments between bit error rate and L-SEAT jitter and between bit error rate and V-SEAT jitter. In these experiments, the relationships between bit error rate and L-SEAT jitter and between bit error rate and V-SEAT jitter were measured while varying write power, defocusing, spherical aberration and tangential and radial tilts of disc media. It was ascertained from FIG. 38 that the correlation between bid error rate and jitter was further improve for L-SEAT than for V-SEAT. The reason for this is as described above.

The adjustment method for recording condition according to this invention will now be described on the basis of the results of the experiments and simulations described above.

Figure 39:
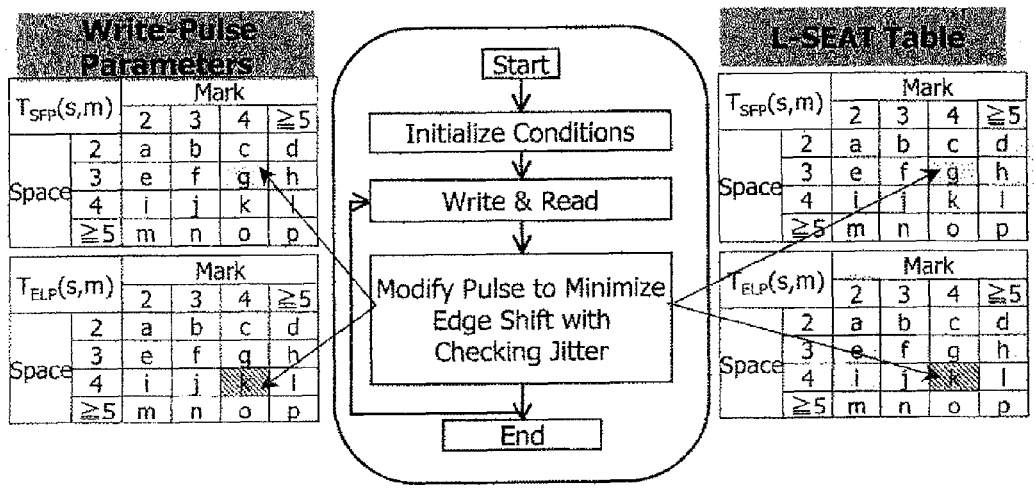
FIG. 39 diagrammatically shows how write pulses are adjusted.

FIG. 39 illustrates an example of how the adaptive parameters of write pulse are adjusted. In FIG. 39, the adaptive parameters of write pulse are explained by the help of 4×4 type pulse tables. The results of measurement of L-SEAT shifts and jitters are allocated to the 4×4 type pulse tables as described above. At this time, data are written in an optical disc medium while varying the write pulse condition, the value of the corresponding L-SEAT shift is evaluated by reading out the written data, and the parameters of the write pulse are so determined as to minimize the shift value. In this way, a good condition for the write pulse can be obtained. As seen from the results shown in FIGS. 33A~33C through FIGS. 36A~36C, adjustment results more stable against various changes come to be obtained if adjustment is performed to reach not only the condition for the minimized L-SEAT shift but also the condition for the minimized L-SEAT jitter. As apparent from this example, since the write pulse parameters exhibit a one-to-one correspondence with the evaluation values therefor, the simultaneous adjustment of plural write pulse parameters can be parallelly performed if write/read operation is carried out while changing the plural write pulse parameters at the same time. By doing so, it becomes possible to shorten the time for test writing in a drive device to a great extent. To be concrete, although a double-speed drive device using the method for determining the write pulse parameters one by one, takes process time of about 30 seconds to one minute, the parallel process using this method will be able to complete such test writing in about one second. In applying this adjusting method, if there are any fixed parameter among the entire write pulse parameters, adjustment can be stabilized. In general, it is preferable to fix such parameters associated with the formation of long marks as, for example, Tsfp(5s, 5m) and Telp(5s, 5m).

Figure 40:
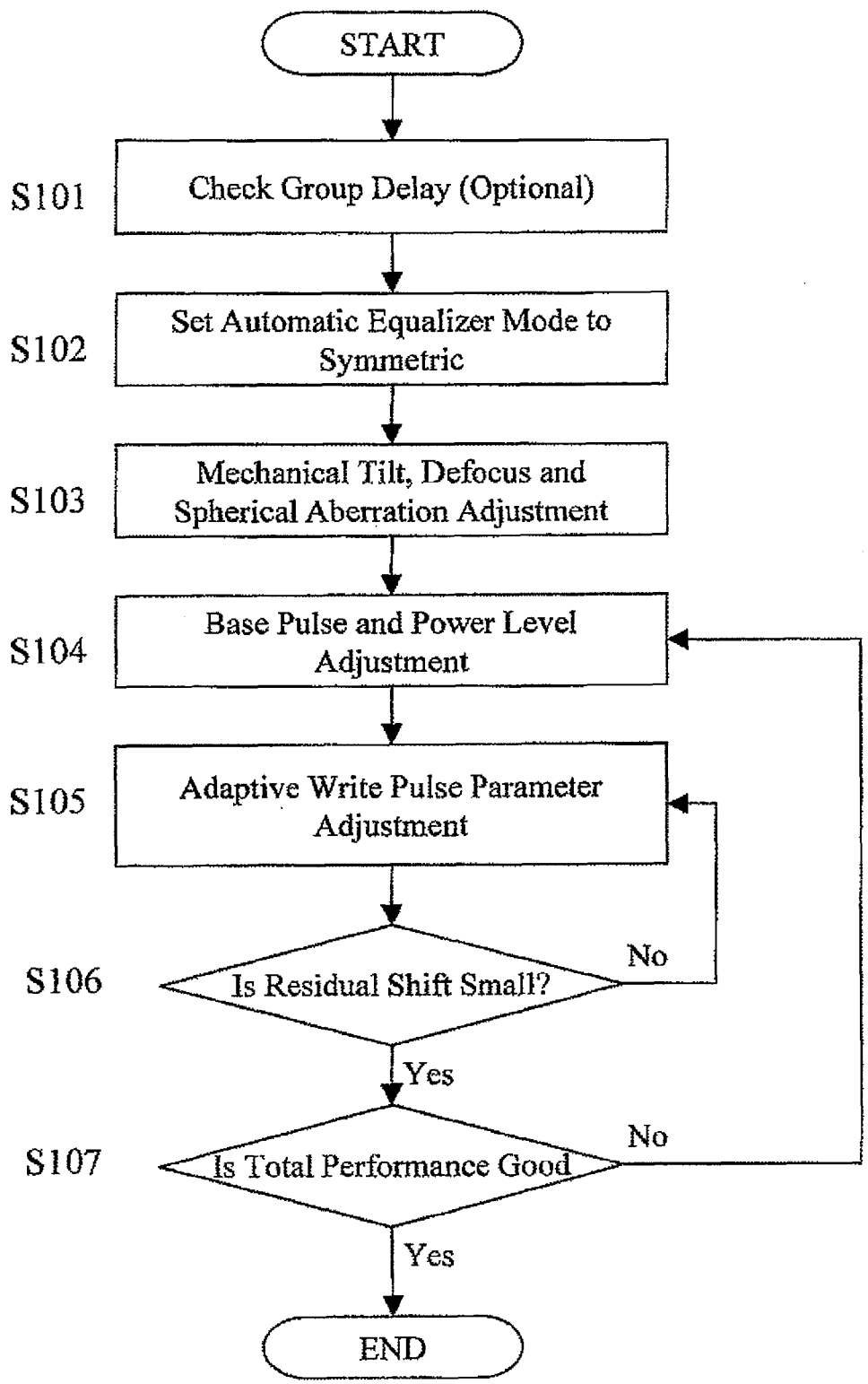
FIG. 40 is the flow chart illustrating a method for write adjustment according to this invention.

FIG. 40 is the flow chart illustrating the entire procedure of adjusting write pulse condition. To begin with, in Step 101, the group delay in the automatic equalizer (or reproduction) circuit shown in FIG. 32 is checked, if necessary, to determine the condition for compensation of the group delay. Then, in Step 102, the operating mode of the automatic equalizer is set to the symmetric mode.

In Step 103, while reference data are being read out, defocusing amount, spherical aberration and the tilt of disc medium are adjusted in such a manner that such indices for read-out evaluation as SbER and L-SEAT jitter are optimized. As described above, the tangential tilt must be adjusted with special consideration, such as by reading out plural reference data or by including the condition for optimizing the write sensitivity. In Step 104, while the symmetrisuty, S/N ratio and crosstalk of the read-out signal are being taken into consideration, proper conditions for the basic pulse and power are determined by using written data including marks and spaces having a length of 5T or greater. By doing so, the write pulse parameters for long marks corresponding to Tsfp(5s, 5m) and Telp(5s, 5m) shown in the 4×4 type pulse table is fixed. Tsfp(5s, 5m) corresponds to the write pulse condition for the anterior edge, and Telp(5s, 5m) to the write pulse condition for the posterior edge. In Steps 105 and 106, while adaptive write pulse parameters are being adjusted, adjustment is continued until the residual edges shaft becomes less than a preset value (e.g. ±0.1% of T). In Step 107, the performance of write pulse is evaluated by evaluating the valley bottom values for SbER and bit error rate and the power margin with respect to the obtained write pulse, and decision is made on whether a predetermined performance has been achieved. If the result of the decision indicates that the achieved performance is insufficient, the flow returns to Step 104, where like adjustment is performed while the base pulse and the power level are being changed. When the predetermined performance has been achieved as a result of this series of steps, adjustment is finished.

Figure 41:
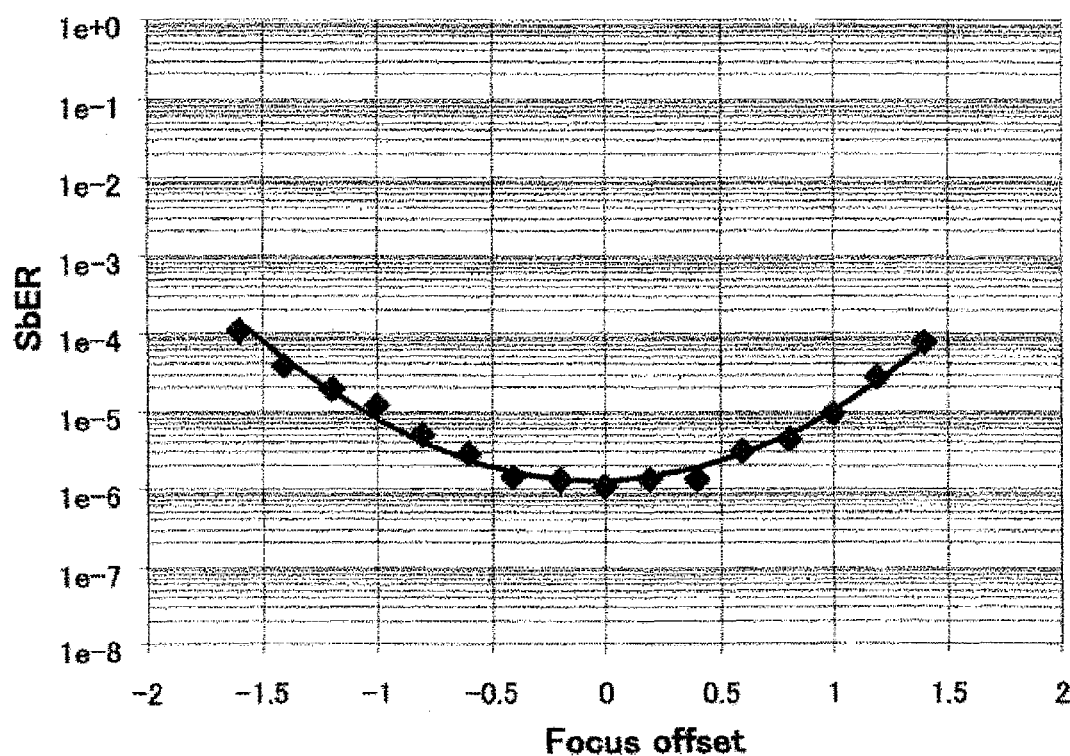
FIG. 41 graphically shows how focus is adjusted in accordance with the evaluation method according to this invention.

FIG. 41 graphically shows the relationship obtained through experiment between focus offset and SbER. In this experiment, the automatic equalizer of symmetric type according to this invention was used. The focus offset can be adjusted to a proper value by using this relationship and making SbER minimum. The same procedure can also be used for the adjustment of redial tilt, tangential tilt, spherical aberration, etc. The Step 103 in FIG. 40 can be carried out according to this procedure.

Description is now made of write pulses adapted to high-density recording. When the high-density recording with recording capacity of 30 GB or higher is to be performed on the basis of the BD standard, the adjacent marks are largely affected by thermal interference between them since the length of a 2T mark or space is about 100 nm, which is smaller than the size of the used light spot (about 500 nm, wavelength 405 nm, NA 0.85). Such an adverse effect becomes remarkable especially in the case of a multiple-layer discs in which it is impossible to make the metal reflection film serving as thermal buffer thick enough from the viewpoint of achieving satisfactory transparency. In such a case, it is considered difficult to form satisfactory recorded marks even with adaptive write pulses that can be determined depending only on the length of a recorded mark and the lengths of the spaces immediately anterior and posterior to the recorded mark. In such a case, the pattern which is affected by the thermal interference to the greatest extent is the one consisting of continuous 2T mark and 2T space. As described above, this pattern is that which brings about the highest error frequency. Therefore, in the case where such continuous 2T mark and 2T space occur, it is useful to regard such a pattern as a preceding pattern and to extend the adaptive write pulse table.

Figure 42A:
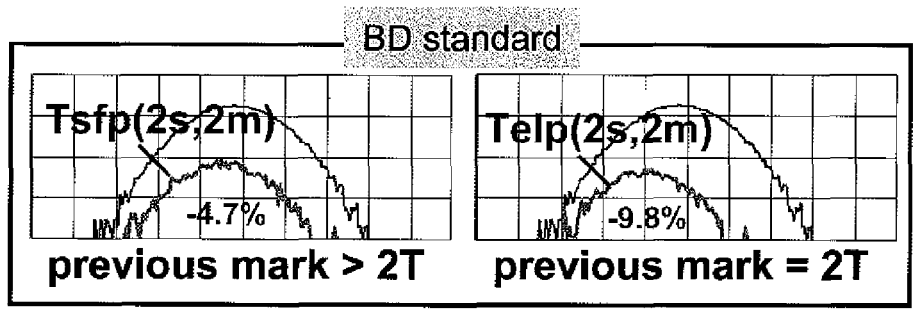
FIGS. 42A and 42B show the effects of adjustments achieved by the use of extended write pulse and L-SEAT.
Figure 42B:
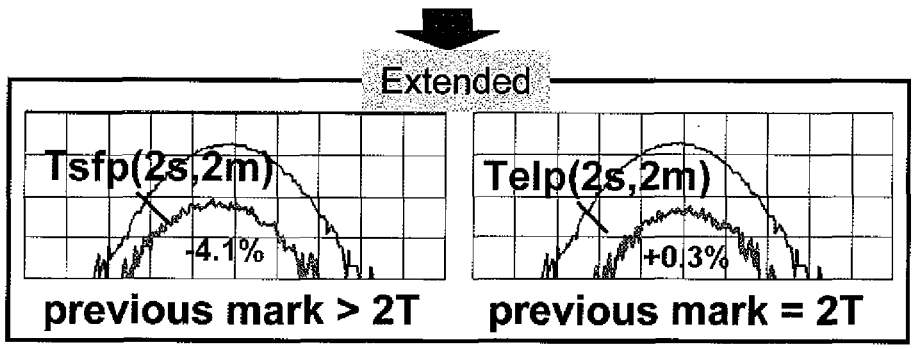

FIGS. 42A and 42B illustrate the effect obtained through the adjustment by the use of extended adaptive write pulse table and L-SEAT. The extended table shown here was obtained by the addition of an adaptive table under the assumption that the write pulses used are the standard write pulses for BD and that the pattern of continuous 2T mark and 2T space is regarded as a preceding space. As described above, if the table showing in FIG. 23 is used as the table of evaluation main bit arrays, it is possible to evaluate edge shifts in accordance with write pulses by the use of L-SEAT. As seen from FIG. 42B, the amount of the residual shift for Telp(2s, 2m) was able to be improved to a greater extent, as compared with the case where the standard write pulses for BD were used. Here, the adjustment unit for the write pulse width was set equal to T/32.

Now, description is made of an optical disc device as an embodiment of this invention.

Figure 1:
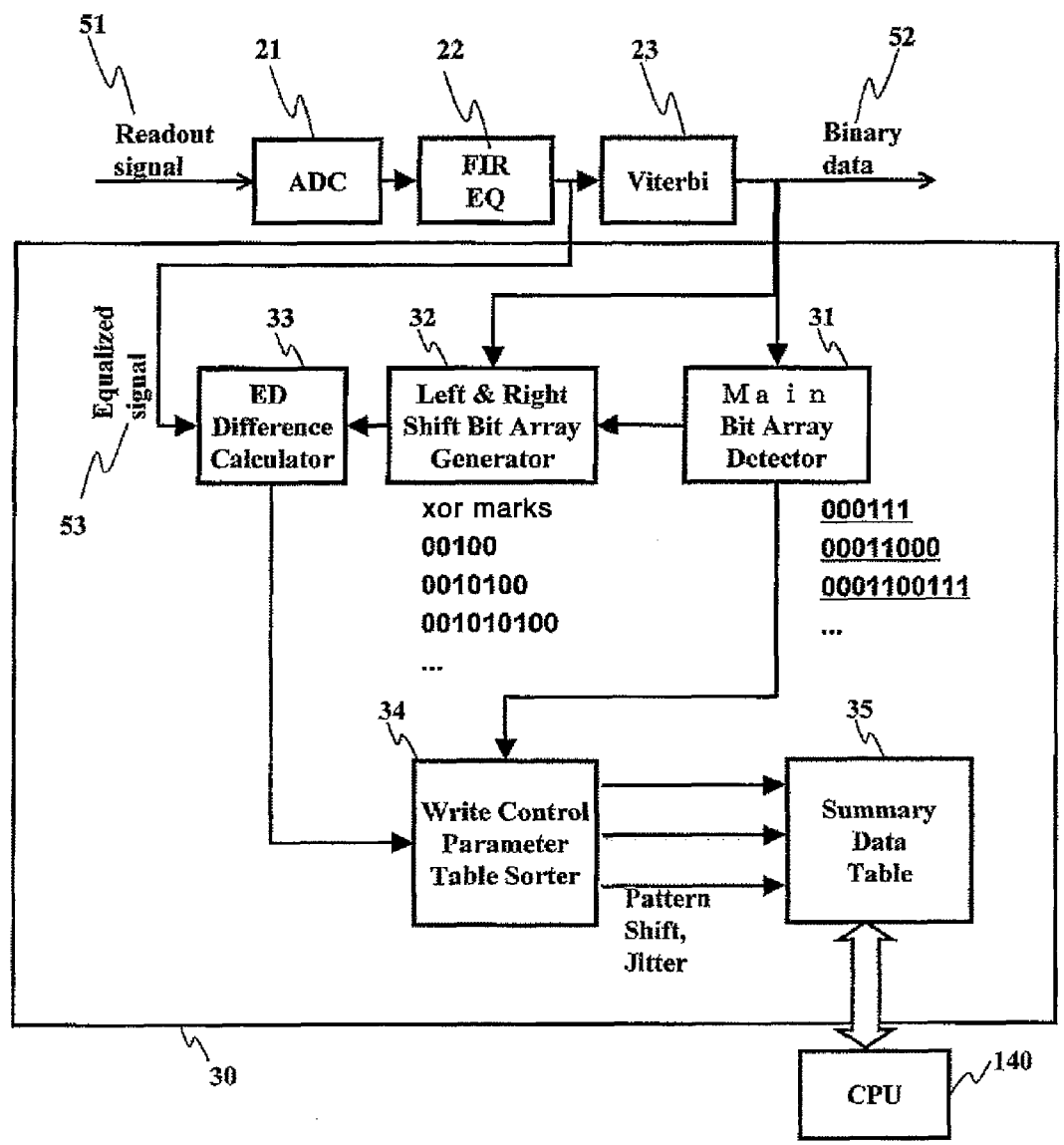
FIG. 1 shows in block diagram the configuration of the circuit for evaluating the reproduced signal, the circuit being used to realize an optical disc device according to this invention.
Figure 2:
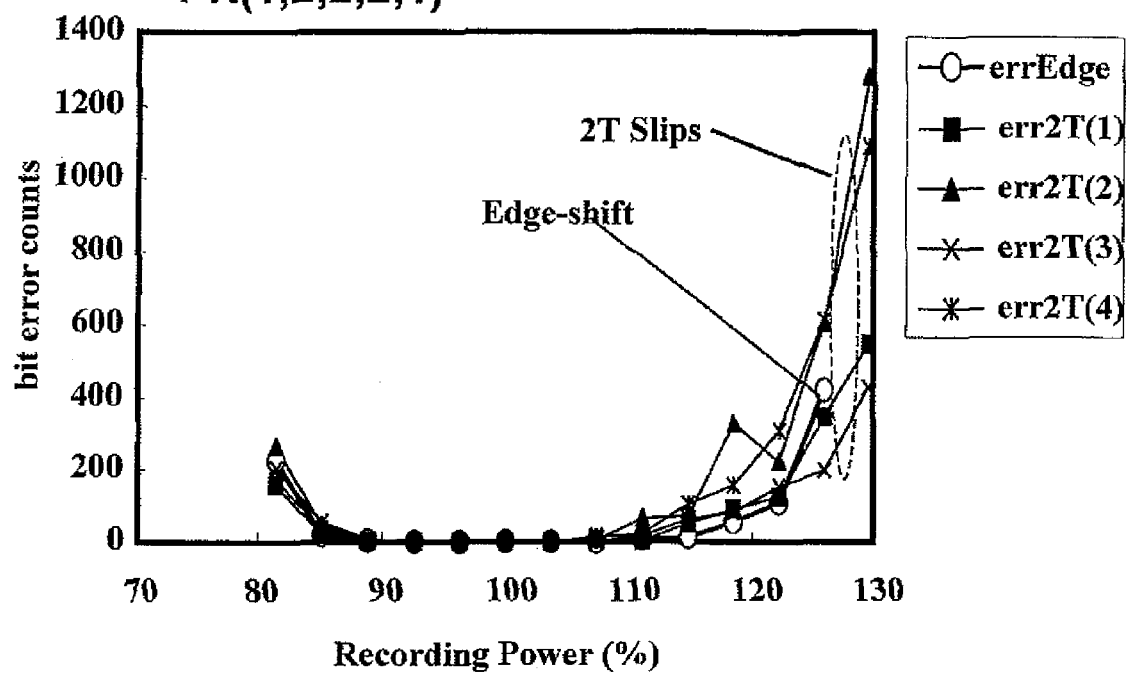
FIG. 2 graphically shows the experimental results illustrating the relationship between recording power and bit error counts, measured by using a 3-layer write-once optical disc fabricated for test purpose.
Figure 3:
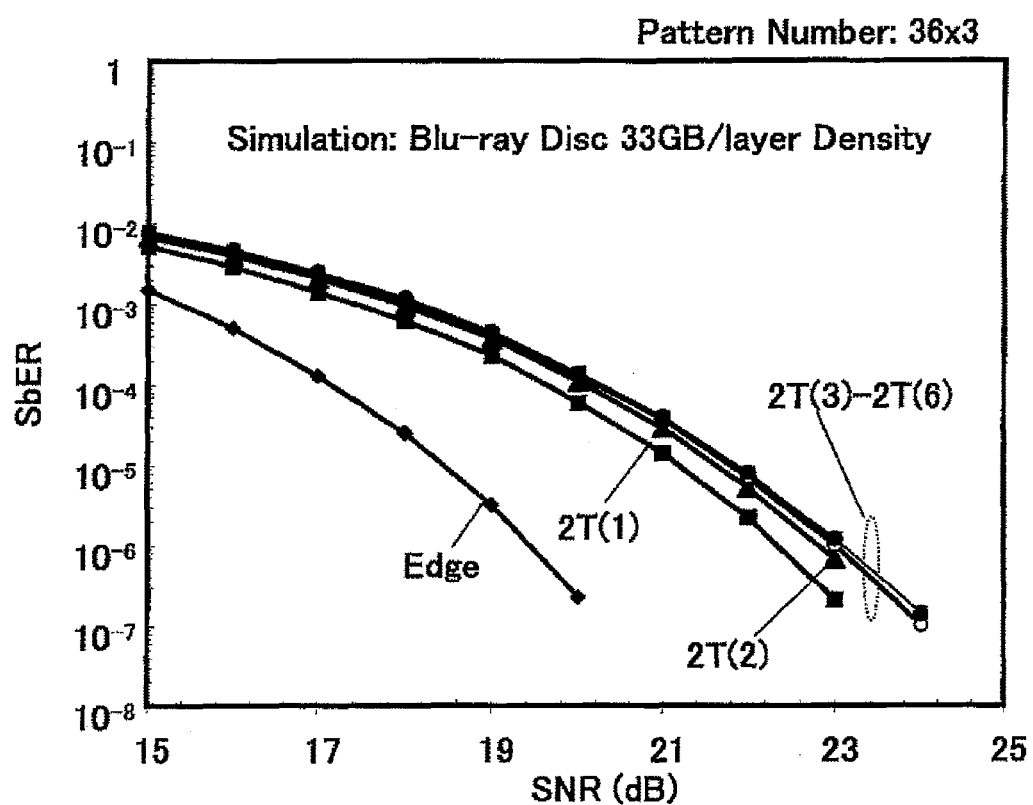
FIG. 3 graphically shows the results of simulations illustrating the relationship between SNR and SbER.
Figure 4:
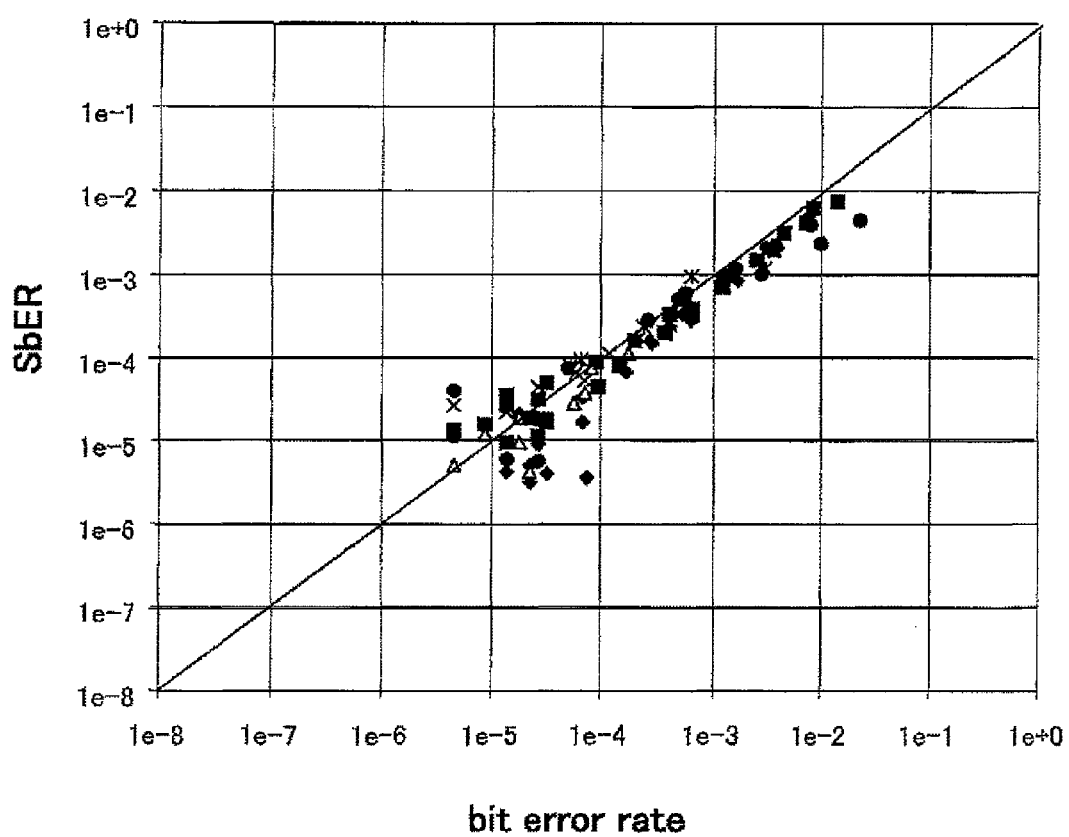
FIG. 4 graphically shows the experimenter result illustrating the relationship between bit error rate and SbER.
Figure 5:
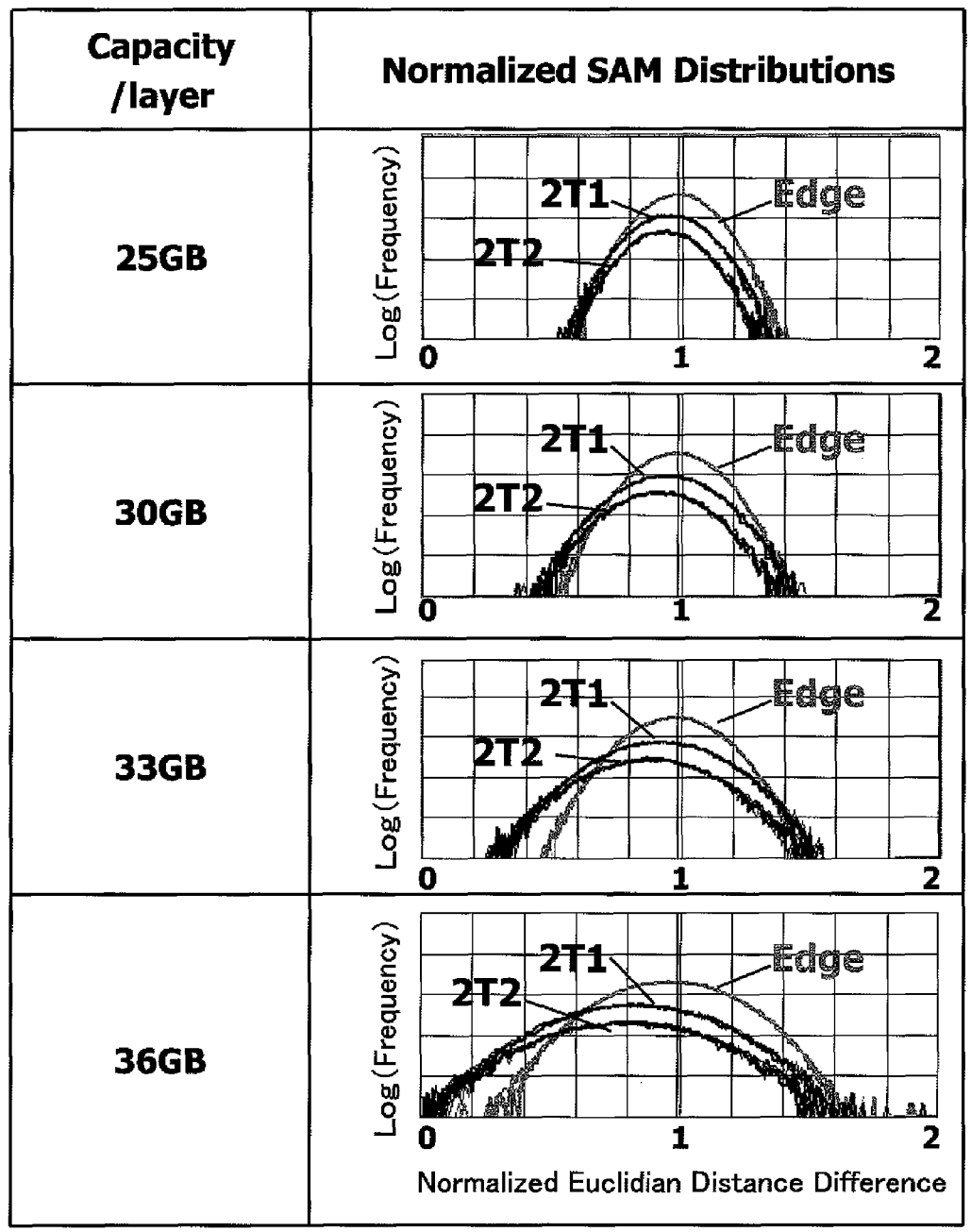
FIG. 5 shows examples of SAM distributions.
Figure 6:
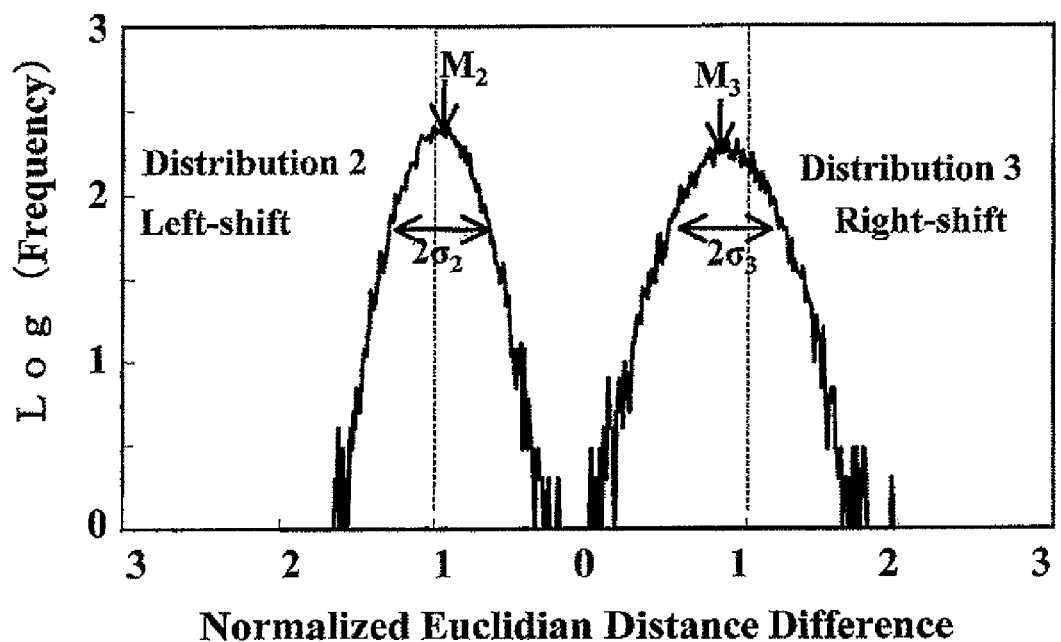
FIG. 6 shows the distributions for obtaining edge shifts Ec' resulting from simulations.
Figure 7:
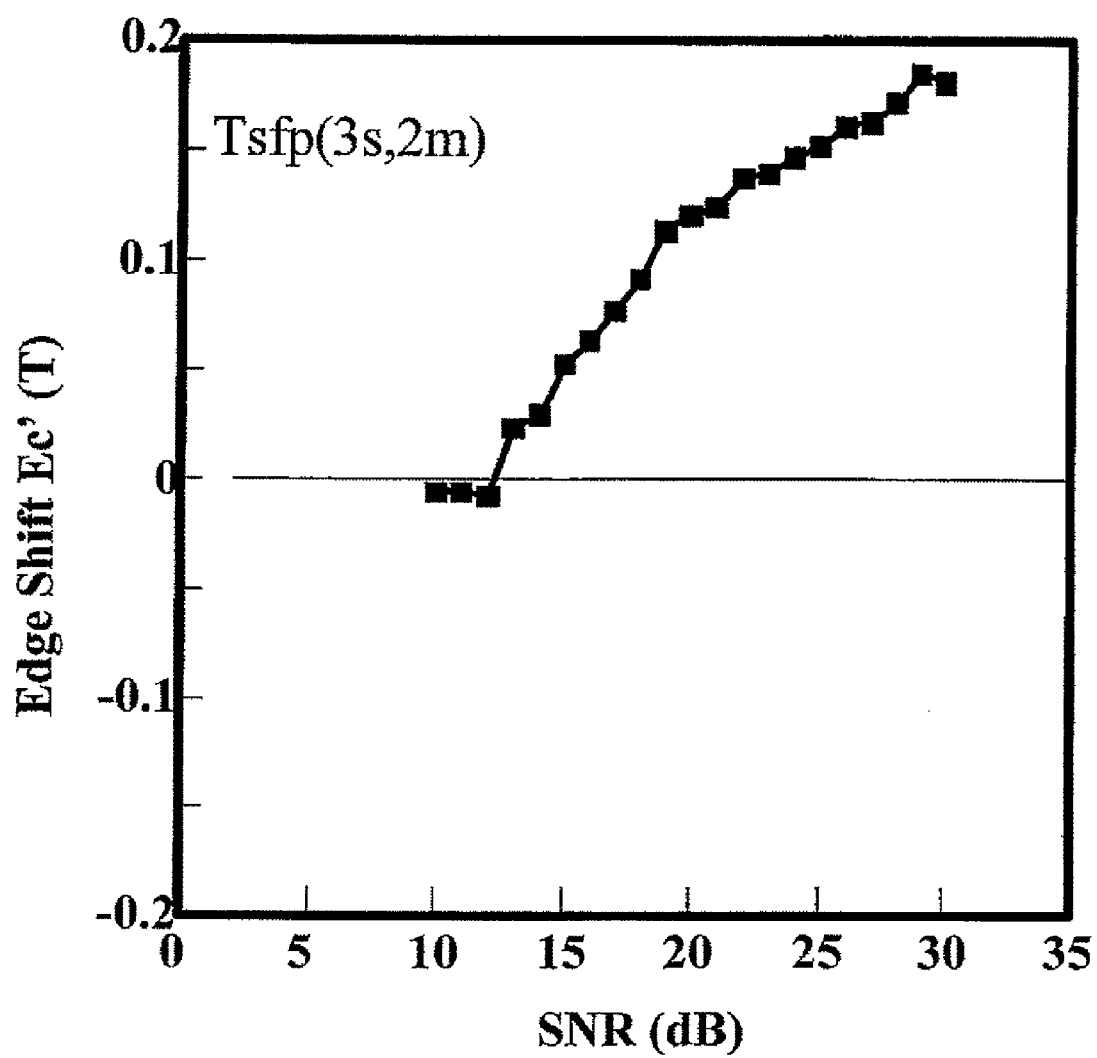
FIG. 7 graphically shows the relationship between SNR and Ec'.

FIG. 1 shows in block diagram the configuration of a circuit for evaluating read-out signals, the circuit being designed for realizing an optical disc device as an embodiment of this invention. In FIG. 1, the read-out signal 51, which has been read out of an optical disc medium and passed through an analog filter not shown in the figure, is converted to a digital signal having 6~8 bits by an A/D converter 21, equalized by an automatic equalizer 22, and binarized by a PRML decoder 23 to output a binary bit array 52. A circuit 30 for evaluating the quality of the read-out signal that calculates L-SEAT, comprises a main bit array detector 31, a left & right shift bit array generator 32, an ED (Euclidean Distance) difference calculator 33, a write control parameter table sorter 34, and a summary data table 35. The main bit array detector 31 stores data corresponding to the preselected main bit arrays and judges whether a preselected main bit array is included in the binary signal 52. When the binary signal 52 includes a preselected main bit array, the left & right shift bit array generator 32 performs the XOR process as described with, for example, FIG. 18 and generates evaluation main bit arrays for L- and R-target signals. The ED (Euclidean Distance) difference calculator 33 calculates the Euclidean distances among the evaluation main bit arrays for the T-, L- and R-target signal and the equalized write signals 53 outputted from the automatic equalizer 22. The write control parameter table sorter 34 statistically processes the calculated Euclidean distances in a way according to the adaptive write pulse table, in accordance with the method (expressions (D1) through (D6)) for evaluating the extended edge shifts at respective time instants or the method (expressions (7) through (13)) for evaluating the average of distributions of independently calculated Euclidean distance differences. The summary data table 35 obtains such tables as shown in, for example, FIG. 39. The CPU 140 refers to the summary data table 35, changes the parameters of the write pulse through controlling a write pulse adjustment circuit not shown in the figure, and adjusts the parameters of the write pulse according to the method shown in FIG. 40.

Figure 43:
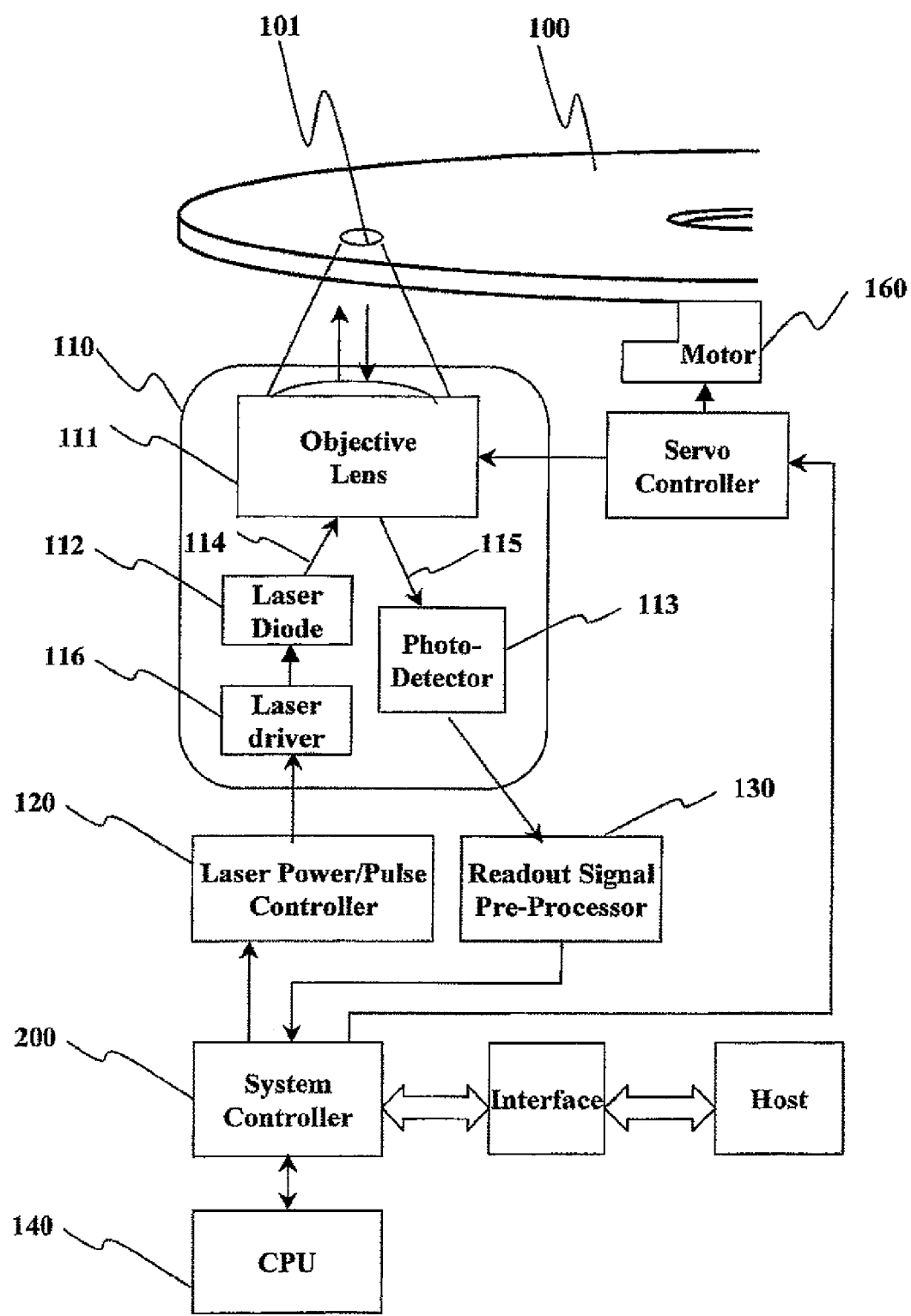
FIG. 43 schematically shows the structure of an optical disc device.

FIG. 43 schematically shows the structure of an optical disc device incorporating the method for evaluating the read-out signals according to this invention. An optical disc medium 100 mounted on the device is rotated by means of a spindle motor 160. At the time of reading, a laser-power/pulse controller 120 controls the current flowing through the semiconductor laser 112 via the laser driver 116 in an optical head 110 so as to generate laser light 114 whose intensity is adjusted to the level instructed by the CPU 140. The laser light 114 is focused by an objective lens 111, to form a light spot 101 on the optical disc medium 100. The light beam reflected from the light spot 101 is passed through the objective lens 111 to be focussed on and detected by, a photodetector 113. The photodetector 113 comprises a plurality of split photo-detecting elements. A read-out signal pre-processor 130 reproduces the information recorded in the optical disc medium 100 on the basis of the signal detected by the optical head 110. The read-out signal pre-processor 130 incorporates therein this invention shown as a circuit block in FIG. 1. With this configuration, the optical disc device according to this invention can work as a device for realizing a BD system having recording density of 30 GB per disc, optimize the write pulse condition through test writing, and secure a good system margin and read compatibility.

A detailed embodiment of the L-SEAT calculating unit used in the optical disc device according to this invention will be described below.

Figure 44:
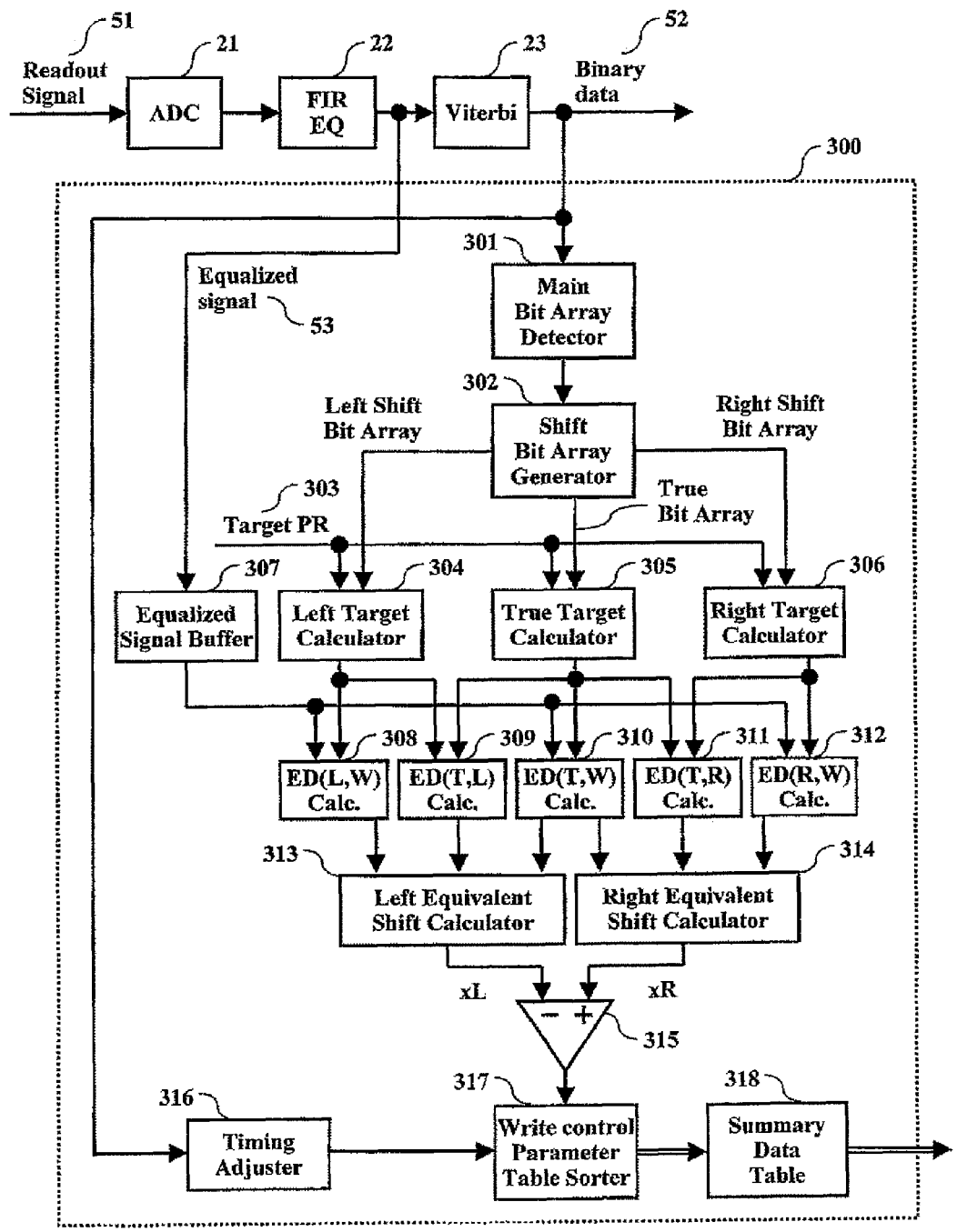
FIG. 44 shows in block diagram the detailed structure of a read-out signal evaluation circuit.

FIG. 44 shows in block diagram an embodiment of the structure of a read-out signal pre-processor for realizing an optical disc device according to this invention.

The read-out signal quality evaluation circuits 300 for calculating L-SEAT comprises a main bit array detector 301; a shift bit array generator 302; a left target calculator 304; a true target calculator 305; a right target calculator 306; an equalized signal buffer 307; Euclidean distance calculators 308, 309, 310, 311 and 312; a left equivalent shift calculator 313; a right equivalent shift calculator 314; a differential amplifier 315; a timing adjuster 316; a write control parameter table sorter 317; and a summary data table 318.

The main bit array detector 301 stores data as the preselected main bit arrays and judges whether the binarized signal 52 includes any of the preselected main bit array. If the binarized signal 52 includes a preselected main bit array, the shift bit array generator 302 performs the XOR process as shown in FIG. 18, to output left and right shift bit arrays. Simultaneously, the generator 302 outputs a true bit array corresponding in bit length to the evaluation bit array included in the binary signal 52. Now, the equalized signal 53 outputted from the automatic equalizer 22 is inputted into the equalized signal buffer 307 so that an equalized signal 53 corresponding in bit length to the main bit array is stored therein. An L-target signal is generated by convolving, in the left target calculator 304, the target PR 303 which the automatic equalizer 22 regarded as the target for equalization and the left shift bit array outputted from the shift bit array generator 302. In like manner, an R-target signal and a T-target signal are generated by the right target calculator 306 and the true target calculator 305, respectively. The Euclidean distance calculator 310 calculates the Euclidean distance between the T-target signal and the equalized (read-out) signal outputted from the equalized signal buffer 307.

Figure 45:
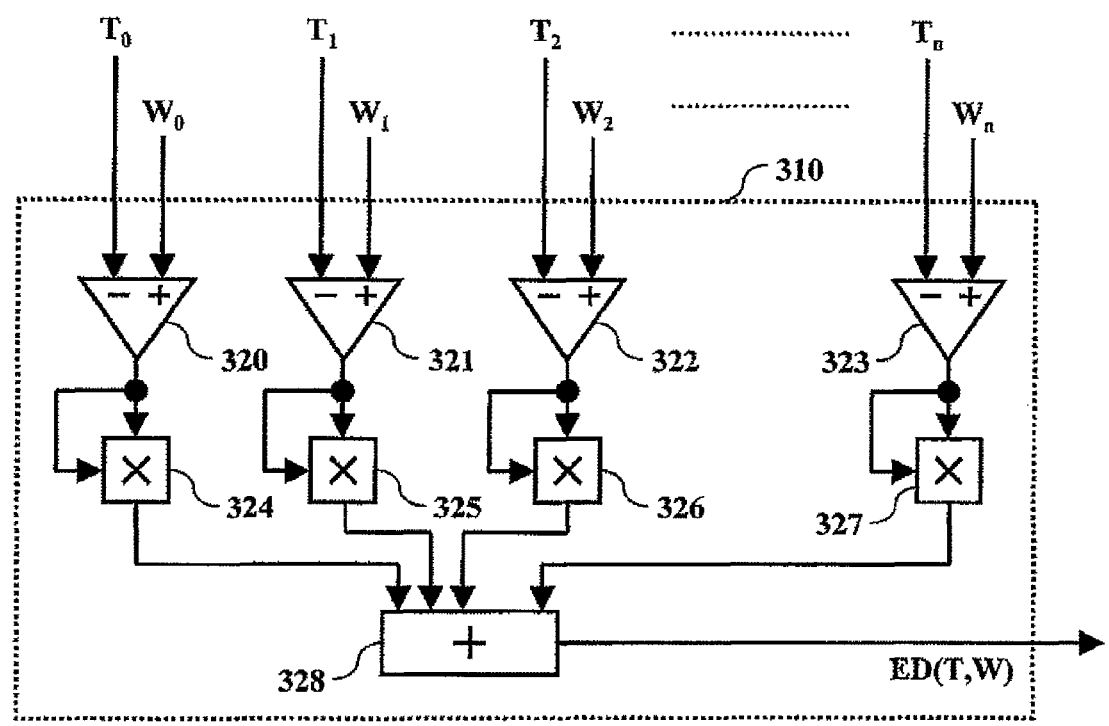
FIG. 45 shows in block diagram the structure of a circuit for calculating Euclidean distances.

FIG. 45 schematically shows the details of the Euclidean distance calculator 310.

The Euclidean distance calculator 310 consists of difference calculators 320, 321, 322 and 323; multipliers 324, 325, 326 and 327; and an adder 328.

Now, let it be assumed that the T-target signal is represented by $(T_0, T_1, T_2, \ldots, T_n)$ and that the equalized signal is represented by $(W_0, W_2, \ldots, W_n)$, where n is the subscript denoting the n-th bit in the main bit array. Then, the difference calculator 320 calculates $(W_0-T_0)$ from $T_0$ and $W_0$, and the multiplier 324 makes the product of $(W_0-T_0)$ and $(W_0-T_0)$, so that $(W_0-T_0)^2$ can be calculated. In like manner, similar calculations are made for $T_1$ and $W_1, \ldots, T_n$ and $W_n$. Finally, the adder 328 calculates the sum of $(W_0-T_0)^2, \ldots, (W_n-T_n)^2$ to output the Euclidean distance ED(T, W).

In like manner, the Euclidean distance calculator 308 calculates the Euclidean distance ED (L, W) between the L-target signal and the equalized signal outputted from the equalized signal buffer 307; the Euclidean distance calculator 312 calculates the Euclidean distance ED (R, W) between the R-target signal and the equalized signal outputted from the equalize signal buffer 307; the Euclidean distance calculator 309 calculates the Euclidean distance ED (T, L) between the T-target signal and the L-target signal; and the Euclidean distance calculator 311 calculates the Euclidean distance ED (T, R) between the T-target signal and the R-target signal. Then, the left equivalent shift calculator 313 calculates the left equivalent edge shift xL from the Euclidean distances ED (L, W), ED (T, L) and ED (T, W).

Figure 46:
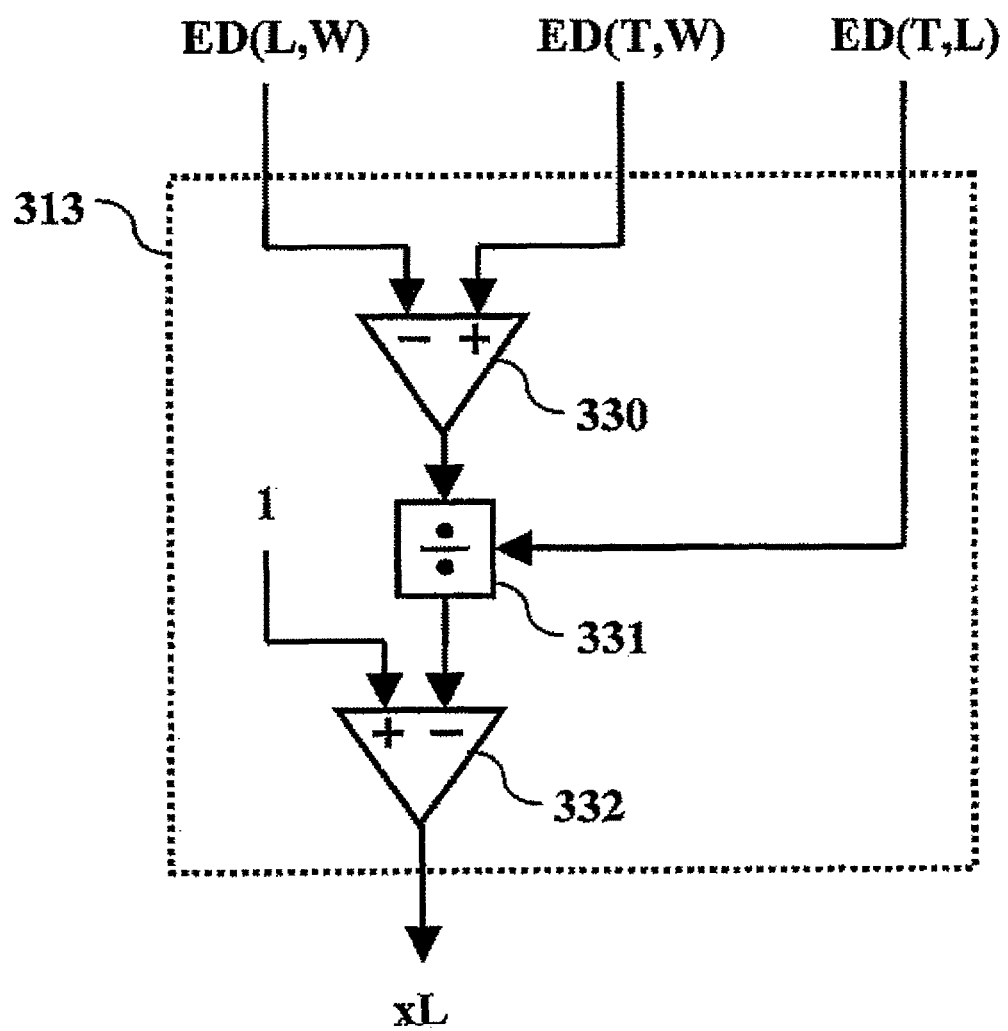
FIG. 46 shows in block diagram the structure of a circuit for calculating equivalent edge shift.

FIG. 46 schematically shows the details of the left equivalent shift calculator 313.

The left equivalent shift calculator 313 consists of a difference calculator 330, a dividing circuit 331 and a differential amplifier 332.

The difference calculator 330 receives the inputs ED (L, W) and ED (T, W) and delivers the output (ED (T, W)−ED (L, W)). The dividing circuit 331 divides the output (ED (T, W)−ED (L, W)) by ED (T, L) and outputs the result of division, i.e. (ED (T, W)−ED (L, W))/ED (T, L). The differential amplifier 332 calculates the difference between the result of division and a constant "1" and halves the calculated difference, so that the left equivalent edge shift xL is obtained.

In like manner, ED (R, W), ED (T, R) and ED (T, W) are inputted into the right equivalent shift calculator 314 so that the right equivalent edge shift xR is calculated. The differential amplifier 315 calculates the difference between xR and xL and further calculates the extended edge shift (D) by halving the difference.

The write control parameter table sorter 317 classifies the extended edge shifts into the patterns corresponding to the write pulses, in accordance with the output of the differential amplifier 315 and the delay-controlled binary signal 52, and calculates the L-SEAT shift defined with the expression (D5) by dividing the accumulated results of addition over a predetermined period of time by the numbers of appearance frequencies of respective patterns. The summary data table 318 obtains such a table as shown in FIG. 39. The CPU refers to this table, controls the write pulse parameter setting circuit (not shown) to change the write pulse parameters, and adjusts the write pulse parameters in accordance with the method shown in FIG. 43.

Figure 47:
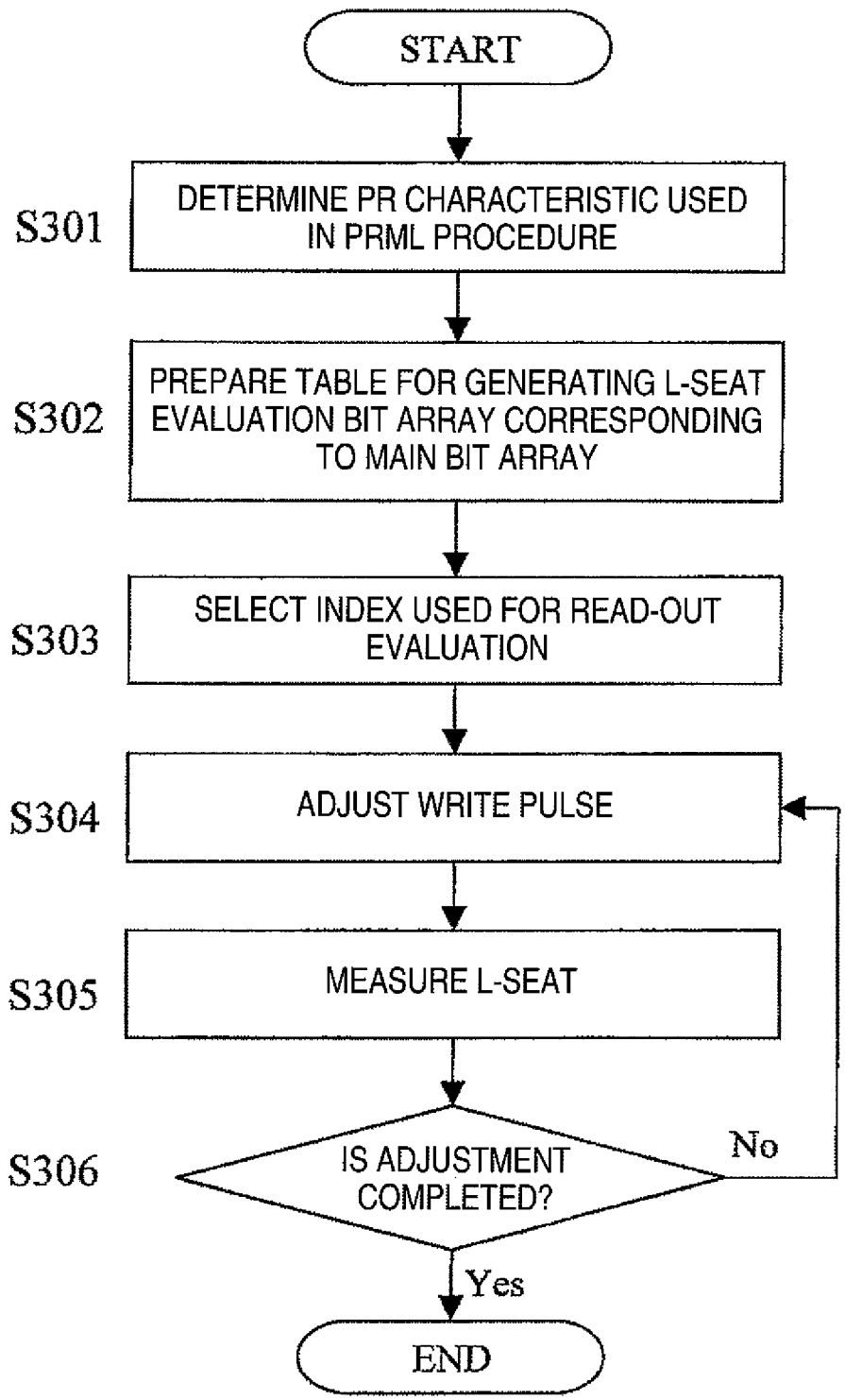
FIG. 47 is the flow chart illustrating a method for measuring L-SEAT according to this invention.

The procedure of adjusting write pulses by adjusting the L-SEAT with the circuit shown in this embodiment will be described below. FIG. 47 is the flow chart illustrating the process flow necessary for the measurement of L-SEAT.

To begin with, the PR characteristic used in the automatic equalizer 22 and the PRML decoder 23 in FIG. 44 is determined (S 301). It is often the case that such a PR characteristic is set to PR (1, 2, 2, 2, 1) in data reproduction from high-density recording medium such as BDs having a recording capacity of 30 GB or greater. Then, the table for generating the evaluation bit arrays corresponding to the main bit arrays shown in FIG. 18 is prepared, and the prepared table is then inputted into the shift bit array generator 302 through, for example, the setting of register (S302). This setting of table need not be necessarily performed by user, and if a new table is not necessarily, the previously set table may be used successively. Alternatively, a plurality of such tables are internally stored and the user may exchange the tables through register setting. Thereafter, the desired evaluation index is selected from among plural indices for read-out evaluation such as L-SEAT shift, L-SEAT jitter, etc. through, for example, resistor setting (S303). If the index to be used is previously selected, the selection by the user is unnecessary and the previously selected index has only to be used. After this initial setting, the adjustment of write pulses is performed (S304). If the result of measuring the read-out evaluation index such as one of the L-SEAT (S305) satisfies the preset standard, the adjustment is considered to be completed. However, if the result does not satisfy the preset standard, the process of adjusting the write pulse (S304) is performed again (S306). The details of the operations included in step S304 through step S306 are shown in the flow charts of FIGS. 39 and 40 illustrating the entire flow of the adjustment of write pulse.

The circuit configuration and the procedure described above enables the calculation of the evaluation indices defined with the expressions (D1) through (D6) and therefore can provide a BD system having recording capacity of 30 GB or higher, which adjusts the recording pulse condition through test writing and secures a good system margin and read-out compatibility.

Figure 54:
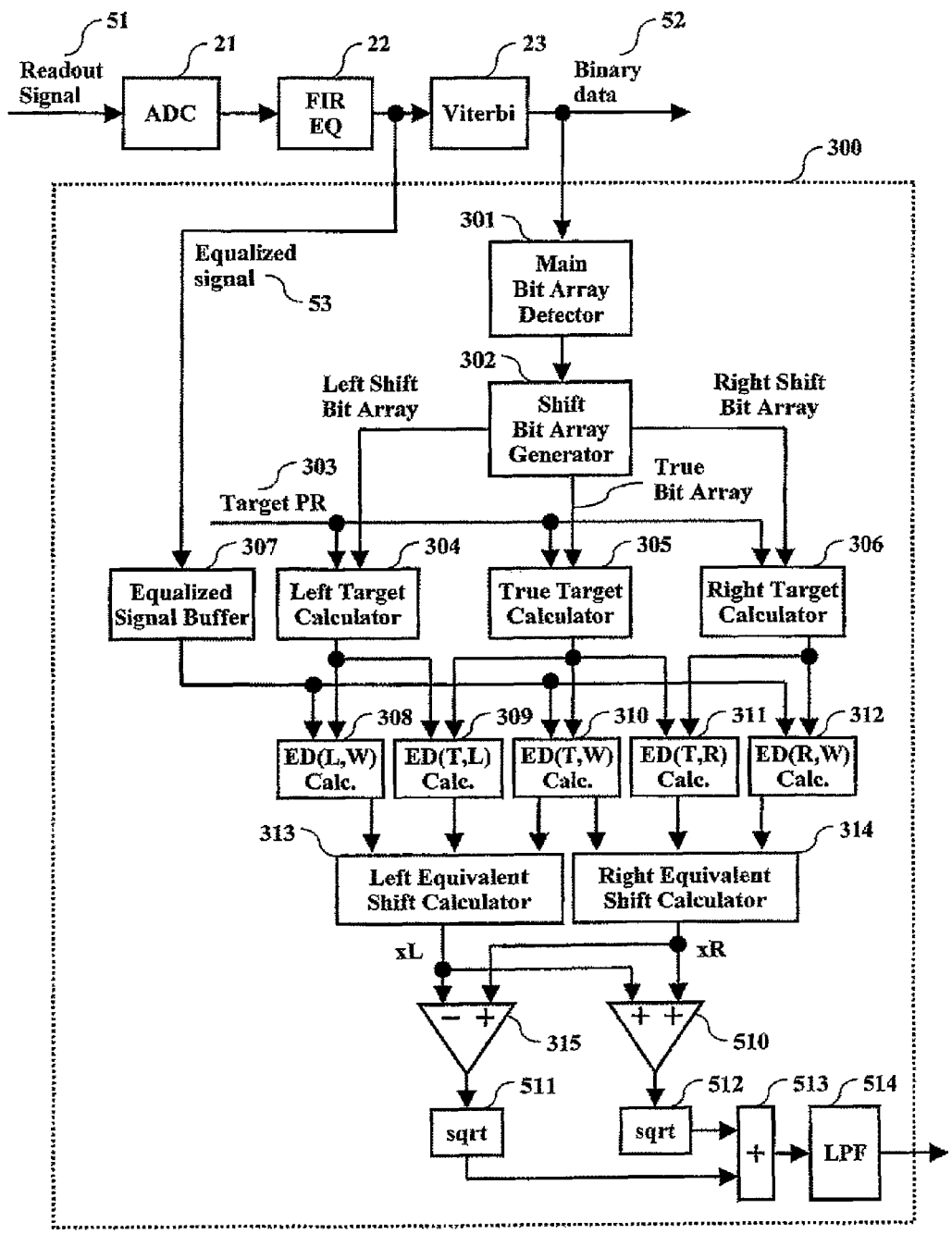
FIG. 54 shows in block diagram the detailed structure of still another read-out signal evaluation circuit.

In this embodiment, the circuit configuration was explained as used to calculate the extended edge shift D as one of the L-SEAT and adjust the write pulse parameters. The application of the same circuit to the calculation of L-SEAT jitter will be described below. FIG. 54 shows in block diagram a circuit for calculating L-SEAT jitter. New components appearing in this circuit in contrast to that shown in FIG. 44 are an adding amplifier 510, squaring circuits 511 and 512, an adder 513, and a LPF (low-pass filter) 514.

The differential amplifier 315 calculates the difference between xR and xL and devides the difference by 2, so as to produce the extended edge shift (D=(xR−xL)/2). On the other hand, the adding amplifier 510 calculates the sum of xL and xR and halves the sum, to produce SNR factor (S=(xR+xL)/2) that is one of the L-SEAT. The extended edge shift D is squared by the squaring circuit 511 and the SNR factor S is squared by the squaring circuit 512. The adder 513 calculates the sum of the outputs of the squaring circuits 511 and 512. The LPF 514 delivers the value obtained by averaging based on a preset time constant.

With the circuit described above, it is also possible to calculate L-SEAT jitter a defined with the expression (D6) by calculating the square root of the output of the LPF 514 by a circuit or software.

Another embodiments of the L-SEAT calculator for use in the optical disc device according to this invention will be described below.

Of the L-SEAT, the left (L) and right (R) equivalent edges shifts xL and xR are defined with the expressions (D1) and (D2) as described above. These expressions are transformed so as to be easily implemented by circuits. First, since W, T, L and R also denote the signal levels at plural time instants t ($t=t_0+1, t_0+2, t_0+3, t_0+4, t_0+5$), these levels are interpreted as coordinate points in the multi-dimensional space. For simplicity's sake, the right shift error having Hamming distance of 1 is taken as an example. Then, in case of PR (1, 2, 2, 2, 1) characteristic, T, W and R can be represented as T ($T_1, T_2, T_3, T_4, T_5$), W ($T_1+\delta_1, T_2+\delta_2, T_3+\delta_3, T_4+\delta_4, T_5+\delta_5$ and R ($T_1+1, T_2+2, T_3+2, T_4+2, T_5+1$), respectively. Further, the five-dimensional coordinate system is introduced in which the origin is represented as T, and let the position vectors W and R be newly represented by W' and R', respectively. Then, they are represented as W' ($\delta_1, \delta_2, \delta_3, \delta_4, \delta_5$) and R' (1, 2, 2, 2, 1). Let the vector W' be called an "equalized error vector", and the vector R' and the vector L' for the left shift error which is the vector pointing from T to L, be both called "error vectors". If the expression (D1) is transformed by using these vector compoments, the result is given by the following expression (14), where R'•W' means the inner product of the error vector R' and the equalized error vector W'.

$$ED(R, W) - ED(T, W) = ED(R', W') - ED(0, W')$$

$$= \{(1-\delta_1)^2 + (2-\delta_2)^2 + (2-\delta_3)^2 + (2-\delta_4)^2 + (1-\delta_5)^2\} \cdot (\delta_1^2 + \delta_2^2 + \delta_3^2 + \delta_4^2 + \delta_5^2)$$

$$= (1^2 + 2^2 + 2^2 + 2^2 + 1^2) -$$

$$2(\delta_1 + 2\delta_2 + 2\delta_3 + 2\delta_4 + \delta_5)$$

$$= ED(T, R) - 2R' \cdot W'$$

Now, if the above expression (14) is substituted into the expression (D2), the right equivalen edge shift xR can be expressed by the inner product of R' and W' and the Euclidean distance between T and R, alone, as given by the following expression (15). It can be easily analogized that this holds not only for the right shift error having Hamming distance of 1 but also for any general type of edge shift error. Thus, the expression (D1) can be likewise transformed, and the left equivalent edge shift xL can be given by the following expression (16).

$$xR = \frac{1}{2}\left(1 - \frac{ED(R, W) - ED(T, W)}{ED(T, R)}\right) \quad (15)$$

$$= \frac{1}{2}\left(\frac{ED(T, R) - (ED(T, R) - 2R(W'))}{ED(T, R)}\right)$$

$$= \frac{R' \cdot W'}{ED(T, R)}$$

$$xL = \frac{L' \cdot W'}{ED(T, L)} \quad (16)$$

The comparison of the expressions (15) and (16) with the expressions (D1) and (D2) reveals the possibility of reducing the number of successive calculations. This is because according to the expression (D1), the Euclidean distance calculation, that is, the addition of the squares of the differences of corresponding vector components, must be performed twice, i.e. between R and W and between T and W, but because according to the expression (15), the inner product calculation, that is, the addition of the products of corresponding vector components, has only to be once performed.

The circuit structure for implementing the expressions (15) and (16) will be described below in reference to FIG. 48. The read-out signal quality evaluation circuits 400 comprises a main bit array detector 301; a shift bit array generator 302; a left target calculator 304; a true target calculator 305; a right target calculator 306; an equalized signal buffer 307; error vector and Euclidean distance calculators 401 and 403; an error vector calculator 402; a left equivalent shift calculator 404; a right equivalent shift calculator 405; a differential amplifier 315; a timing adjuster 316; a write control parameter table sorter 317; and a summary data table 318.

The description of circuit operation up to the outputs of the left target calculator 304, the true target calculator 305, the right target calculator 306 and the equalized signal buffer 307, is the same as that for the embodiment shown in FIG. 44. Only the part of the circuit downstream of the outputs will therefore be described below.

The error vector and Euclidean distance calculator 401 receives the L-target signal as the output of the left target calculator 304 and the T-target signal as the output of the true target calculator 305, and delivers the error vector (T, L) and the Euclidean distance ED (T, L).

Figure 49:
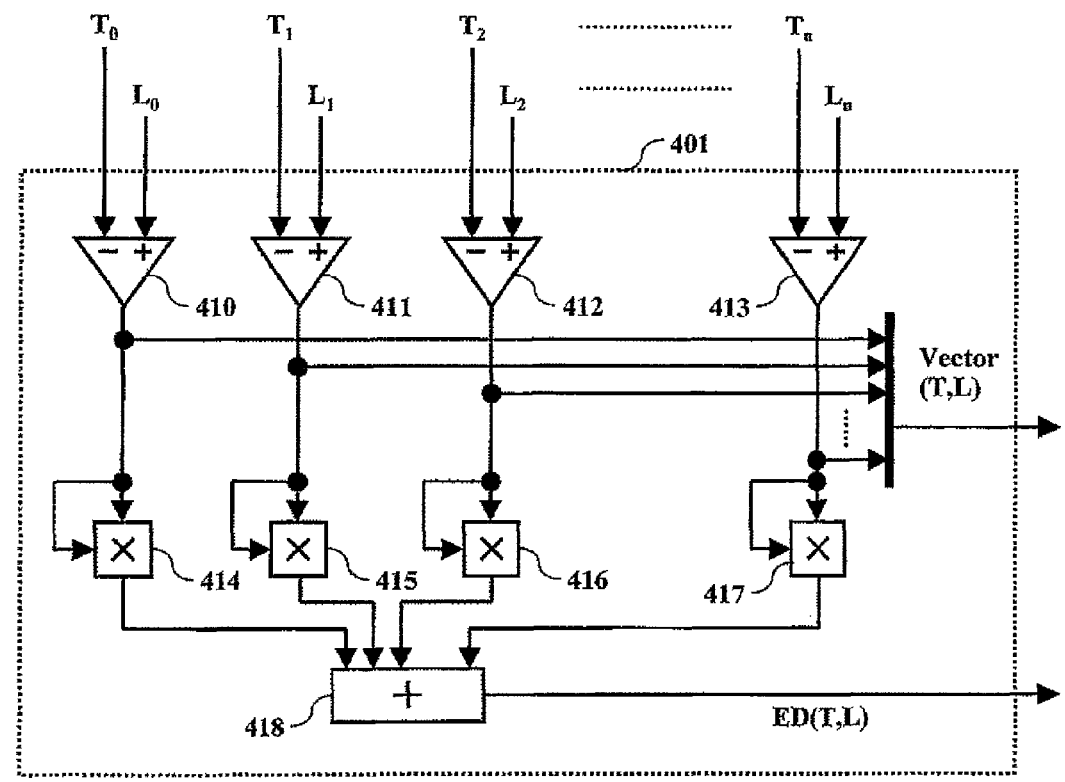
FIG. 49 shows in block diagram the structure of a circuit for calculating error vector and Euclidean distance.

FIG. 49 shows in block diagram the detail of the error vector and Euclidean distance calculator 401. The error vector and Euclidean distance calculator 401 comprises difference calculators 410, 411, 412 and 413; multipliers 414, 415, 416 and 417; and an adder 418. Now, let the T-target signal and the L-target signal be represented by $(T_0, T_1, T_2, \ldots, T_n)$ and $(L_0, L_1, L_2, \ldots, L_a)$, respectively, where n is the subscript denoting the n-th bit of the main bit array. Then, the difference calculator 410 calculates $(L_0-T_0)$ from $T_0$ and $L_0$, and the multiplier 414 multiplies $(L_0-T_0)$ by $(L_0-T_0)$ to produce $(L_0-T_0)^2$. The same calculation is applied to $L_1$ and $T_1, \ldots, L_n$ and $T_n$, and the adder 418 calculates the sum of $(L_0-T_0)^2$, $(L_1-T_1)^2, \ldots, (L_n-T_n)^2$ to output the Euclidean distance ED (T, L). And the outputs of the difference calculators 410, 411, 412 and 413 are collected to form the error vector (T, L).

In like manner, the error vector and Euclidean distance calculator 403 receives the R-target signal as the output of the right target calculator 306 and the T-target signal as the output of the true target calculator 305, and delivers the error vector (T, R) and the Euclidean distance ED (T, R). Further, the error vector calculator 402 receives the T-target signal as the output of the true target calculator 305 and the equalized signal W as the output of the equalized signal buffer 307, and delivers only the equalized error vector (T, W).

The left equivalent shift calculator 404 calculates the left equivalent edge shift xL from the equalized error vector (T, W), the error vector (T, L) and the Euclidian distance ED (T, L).

Figure 50:
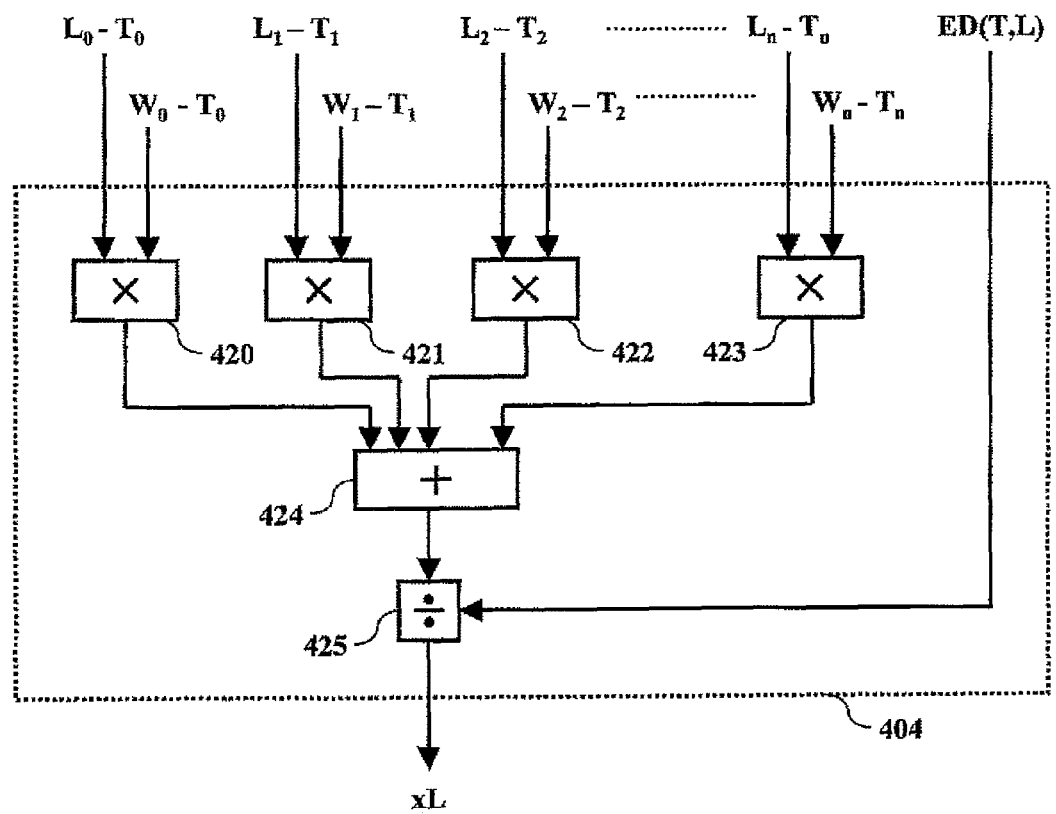
FIG. 50 shows in block diagram the structure of another circuit for calculating equivalent edge shifts.

FIG. 50 shows in block diagram the detail of the left equivalent shift calculator 404.

The left equivalent shift calculator 404 comprises multipliers 420, 421, 422 and 423; an adder 424; and a dividing circuit 425.

Now, let the error vector (T, L) and the equalized error vector (T, W) be represented in terms of vector components by $(L_0-T_0), (L_1-T_1), \ldots (L_n-T_n)$ and $(W_0-T_0), (W_1-T_1), \ldots, (W_n-T_n)$, respectively, where n is the subscript denoting the n-th bit of the main bit array. Then, the multiplier 420 multiplies $(L_0-T_0)$ by $(W_0-T_0)$ to produce $(L_0-T_0)(W_0-T_0)$. The same calculation is applied to $(L_0-T_1)$ and $(W_1-T_1), \ldots$, and $(L_n-T_n)$ and $(W_n-T_n)$ to produce the products $(L_1-T_1), \ldots, (L_n-T_n)(W_n-T_n)$. The adder 424 calculates the sum of the products to output the inner product of the error vector (T, L) and the equalized error vector (T, W), i.e. L'W'= $(L_1-T_1)(W_1-T_1)+ \ldots +(L_n+T_n)(W_n-T_n)$. The dividing circuit 425 divides the inner product by the Euclidean distance ED (T, L) to output the left equivalent edge shift xL (=L'W'/ED (T, L)).

In like manner, the right equivalent shift calculator 405 receives the equalized error vector (T, W), the error vector (T, R) and the Euclidean distance ED (T, R) to output the right equivalent edge shift xR. The differential amplifier 315 calculates the difference between xL and xR and halves the difference, to produce the extended edge shift (D).

The write control parameter table sorter 317 classifies the extended edge shifts into patterns corresponding to the write pulses, in accordance with the output of the differential amplifier 315 and the delay-controlled binary signal 52, and calculates the L-SEAT shift defined with the expression (D5) by dividing the accumulated results of addition over a predetermined period of time by the number of appearance frequencies of respective patterns. The summary data table 318 obtains such a table as shown in FIG. 39. The CPU refers to this table, controls the write pulse parameter setting circuit (not shown) to change the write pulse parameters, and adjusts the write pulse parameters in accordance with the method shown in FIG. 43.

The procedure for adjusting write pulses by using L-SEAT according to this embodiment can be performed in the same manner as according to the flow chart shown in FIG. 47.

The circuit configuration and the procedure described above enables the calculation of the evaluation indices defined with the expressions (D1) through (D6) and therefore can provide a BD system having recording capacity of 30 GB or higher, which adjusts the recording pulse condition through test writing and secures a good system margin and read-out compatibility. Moreover, the expressions (15) and (16) are used in calculation instead of the expressions (D1) and (D2) and therefore the scale of circuitry used in this invention comes to be reduced.

The circuit configuration of this embodiment was used to calculate the extended edge shift D in L-SEAT and to adjust the write pulse parameters. The calculation of the L-SEAT jitter can also be performed just as described for the circuit shown in FIG. 54.

Now, another embodiment of the L-SEAT calculator used in the optical disc device according to this invention will be described below.

Figure 48:
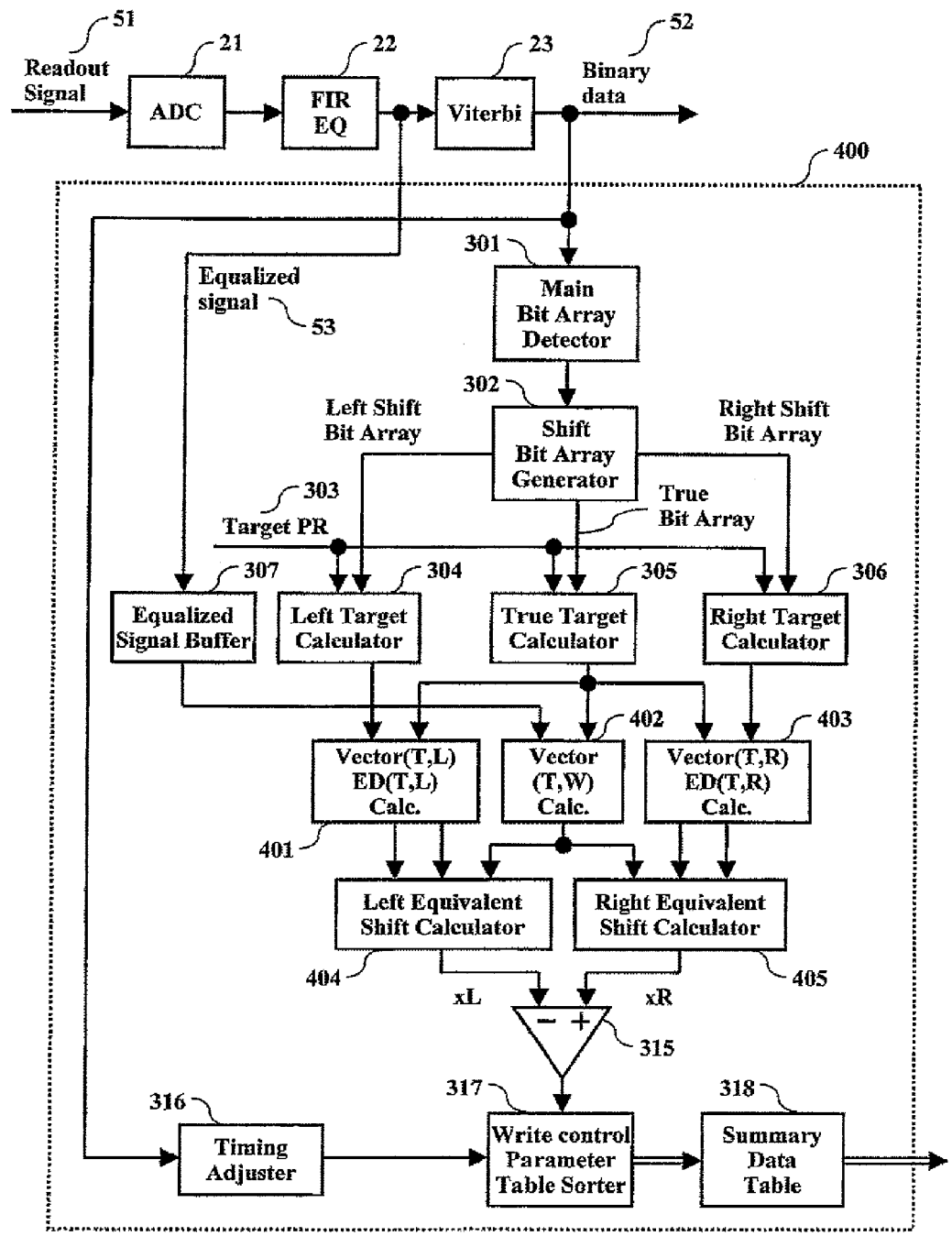
FIG. 48 shows in block diagram the detailed structure of another read-out signal evaluation circuit.

In the embodiment shown in FIG. 48, when such a fixed PR characteristic as PR (1, 2, 2, 2, 1) is used, the error vectors (T, R) and (T, L) remain invariable in time and therefore the intended purpose can be achieved by previously calculating the error vectors corresponding to the main bit arrays and selecting them. In addition, since the Euclidean distances ED (T, R) and ED (T, L) remain invariable in time, the same thing can be expected. As a result, the scale of the circuitry can be reduced to a great extent.

The circuit configuration based on this idea will be described below in reference to FIG. 51.

The read-out signal quality evaluation circuit 500 for calculating L-SEAT comprises a main bit array detector 301; an error vector selector 501; an Euclidean distance selector 502; a target calculator 504; a difference calculator 505; an equalized error buffer 506; a left equivalent shift calculator 404; a right equivalent shift calculator 405; a differential amplifier 315; a timing adjuster 316; a write control parameter table sorter 317; and a summary data table 318. The following description is made under the assumption that PR (1, 2, 2, 2, 1) characteristic is used.

The main bit array detector 301 stores data as the preselected main bit arrays and judges whether the binary signal 52 includes any of the preselected main bit array. If the binary signal 52 includes any main bit array, the main bit array detector 301 delivers the information on which main bit array is included in the binary signal, to both the error vector selector 501 and the Euclidean distance selector 502. The error vector selector 501 outputs the error vectors (T, L) and (T, R) corresponding to the included main bit array according to the table shown in FIG. 52. The Euclidean distance selector 502 selects and outputs, the Euclidean distances ED (T, L) and ED (T, R) corresponding to the included main bit array according to the table shown in FIG. 52.

The target calculator 504 generates the target signal by convolving the binary signal 52 and the target PR characteristic 503 which the automatic equalizer 22 created as an equalized target. The difference calculator 505 calculates the equalized error that is the difference between the target signal and the equalized read-out signal 53 outputted from the automatic equalizer 22. The equalized error buffer 506 stores such an equalized error during the time to cover a main bit array and generates an equalized error bit array. This equalized error bit array is called "equalized error vector (T, W)". The left equivalent shift calculator 404 calculates the left equivalent edge shift xL on the basis of the equalized error vector (T, W), the error vector (T, L) and the Euclidean distance ED (T, L).

The operation of the left equivalent shift calculator 404 is the same as that of the left equivalent shift calculator 404 shown in FIG. 48. In this embodiment, however, since the Euclidean distance ED (T, L) is previously known, the division by the dividing circuit 425 (see FIG. 50) included in the left equivalent shift calculator 404 can be replaced by the multiplication by previously calculating the reciprocal of the Euclidean distance ED (T, L) and outputting the reciprocal from the Euclidean distance selector 502. Thus, the scale of the used circuit can be reduced. Further, if the PR characteristic is limited to PR (1, 2, 2, 2, 1), the error vector is composed only of "1" and "2" as seen in FIG. 52, and therefore the multiplication performed by the multipliers 420, 421, 422 and 423 can be achieved solely by bit shift and sign inversion. As a result, the farther reduction of circuit scale will be possible.

In like manner, the right equivalent shift calculator 405 receives the equalized error vector (T, W), the error vector (T, R) and the Euclidean distance ED (T, R) and outputs the right equivalent edge shift xR.

The ensuing operations are the same as described with the circuit shown in FIG. 48.

Figure 53:
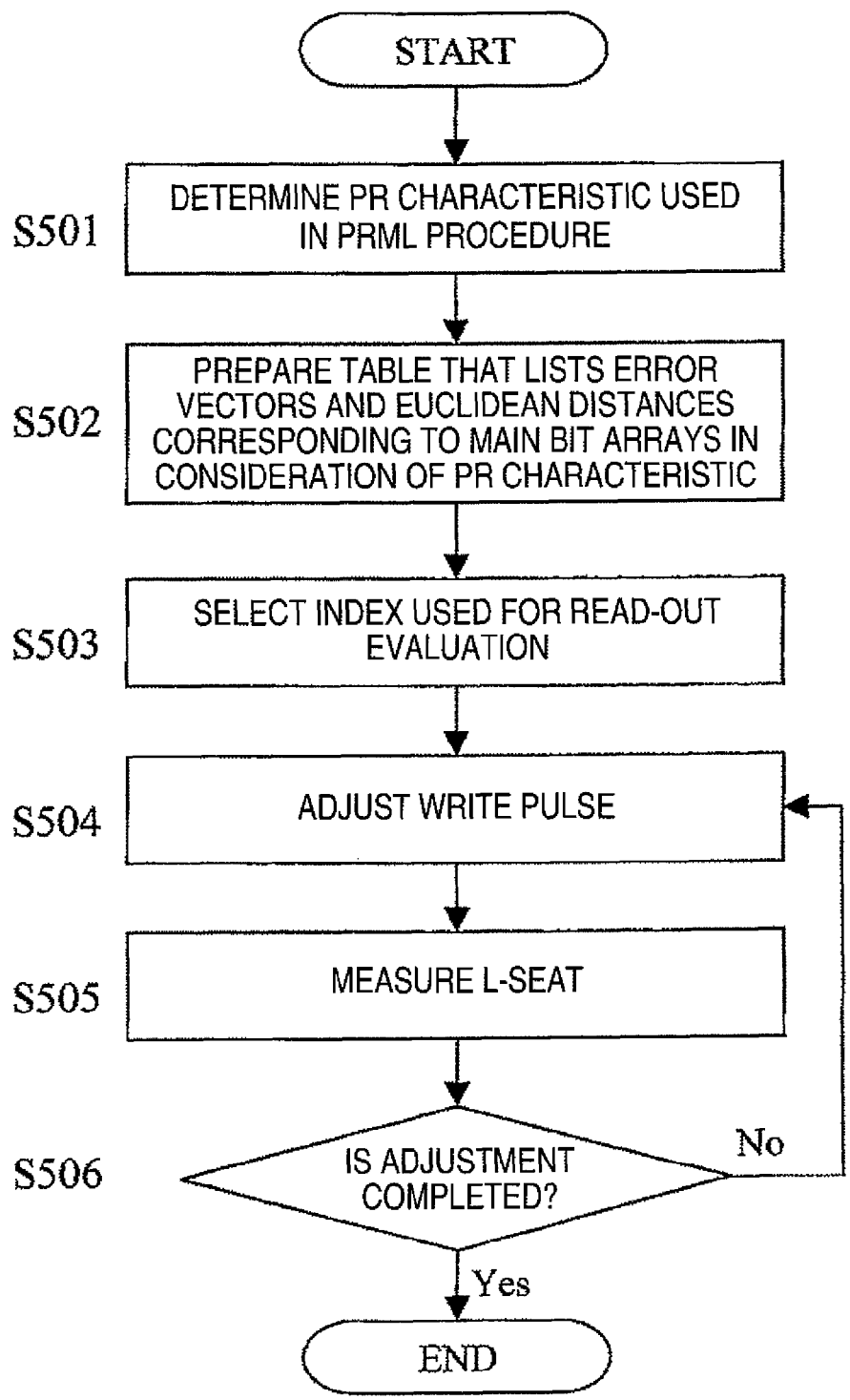
FIG. 53 is the flow chart illustrating another method for measuring L-SEAT according to this invention.

In the following, description will be made of the procedure for adjusting write pulses according to L-SEAT by using the circuit described in this embodiment. FIG. 53 is the flow chart illustrating the steps of procedure necessary for the measurement of L-SEAT.

Figure 51:
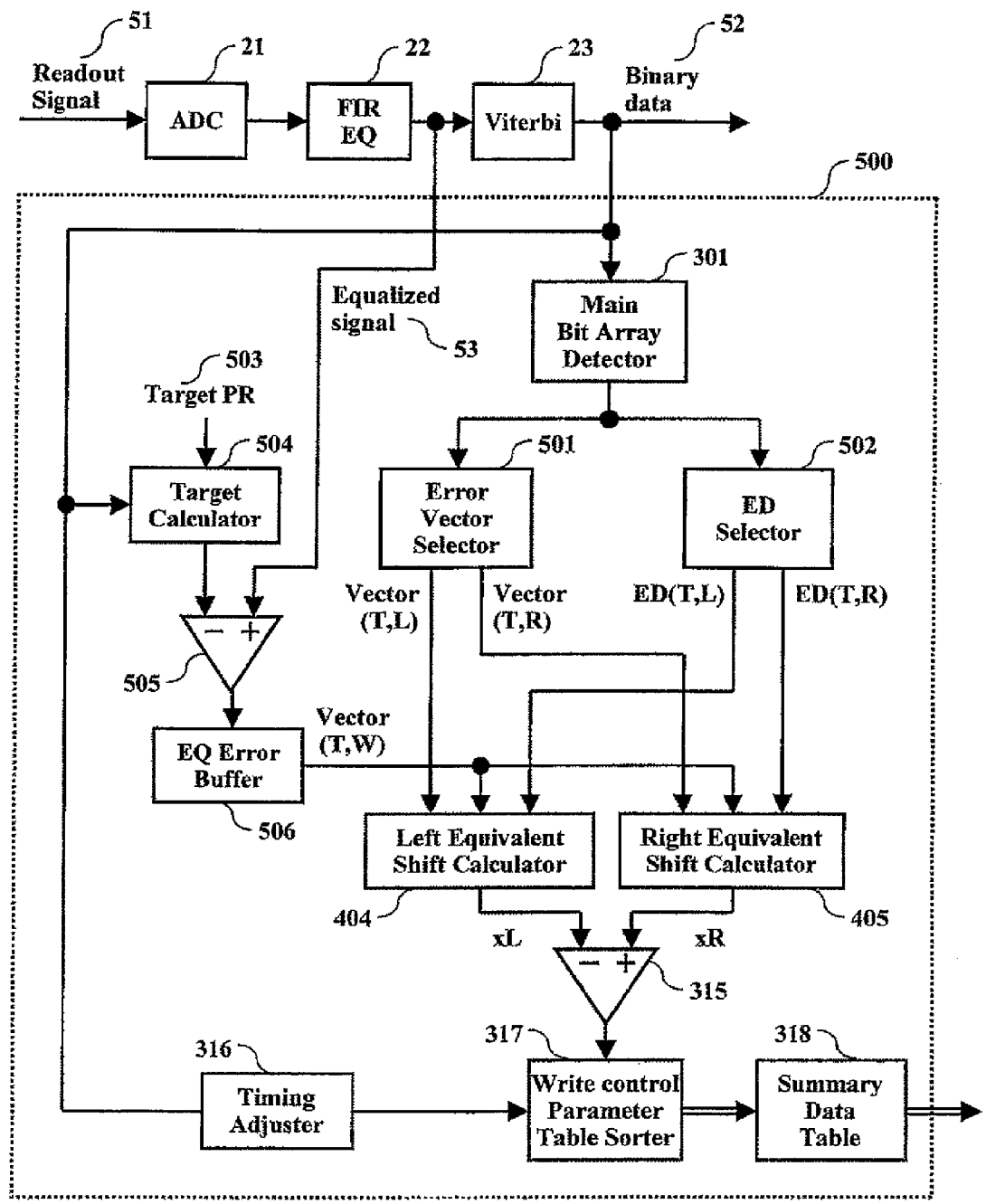
FIG. 51 shows in block diagram the detailed structure of yet another read-out signal evaluation circuit.

First, the PR characteristic use in the automatic equalizer 22 and the PRML decoder 23 in FIG. 51 is determined (S501). It is often the case that such a PR characteristic is set to PR (1, 2, 2, 2, 1) in reproduction from a high-density recording medium such as BD having a recording capacity of 30 GB or greater.

Then, the table is prepared that lists the error vectors and the Euclidean distances corresponding to the main bit arrays shown in FIG. 52, and the prepared table is then inputted into the shift bit array generator 302 through, for example, the setting of register (S502). The error vectors and the Euclidean distances should be calculated by using the PR characteristic determined in the step S501. This setting of table need not be necessarily performed by user, and if a new table is not necessary, the previously set table may be used successively. Alternatively, a plurality of such tables are internally stored and the user may exchange the tables through register setting. Thereafter, the desired index for evaluation is selected from among plural indices for read-out signal evaluation such as L-SEAT shift, L-SEAT jitter, etc. through, for example, resistor setting (S503). If the index to be used is previously selected, the selection by the user is unnecessary and the previously selected index has only to be used. After this initial setting, the adjustment of write pulses is performed (S504). If the result of measuring the read-out evaluation index such as one of the L-SEAT (S505) satisfies the preset standard, the adjustment is considered to be completed. However, if the result does not satisfy the preset standard, the process of adjusting the write pulse (S504) is performed again (S506). The details of the operations included in step S504 through step S506 are shown in the flow charts of FIGS. 39 and 40 illustrating the entire flow of the adjustment of write pulse.

The circuit configuration and the procedure described above enables the calculation of the evaluation indices defined with the expressions (D1) through (D6) and therefore can provide a BD system having recording capacity of 30 GB or higher, which adjusts the recording pulse condition through test writing and secures a good system margin and read-out compatibility. It is also possible to reduce the scale of this circuit to a great extent in comparison with the circuit configurations shown in FIGS. 48 and 51.

The circuit configuration of this embodiment is exemplified as being used for the calculation of the extended edge shift in L-SEAT and for the adjustment of the write pulse parameters. The application of this circuit configuration to the calculation of the L-SEAT jitter will be described below.

Figure 55:
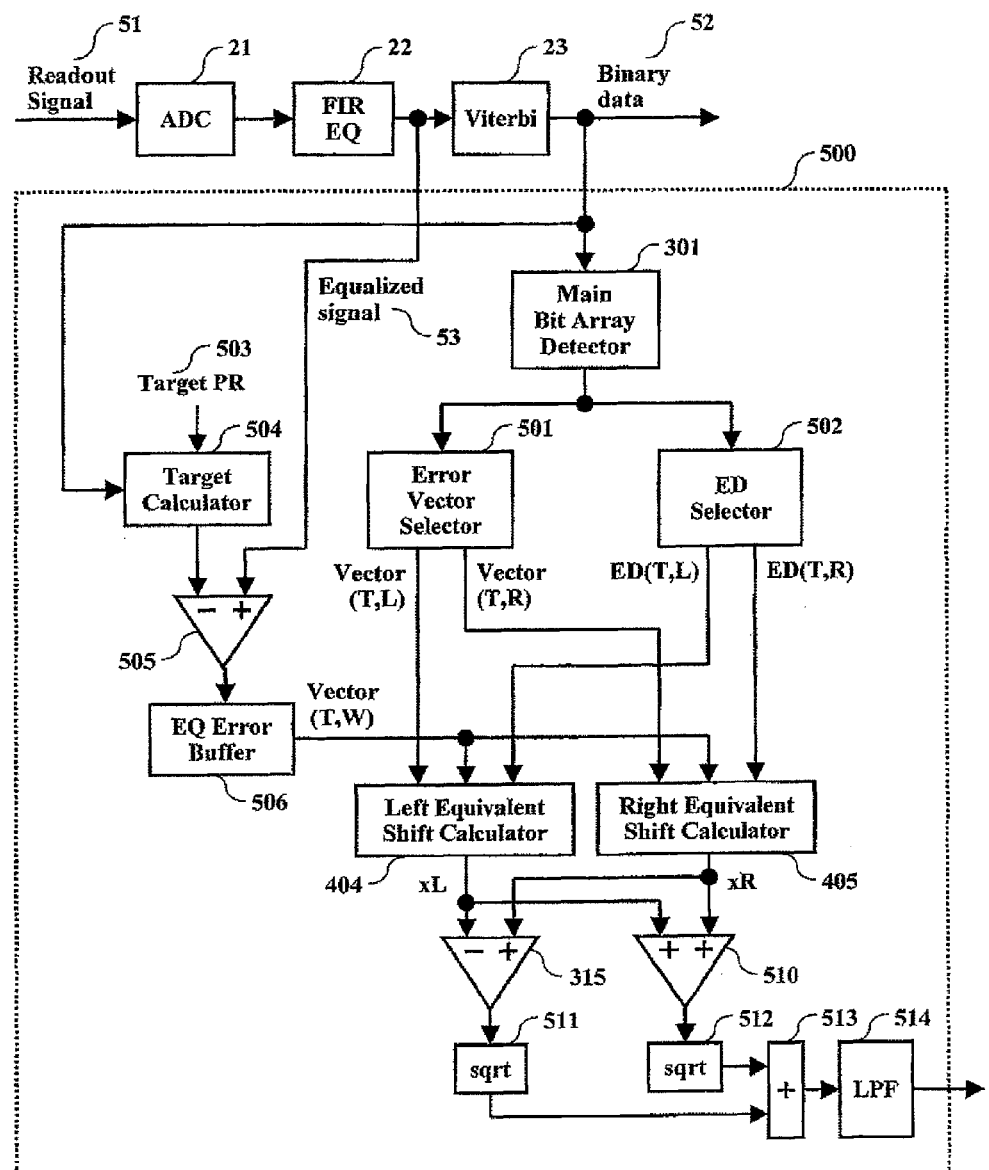
FIG. 55 shows in block diagram the detailed structure of an additional read-out signal evaluation circuit.

FIG. 55 shows in block diagram the circuit configuration for calculating the L-SEAT jitter. The difference of this configuration from that shown in FIG. 51 is the provision of a summing amplifier 510, squaring circuits 511 and 512, an adder 513, and a LPF (low pass filter) 514.

Whereas the differential amplifier 315 calculates the difference between xL and xR and then halves the difference, to produce the extended edge shift, the summing amplifier 510 calculates the sum of xL and xR and then halves the sum, to produce the SNR factor in L-SEAT. The extended edge shift is squared by the squaring circuit 511, and the SNR factor is squared by the squaring circuit 512. The adder 513 adds up the output of the squaring circuits 511 and the output of the squaring circuits 512. The LPF 514 receives the output of the adder 513 and delivers the value that is the average struck depending on the preselected time constant.

With the circuit described above, it is also possible to calculate L-SEAT jitter σ defined with the expression (D6) by calculating the square root of the output of the LPF 514 by a circuit or software.

Although this embodiment has been described using the PR (1, 2, 2, 2, 1) characteristic, the use of the PR (1, 2, 2, 2, 1) characteristic is not mandatory in this invention. This invention can be applied equally to other cases where different PR characteristics are used.

Further, in the embodiments shown in FIGS. 44, 48, 51, 54 and 55, it is also possible to replace the operations of the circuit components downstream of the ADC 21 with the execution of software.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An optical disc device having a function of recording data into an optical disc medium by using codes whose shortest run length is 2T and a function of reproducing the recorded data in accordance with an adaptive equalizing procedure and a Partial Response Maximum Likelihood (PRML) procedure, comprising a circuit configured to generate a first binary bit array by binarizing a signal reproduced from the optical disc medium in accordance with the PRML procedure;

a circuit configured to generate a second binary bit array and a third binary bit array whose shortest run length is equal to or greater than 2T, and which are obtained by shifting an interested edge of the first binary bit array to the left and right, respectively;

circuits configured to generate first, second and third target signals corresponding to the first, second and third binary bit arrays, respectively;

a circuit configured to calculate a first evaluation value by normalizing a first Euclidean distance difference which is a difference between the Euclidean distance between the second target signal and the reproduced signal and the Euclidean distance between the first target signal and the reproduced signal, by the Euclidean distance between the first and the second target signals;

a circuit configured to calculate a second evaluation value by normalizing a second Euclidean distance difference which is a difference between the Euclidean distance between the third target signal and the reproduced signal and the Euclidean distance between the first target signal and the reproduced signal, by the Euclidean distance between the first and the third target signals; and a circuit configured to adjust a condition for recording data into the optical disc medium by using at least a value of difference between the first and the second evaluation values;

wherein the second and the third bit array are generated by applying an exclusive OR (XOR) mask bit array to the first binary bit array so that a first Hamming distance between the first binary bit array and the second bit array is equal to a second Hamming distance between the first binary bit array and the third bit array, the first and second Hamming distance being greater than or equal to 2.

2. An optical disc device as claimed in claim 1, further comprising a circuit configured to select and output the second binary bit array and/or the third binary bit array whose shortest run length is equal to or greater than 2T, and which are obtained by shifting the interested edge of the first binary bit array to the left and right, respectively, by using a table.

3. An optical disc device as claimed in claim 1, further comprising a circuit configured to calculate a signal evaluation value by using the first and the second evaluation values.

4. An adjusting method for a recording condition for an optical disc medium in which data are recorded by using codes whose shortest run length is 2T and from which the recorded data are reproduced in accordance with an adaptive equalizing procedure and a Partial Response Maximum Likelihood (PRML) procedure, comprising generating a first binary bit array by binarizing a signal reproduced from the optical disc medium in accordance with the PRML procedure;

generating a second binary bit array and a third binary bit array whose shortest run length is equal to or greater than 2T, and which are obtained by shifting an interested edge of the first binary bit array to the left and right, respectively;

generating first, second and third target signals corresponding to the first, second and third binary bit arrays, respectively;

calculating a first evaluation value by normalizing a first Euclidean distance difference which is a difference between the Euclidean distance between the second target signal and the reproduced signal and the Euclidean distance between the first target signal and the reproduced signal, by the Euclidean distance between the first and the second target signals;

calculating a second evaluation value by normalizing a second Euclidean distance difference which is a difference between the Euclidean distance between the third target signal and the reproduced signal and the Euclidean distance between the first target signal and the reproduced signal, by the Euclidean distance between the first and the third target signals;

calculating an edge shift evaluation value by using at least a value of difference between the first and the second evaluation values; and adjusting the recording condition by using the edge shift evaluation value;

wherein the second and the third bit array are generated by applying an exclusive OR (XOR) mask bit array to the first binary bit array so that a first Hamming distance between the first binary bit array and the second bit array is equal to a second Hamming distance between the first binary bit array and the third bit array, the first and second Hamming distance being greater than or equal to 2.

5. An adjusting method as claimed in claim 4, further comprising selecting and outputting the second binary bit array and/or the third binary bit array whose shortest run length is equal to or greater than 2T, and which are obtained by shifting the interested edge of the first binary bit array to the left and right, respectively, by using a table.

6. An adjusting method as claimed in claim 4, further comprising calculating a signal evaluation value by using the first and the second evaluation values.

7. A recording method for an optical disc medium in which data are recorded by using codes whose shortest run length is 2T and from which the recorded data are reproduced in accordance with an adaptive equalizing procedure and a Partial Response Maximum Likelihood (PRML) procedure, comprising generating a first binary bit array by binarizing a signal reproduced from the optical disc medium in accordance with the PRML procedure;

generating a second binary bit array and a third binary bit array whose shortest run length is equal to or greater than 2T, and which are obtained by shifting an interested edge of the first binary bit array to the left and right, respectively;

generating first, second and third target signals corresponding to the first, second and third binary bit arrays, respectively;

calculating a first evaluation value by normalizing a first Euclidean distance difference which is a difference between the Euclidean distance between the second target signal and the reproduced signal and the Euclidean distance between the first target signal and the reproduced signal, by the Euclidean distance between the first and the second target signals;

calculating a second evaluation value by normalizing a second Euclidean distance difference which is a difference between the Euclidean distance between the third target signal and the reproduced signal and the Euclidean distance between the first target signal and the reproduced signal, by the Euclidean distance between the first and the third target signals;

calculating an edge shift evaluation value by using at least a value of difference between the first and the second evaluation values; and adjusting a condition for recording by using the edge shift evaluation value;

wherein the second and the third bit array are generated by applying an exclusive OR (XOR) mask bit array to the first binary bit array so that a first Hamming distance between the first binary bit array and the second bit array is equal to a second Hamming distance between the first binary bit array and the third bit array, the first and second Hamming distance being greater than or equal to 2.

8. A reproducing method for reproducing information from an optical disc medium in accordance with an adaptive equalizing procedure and a Partial Response Maximum Likelihood (PRML) procedure, comprising;

irradiating the optical disc medium with a laser beam; and reproducing the information on the optical disc medium in accordance with the adaptive equalizing procedure and the PRML procedure;

wherein the information is recorded to the optical disc medium via operations including:

generating a first binary bit array by binarizing a signal reproduced from the optical disc medium in accordance with the PRML procedure;

generating a second binary bit array and a third binary bit array whose shortest run length is equal to or greater than 2T, and which are obtained by shifting an interested edge of the first binary bit array to the left and right, respectively;

generating first, second and third target signals corresponding to the first, second and third binary bit arrays, respectively;

calculating a first evaluation value, by normalizing a first Euclidean distance difference which is a difference between the Euclidean distance between the second target signal and the reproduced signal and the Euclidean distance between the first target signal and the reproduced signal, by the Euclidean distance between the first and the second target signals;

calculating a second evaluation value by normalizing a second Euclidean distance difference which is a difference between the Euclidean distance between the third target signal and the reproduced signal and the Euclidean distance between the first target signal and the reproduced signal, by the Euclidean distance between the first and the third target signals;

calculating an edge shift evaluation value by using at least a value of difference between the first and the second evaluation values; and adjusting a condition for recording by using the edge shift evaluation value;

wherein the second and the third bit array are generated by applying an exclusive OR (XOR) mask bit array to the first binary bit array so that a first Hamming distance between the first binary bit array and the second bit array is equal to a second Hamming distance between the first binary bit array and the third bit array, the first and second Hamming distance being greater than or equal to 2.

* * * * *